United States Patent
Labriola, II

(10) Patent No.: US 12,341,272 B2
(45) Date of Patent: Jun. 24, 2025

(54) COMPACT FREQUENCY ADJUSTABLE PORTABLE ANTENNA

(71) Applicant: Donald P. Labriola, II, La Verne, CA (US)

(72) Inventor: Donald P. Labriola, II, La Verne, CA (US)

(73) Assignee: Compact Antennas, LLC, Anchorage, AK (US)

( * ) Notice: Subject to any disclaimer, the term of this patent is extended or adjusted under 35 U.S.C. 154(b) by 309 days.

(21) Appl. No.: 17/870,811

(22) Filed: Jul. 21, 2022

(65) Prior Publication Data

US 2023/0028251 A1 Jan. 26, 2023

Related U.S. Application Data

(60) Provisional application No. 63/224,391, filed on Jul. 21, 2021.

(51) Int. Cl.
| | |
|---|---|
| *H04B 17/11* | (2015.01) |
| *H01Q 9/30* | (2006.01) |
| *H03J 5/02* | (2006.01) |
| *H04W 24/02* | (2009.01) |

(52) U.S. Cl.
CPC .............. *H01Q 9/30* (2013.01); *H03J 5/02* (2013.01)

(58) Field of Classification Search
CPC ............ H01Q 9/30; H01Q 5/335; H03J 5/02; H04W 24/02; H04W 24/08; H04B 17/11; H04B 17/12; H04B 17/15; H04B 17/21; H04B 17/29; H04B 17/202
See application file for complete search history.

(56) References Cited

U.S. PATENT DOCUMENTS

| | | |
|---|---|---|
| 2,839,752 A | 6/1958 | Marvin |
| 2,854,667 A | 9/1958 | Taylor et al. |
| 2,874,274 A | 2/1959 | Adams et al. |
| 2,931,034 A | 3/1960 | Roger et al. |
| 3,078,430 A | 2/1963 | Majkrzak |
| 3,381,222 A | 4/1968 | Gray |

(Continued)

OTHER PUBLICATIONS

World Intellectual Property Organization, Application No. PCT/US2022/037948, International Search Report dated Nov. 11, 2022.

*Primary Examiner* — Andrew Wendell
(74) *Attorney, Agent, or Firm* — Shield Intellectual Property PC

(57) ABSTRACT

A compact mobile high-frequency Antenna that quickly and quietly self-adjusts to minimize Voltage Standing Wave Ratio (VSWR). Includes a compact tuning coil and a rolling contact. A Reentrant cap serves as a capacitive top hat. A spiral cut enhances the efficiency is this very short antenna. A tough insulating tube covers the antenna to serve as a radome protect the user from RF burns. The use of rolling contacts on a smooth inside diameter of the tuning coil greatly reduces the force to move the contactor as well as the acoustical noise generated when tuning. A controller drives a servo motor to position the contactor to the optimal position within the tuning coil and selects the impedance to connect between the unused end of the tuning coil and the feed point of the antenna to optimize VSWR.

19 Claims, 41 Drawing Sheets

(56) References Cited

U.S. PATENT DOCUMENTS

| | | | | |
|---|---|---|---|---|
| 3,858,220 | A | * | 12/1974 | Arnow .................. H01Q 1/362 |
| | | | | 343/823 |
| 3,909,830 | A | | 9/1975 | Campbell |
| 4,080,604 | A | | 3/1978 | Wosniewski |
| 4,117,493 | A | | 9/1978 | Altmayer |
| 4,163,981 | A | | 8/1979 | Wilson |
| 4,584,587 | A | | 4/1986 | Ireland |
| 4,730,195 | A | | 3/1988 | Phillips et al. |
| 4,803,493 | A | | 2/1989 | Jamison |
| 4,958,163 | A | | 9/1990 | Leonard |
| 5,883,600 | A | | 3/1999 | Kukura |
| 9,325,355 | B2 | * | 4/2016 | Pecen ...................... H01Q 1/52 |
| 9,509,348 | B1 | * | 11/2016 | Daminski ................. H03F 3/24 |
| 9,647,326 | B1 | * | 5/2017 | Gorman ................... H01Q 1/36 |
| 2007/0091006 | A1 | * | 4/2007 | Thober .................. H01Q 7/005 |
| | | | | 343/745 |
| 2011/0134327 | A1 | * | 6/2011 | Kaneko ................ H04N 21/426 |
| | | | | 348/569 |
| 2014/0049434 | A1 | | 2/2014 | Greene et al. |
| 2014/0062814 | A1 | * | 3/2014 | Gyenes ................. H01Q 21/30 |
| | | | | 343/745 |
| 2014/0120849 | A1 | * | 5/2014 | Peltonen ............. H04B 17/103 |
| | | | | 455/77 |
| 2015/0077117 | A1 | | 3/2015 | Snyder et al. |
| 2018/0062624 | A1 | | 3/2018 | Feldman et al. |
| 2018/0179887 | A1 | | 6/2018 | Clarkson |
| 2019/0319344 | A1 | * | 10/2019 | Jue .......................... H01Q 9/30 |
| 2020/0027637 | A1 | * | 1/2020 | Sano .................. H01F 17/0013 |
| 2021/0297166 | A1 | * | 9/2021 | Basavarajappa ....... H04B 17/16 |

\* cited by examiner

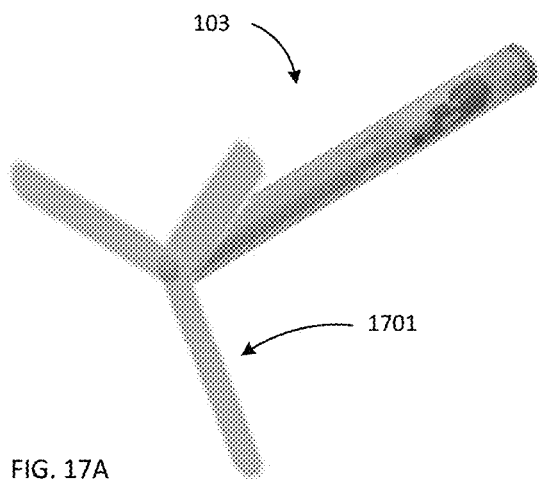
FIG. 17A
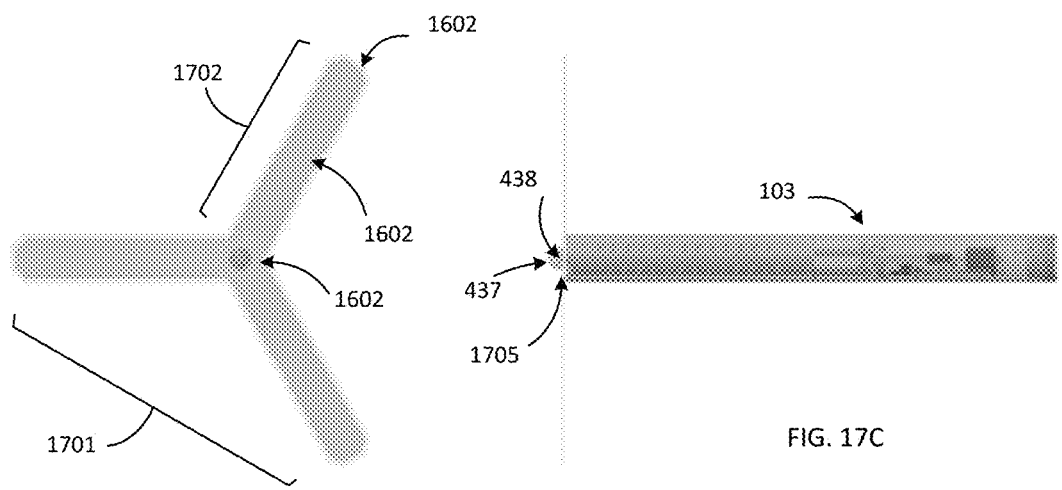
FIG. 17B
FIG. 17C

COMPACT FREQUENCY ADJUSTABLE PORTABLE ANTENNA

CROSS REFERENCE TO RELATED APPLICATIONS AND PRIORITY CLAIM

This application claims the benefit of U.S. Provisional Patent Application Ser. No. 63/224,391 filed Jul. 21, 2021, the entire contents of the aforementioned are hereby incorporated by reference as if fully set forth herein, under 35 U.S.C. § 120. The applicant hereby rescind any disclaimer of claim scope in the parent application(s) or the prosecution history thereof and advise the USPTO that the claims in this application may be broader than any claim in the parent application(s).

TECHNICAL FIELD

Embodiments relate generally to antenna systems, and, more specifically, to antenna systems that are compact, portable, and frequency adjustable.

BACKGROUND

Radio waves are used to communication by broadcasting signals from a transmitter having an antenna and receiving those signals with a receiver having another antenna. Radio transmitters can modulate a carrier wave to generate radio wave signals and broadcast them to be received by radio receivers. Different modulations of the radio carrier waves can be used such as frequency modulation (FM), amplitude modulation (AM), or other similar systems.

Radio communications can utilize different types of antennas depending on the intended function, the frequency of the radio signal, type of communication, power requirements, the type of the sending and receiving equipment, and the way information is encoded in the radio signal. The configuration of the antenna can influence the range and directionality of the radio signal.

Radio signals can be broadcast over a wide range of frequencies in the electromagnetic spectrum. High frequency radio communication enables communications over a wide range of distances by allowing reflection and refraction of the electromagnetic waves from varying charged layers of the ionosphere, which are formed through interaction of radiation from the sun with the upper atmosphere. These layers vary by time, season, and with the 11-year sunspot cycle of the sun, as well as daily variations in solar activity, often called solar weather.

Modern radio communications need to be efficient and economical in operation. Use in military, modern business and technical environments requires systems that are robust, efficient, and able to function over specific ranges of frequencies. The use of a particular configuration of antenna can influence the performance of the overall radio system.

BRIEF DESCRIPTION OF THE DRAWINGS

The present invention is illustrated by way of example, and not by way of limitation, in the figures of the accompanying drawings and in which like reference numerals refer to similar elements and in which:

FIG. 17A depicts an example of a capacitive top hat configuration, FIG. 17B depicts an example of a top view of the capacitive top hat with three leaves, FIG. 17C depicts an example of a side view of the CFA portable antenna with the capacitive top hat.

DETAILED DESCRIPTION

Figure 1:
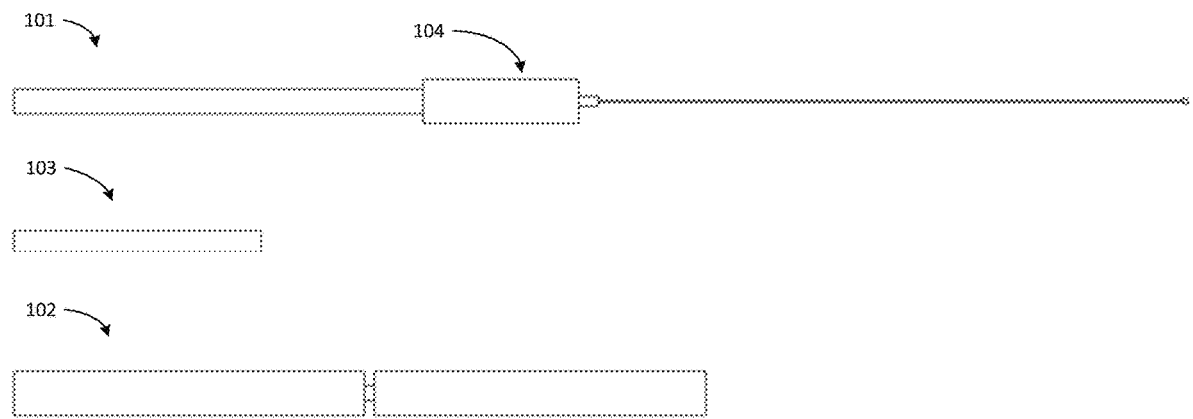
FIG. 1 depicts an exemplary diagram of the relative sizes of antennas.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. Overview
  1.1. Definitions
2.0. Implementation Mechanism
  2.1. Compact Frequency Adjustable Portable Antenna
  2.2. Tuning Coil
  2.3. Voltage Standing Wave Ratio (VSWR)
3.0. Extensions and Alternatives
4.0. Extensions and Alternatives 1.0. Overview Approaches, techniques, and mechanisms are disclosed for construction of a compact frequency adjustable (CFA) portable antenna able to tune a wide range of frequencies in the high-frequency (HF) radio spectrum.

Radio communication systems can be used to send and receive information over significant distances using antennae. Fixed radio systems can use large antenna systems to get the desired performance. Portable radio systems, such as military, marine, and individual mobile systems, often need higher levels of antenna performance that can be easily transported. However, complex antenna systems with tunable components can help reduce the size and weight of portable antennae to make portable radio systems more usable.

According to one embodiment, a compact frequency adjustable portable antenna can comprise an antenna with a controller to dynamically tune an antenna unit to improve antenna performance in specific frequency ranges.

According to another embodiment, the CFA portable antenna can include a motor to mechanically adjust a tuning coil of the antenna unit to achieve specific performance criteria.

In other aspects, the invention encompasses antennae systems configured to carry out the foregoing techniques.

1.1. Definitions

A. Antenna—An electro-mechanical structure used to radiate radio frequency (RF) electrical power from a transmitter into the surrounding space as transverse electromagnetic waves (TEM). The same structure also converts incoming TEM waves into electrical signals for receiving radio signals.

B. Impedance—Impedance Z is defined as the ratio of the voltage (in Volts) and the current (in Amperes), including the relative phase of the voltage applied and the resulting current. A resistive impedance has the current in-phase with the voltage, while a capacitive impedance has the current leading the voltage, and an inductive impedance has the current lagging the voltage.

C. Reflection coefficient—the measurement of the signal reflected from a load impedance $Z_L$ given a driving impedance $Z_O$ is calculated as $g=(Z_L-Z_O)/(Z_L+Z_O)$. Where a common driving impedance for many radios is $Z_O=50$ Ohms. The reflection coefficient may have an amplitude between zero and 1: $0 \le |\gamma| \le 1$, with $|\gamma|=0$ indicating a perfect match with no reflections, and $|\gamma|=1$ representing a complete reflection.

D. VSWR—Voltage Standing Wave Ratio is a measurement of the of the matching of the antenna to the transmission line by measuring the power applied to the antenna and the power reflected back by the antenna. VSWR may range from 1:1 to infinity:1. A 1:1 match indicates that none of the voltage applied to the antenna is being reflected back towards the transmitter, while a 3:1 VSWR indicates 50% of the voltage is being reflected. An infinite mismatch indicates all the voltage is being reflected. VSWR is defined as: $VSWR=(1+|\gamma|)/(1-|\gamma|)$ where gamma ($\gamma$) is the coefficient of reflected voltage. Thus, an antenna that reflects of 50% of the voltage has a $VSWR=(1+0.5)/(1-0.5)=3$. As the power is related to voltage squared, VSWR of 3:1 resulting from a reflection of 50% of the forward voltage results in 25% of the applied power being reflected back to the transmitter.

E. UNUN—UNUN is an abbreviation for Unbalanced-to-Unbalanced matching transformer. A coax connection to an antenna is considered unbalanced as the shield remains (nearly) at ground potential while most of the voltage excursion is done by the inside conductor. A balanced system, like 300-Ohm flat lead has approximately equal and opposite voltages for the two conductors. The transformer can change the impedance ratio for the input to the output. The impedance ratio of an ideal transformer is the square of the voltage ratio. Thus a 2:1 Voltage ratio would be a 4:1 Impedance ratio. A 4:1 Voltage ratio can result in a 16:1 Impedance ratio. In some embodiments, a matching transformer can be used to allow more power transfer from the transmitter to the antenna if the correct ratio is used. Proper matching can lower the VSWR seen by the transmitter.

F. Top Hat—is a conductive mechanical piece used to increase the capacitance at the section of the antenna to which it is connected. The capacitance of the structure helps to lower the impedance of an electrically short antenna, increasing the current in the antenna segment that feeds the top hat.

G. Tuning Coil—is a wound coil structure, adjustable when provided with a movable contact, which used to vary the inductance, delay time, and electrical length of such a helical transmission line to help match the radiating portion of the antenna to the incoming Radio Frequency (RF) source impedance. A tuning coil can be used to maximize radiated power while also minimizing power reflected to the transmitter.

H. Radome—is an enclosure over an antenna to protect the antenna physically and environmentally, while also being transparent to radio waves.

I. S-Unit—A measurement of relative signal strength, with one S-unit typically representing a change of 6 dB in signal strength.

2.0. Implementation Mechanism

FIG. 1 illustrates an exemplary diagram of the relative sizes of different antennas. The physical size of the antennae can have a direct influence of performance.

In some embodiments, a whip antenna 101, such as one having a 42-inch whip length, can tune down to approximately 2.1 MHz. The whip antenna 101 can include a tubular case 104.

A Reentrant Cap design antenna 102 can have similar performance values to the whip antenna 101. A compact frequency adjustable portable antenna 103 (CFA portable antenna 103) can be configured to tune down to approximately 1.3 MHz without the optional whip antenna or capacitive hats and lower with additions, as described below.

The CFA portable antenna 103 can reduce acoustical noise while improving the tuning speed of the antenna and the power needed to operate the antenna. Rapid tuning allows for quickly changing the usable frequency of the antenna. Low noise operation can reduce the chance of discovery when using the antenna due to acoustical noise. Low power usage can help save battery resources when operating from a back-pack configuration.

Figure 2:
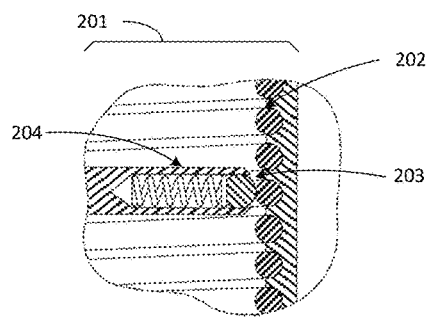
FIG. 2 depicts an example of a cutaway view of a tuning coil.

FIG. 2 illustrates an example of a cutaway view of a loading tuning coil 201 for different antennas. For example, this can be used with the whip antenna 101 and the Reentrant Cap design antenna 102. An internal coil contactor 204 can be used to contact a wire of the tuning coil 202. A ball bearing 203, such as a silver-plated ball bearing 203, can be configured to make the actual contact to the coiled wire 202. The round shape of the wire 202 and large spacing between turns causes a significant variation in the path of the ball 203 as the contactor is moved vertically to change the tuning frequency of the antenna. The rapid motion of the contactor balls 203 can generate acoustical noise and also requires significant forces to move the coil contactor 204.

Figure 3:
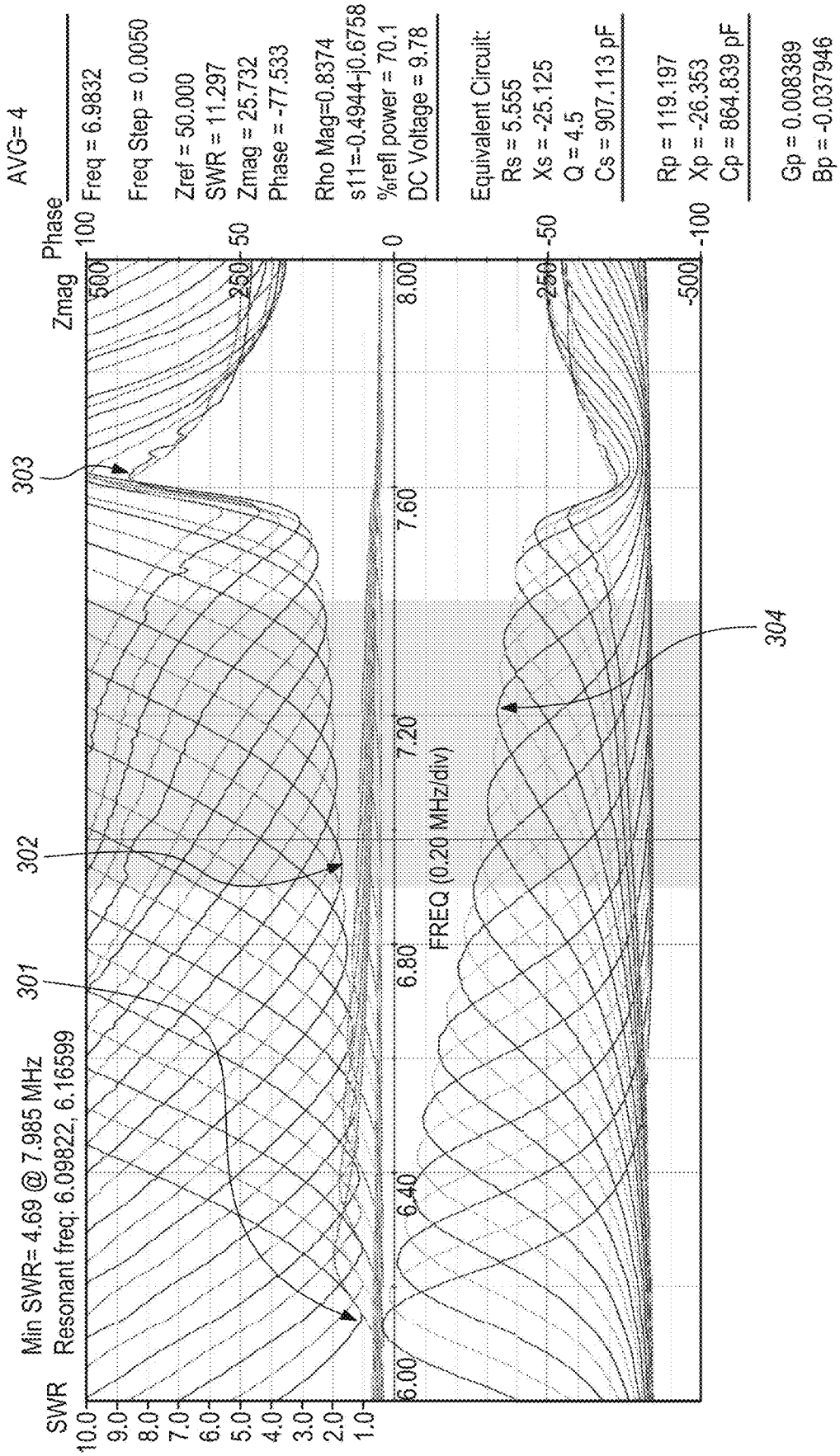
FIG. 3 depicts an example of a series of VSWR and phase curves.

FIG. 3 illustrates an example of a series of Voltage Standing Wave Ratio (VSWR) and phase scan curves. The scan curves can represent tuning sweeps for different antennae, such as the whip antenna 101 and the Reentrant Cap design antenna 102.

In an embodiment, the antennae can be mounted atop a mast, such as a 10-foot mast, with multiple tuned radials connected to the top of the mast to improve the VSWR. The location of the slider in the tuning coil can be varied for each scan, such as a first scan 301, a second scan 302, and a third scan 303. The phase for the impedance at each frequency and position is shown below in a phase scan 304.

In some embodiments, the multiple scans can show that a successful matching can be obtained for much of the frequency range by moving the slider within the tuning coil. However, in the vicinity of 7.6 MHz, for this configuration, one adjustment of the tuning coil, the third scan 303 can result in a VSWR of greater than 8:1. This can indicate that most of the power (~60%) is reflected back to the radio. This adjusted (8:1) match location at 7.6 MHz corresponds to the contactor 204 being positioned approximately ⅕ of the coil distance from the bottom of the coil (measured) in some antennae, such as the whip antenna 101.

In other embodiments, the lower ⅕ of the coil can corresponds to a transmission line with approximately ½ wavelength at 7.6 MHz. The electrical length of the top half of the coil is resonating the high impedance whip antenna, while the wavefront traveling along lower half of the coil arrives at the movable tuning point approximately 180 degrees out of phase with the signal being directly applied (as bottom of the tuning coil and the sliding contact are connected together in that antenna design. This destructive interference significantly disturbs the feed point impedance resulting in a high VSWR.

In some configurations, a similar effect is present if the end point is left floating. In this case, the frequency corresponding to a ¼ wavelength between the tap and the open endpoint will reflect with a phase and amplitude that will approximate a short circuit at the sliding feedpoint, again causing a frequency for which the antenna may be unable to be tuned for good VSWR.

2.1. Compact Frequency Adjustable Portable Antenna

Figure 4:
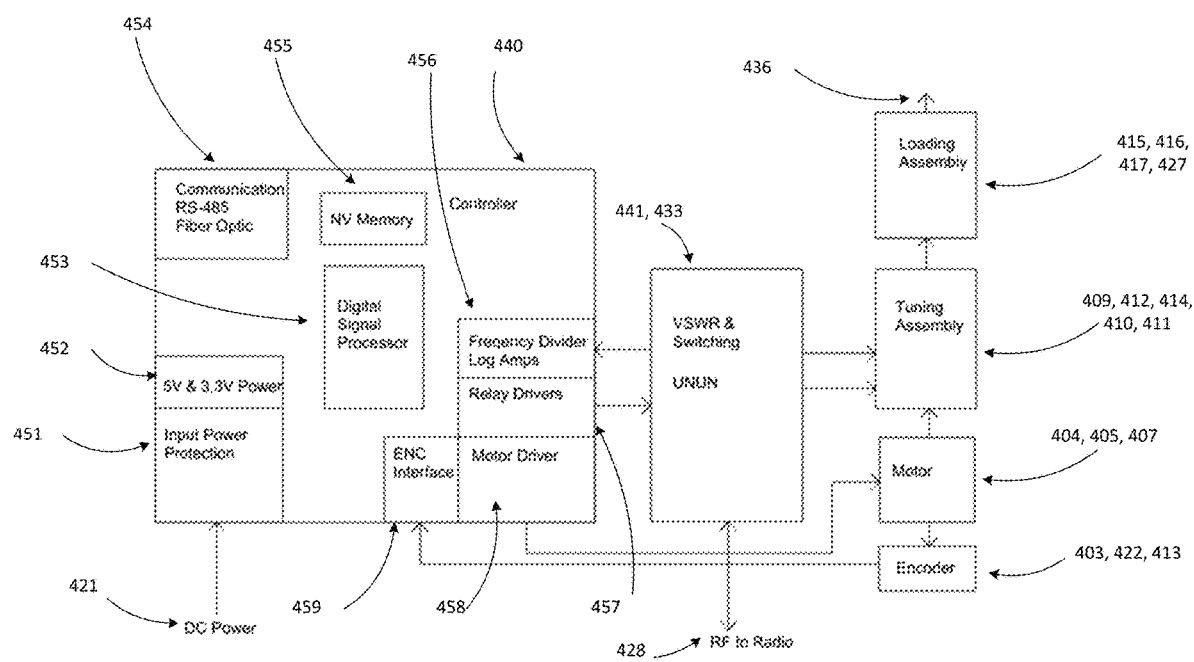
FIG. 4 depicts a block diagram a compact frequency adjustable portable antenna in an embodiment.

FIG. 4 illustrates a block diagram of an embodiment of the compact frequency adjustable (CFA) portable antenna. Some of the wiring and cabling, including the power cord, RF input wiring, optical fiber, and the internal wiring to the motor have omitted from the figures for clarity, but understood to be present but not visible.

A controller board 440 may include a digital signal processor (DSP) 453 which serves as an internal computer and controller for the antenna. The DSP 453 may include computing elements, analog to digital converters, counters, pulse width modulators, flash program memory, and random-access memories (RAM), and other similar components.

An input power 421 may connect to an input power protection circuit 451 which protects against over-voltage and reverse-connected power. The protected power may be converted by internal power supplies 452 which may be used to run some internal circuitry. The protected power may also be used by a motor driver 458.

The DSP 453 provides interfaces for various communication connections 454 which can include fiber optics and RS485 links. Such communications may be used to configure and calibrate the CFA portable antenna and may also optionally be used to control functions of the antenna when in use.

In some embodiments, a controller board 440 may also include nonvolatile (NV) memory to store calibration solutions for the antenna to allow rapid operation when a frequency is measured or otherwise selected. The NV memory may be contained within the DSP 453 or the NV memory as one or more separate components. The controller board 440 may also contain circuitry 456 to measure the frequency of the transmitter, and/or to process the signals from VSWR and impedance measurement circuitry and from phase detectors which may be present.

The VSWR signals may be processed using log amplifiers to allow accurate measurements over widely ranging power levels, allowing accurate calibration with low power signals. The controller board 440 may also include relays drivers 457 or other switching matrix methods as may be used to select UNUN 433 impedance matching ratios, tuning coil 414 termination selection, and/or other selections within the antenna. The controller board 440 may also include the motor drivers 458 to move the motor 404 and lead screws 405 or lead nuts 407 so as to facilitate adjustment of the moving connection to a tuning coil 414.

The controller board 440 may also include interface circuitry 459 to process position feedback information from the motor 404 which may allow for rapid positioning of the motor. Motor position information may be measured using an optical encoder module 403 mounted on an encoder board 422 in conjunction with an encoder disk 413. Other embodiments may implement other position feedback techniques, or no position feedback. The tuning coil 414 and other associated components are described in more detail below. The output of the tuning coil may drive a top loading assembly 415, 416, 417, 427 with an optional accessory attachment flange 436. Other embodiments may attach the accessory attachment flange 436 directly to the output of the tuning coil 414.

In other embodiments the DSP 453 may be implemented by multiple separate circuitries, including programmable logic including field programmable gate arrays (FPGA), discrete Analog to Digital Converters, and the other similar subsystems. In yet other embodiments, the additional peripheral circuitry may be all integrated into one or more combined packages. Other embodiments may utilize different motion technologies for adjustment of the tuning coil 414. It is understood that other embodiments may group the various portions of the antenna 103 differently, such as on different boards, on one common board, or upon additional boards, or other similar configurations.

Figure 4A:
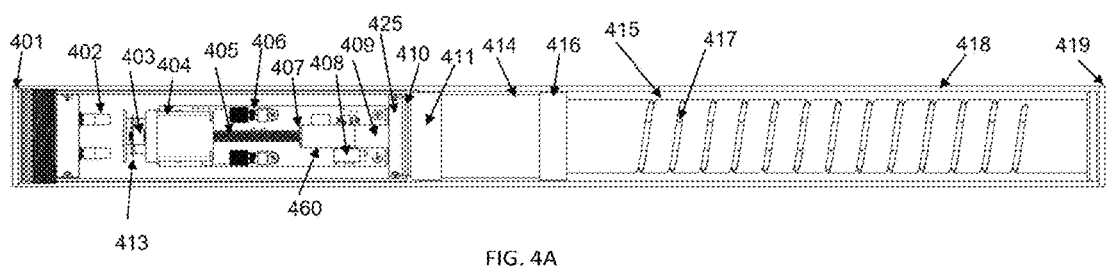
FIG. 4A depicts an example of a cutaway view of the compact frequency adjustable portable antenna in an embodiment.

FIG. 4A illustrates an example of a cutaway view of the compact frequency adjustable portable antenna in an embodiment. Several optional portions, including the power cord, RF input UNUN, and the VSWR sensing magnetics are not shown in the figure.

An endcap 401 provides an input power port 421 that can include a flexible power cord. In an embodiment, the DC power input connection is combined with the RF connection to minimize the number of connections to the antenna, feeding the DC power though the coax. However, the RF input may alternately be brought in on a separate connector (not shown). Connection point 428 serves as an optional ground connection for the base mounting tube 424 for attachment to a vehicle, for example. The RF signal is connected to an UNUN matching transformer 433 of FIG. 12 can be located within the lower section of the antenna. The UNUN transformer is designed to provide voltage ratio of approximately 3:1 to approximately 4:1 for this configuration. In other embodiments, a relay may be used to select either the 3:1 tap or the 4:1 tap to allow an improved impedance match across the wide frequency range of this antenna. Control commands to the antenna are isolated, for example using plastic core fiber optics via a pair of ferrule assemblies 402. Internal fibers, not shown, connect between the ferrule assemblies 402 and the fiber optic receiver and transmitter modules 406. The external fiber optic cable, not shown, is attached between the antenna and an external computer when tuning the antenna, and then normally detached. The external fiber optic connections may remain attached even when the antenna is transmitting, to allow improved tuning of the antenna when receiving. This isolated control can be provided either by an external computer or by a properly provisioned radio. In normal operation, the controller board 440 within the antenna measures the frequency of the transmitted power to determine how to tune the antenna. In some embodiments, a bridge, such as a VSWR bridge 1801 of FIG. 18, can assist in finding the improved tuning combinations. Note that the 3:1 to 4:1 voltage matching ratio of the UNUN is generally a good for the specific mechanical dimensions of this particular antenna configuration but is not a limitation on the CFA portable antenna 103. The fiber optic method shown for isolating communications is just an example of one type of isolation but is not a limitation on the CFA portable antenna 103.

Figure 4B:
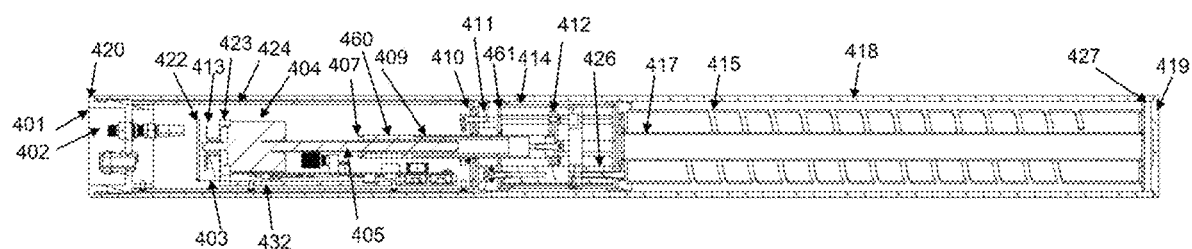
FIG. 4B depicts an example of a side section view of the compact frequency adjustable portable antenna in an embodiment.

FIG. 4B illustrates an example of a side section view of the compact frequency adjustable portable antenna in an embodiment.

In some embodiments, the antenna can be protected and contained in a tough radome having of a one-eighth inch polycarbonate tube 418 with a polycarbonate cap 419 either affixed by and adhesive or solvent bonding, fusing, or sonic welding. The tube and top cap can also be molded directly as a single piece. A straight threaded interface 435 is used on both the polycarbonate tube 418 and the end cap 401 to securely hold them together. Two O-rings 420 are used to seal the polycarbonate tube 418 to the end cap 401. All connections passing through the end cap 401 are sealed to provide weather proof protection for the antenna. Silica gel (not shown) to be encapsulated within the antenna to absorb moisture to prevent condensation with rapid temperature changes. The center of the top feed tube 417 provides a significant volume for such desiccant. Neither the location nor type of desiccant is intended to be a limitation to this CFA portable antenna 103.

An encoder board 422 connects the signals from the encoder module 403 to the controller board 440. The winding leads on the hybrid servo motor 404 also connect to the controller board 440. The controller board 440 includes frequency measurement capability, local power supplies, a digital signal processor and an integrated motor driver. The input power passes through common mode inductors to decouple any RF from the power connection to the external supply voltage. A voltage protection circuit can be included to prevent damage if the power supply is reversed, or if the battery becomes detached while an alternator is spinning, or large loads attached to the same power source are switched on or off.

The servo motor 404 is mounted to a motor mounting plate 423. The mounting plate has a motor pilot which accurately aligns the motor to the plate so that it is centered on the lead nut 407. The motor mounting plate 423 also provides proper encoder module 403 alignment. The motor mounting plate is connected to the controller mounting plate 440 with fasteners such as screws, clips, bolts, adhesive, or a combination thereof. The motor mounting plate is connected to the base mounting tube 424 using screws, providing both electrical bonding and mechanical positioning.

Figure 4C:
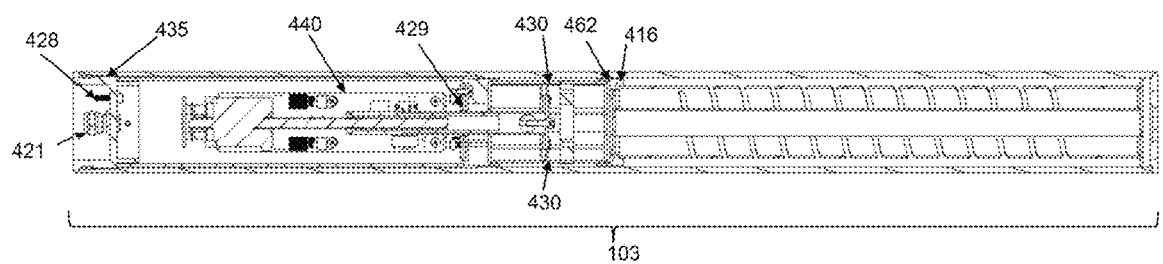
FIG. 4C depicts an example of a top section view of the compact frequency adjustable portable antenna in an embodiment.
Figure 4D:
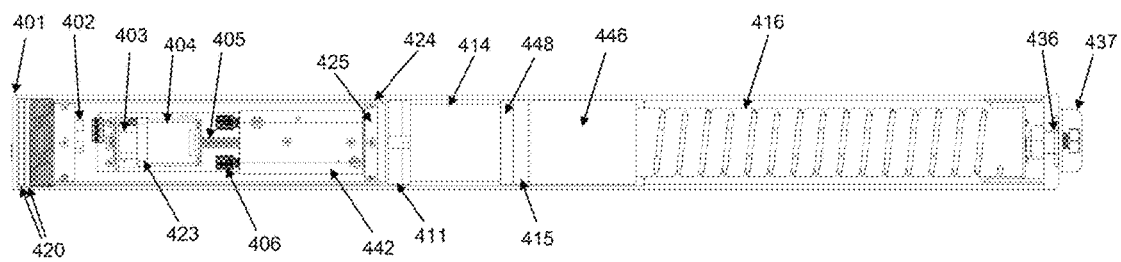
FIG. 4D, FIG. 4E, FIG. 4F, and FIG. 4G depict additional cutaway views of the CFA compact antenna system in other embodiments.
Figure 4E:
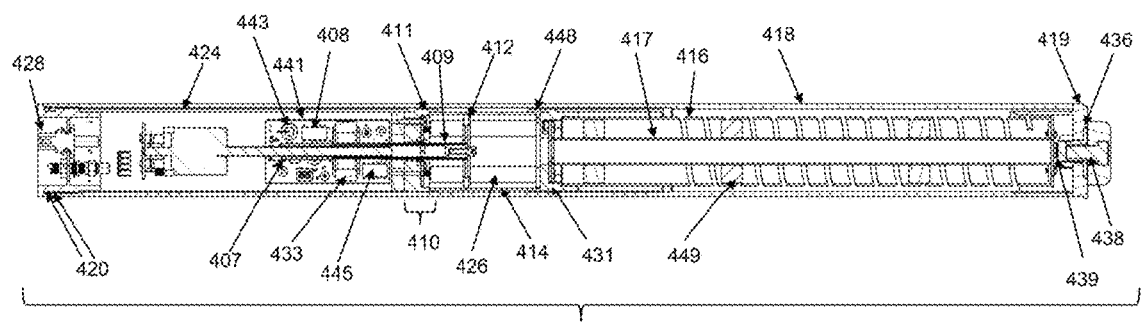
Figure 4F:
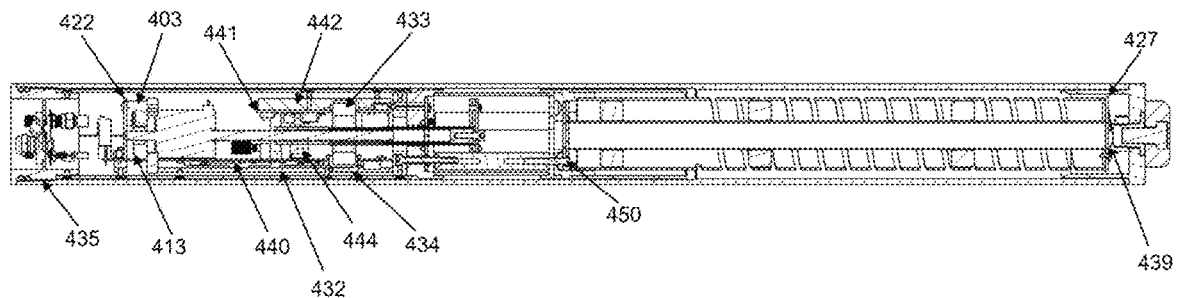
Figure 4G:
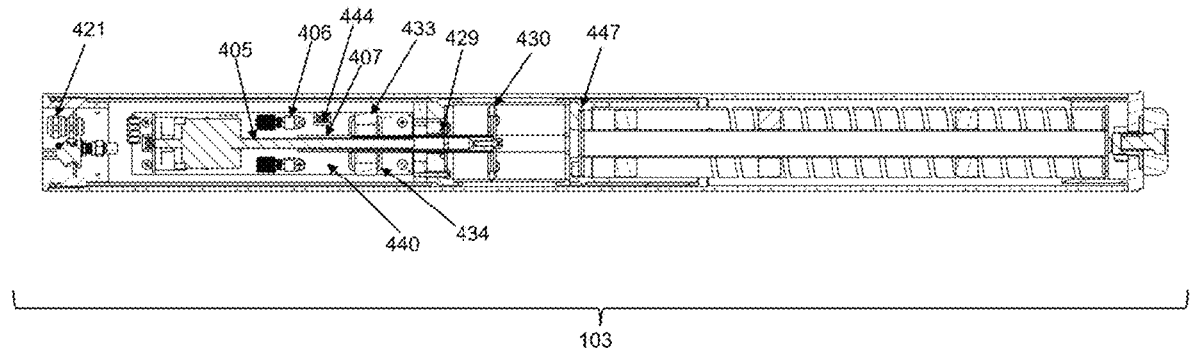

FIG. 4C illustrates an example of a top section view of the compact frequency adjustable portable antenna in an embodiment.

In other embodiments, an alternate configuration for coupling the RF into the base mounting tube 424 via endcap 401 using connection point 428 can be used. An input power port 421 can holds a flexible power cord. In this configuration, the DC power cord brings in power to the antenna and also provides a ground reference to allow sensing the frequency of the RF signal when transmitting. The input connection point 428 is connected to an external UNUN transformer 433, with a voltage ratio of approximately 3:1 to approximately 4:1. Again, communications to the antenna are brought in using plastic core fiber optic via a pair of ferrule assemblies 402.

A hybrid servo motor 404 is coupled to an encoder disk 413 to provide closed loop position sensing using an encoder module 403. Other feedback methods may also be employed, including reflective sensors, capacitive sensors, hall effect, resolver, and rotor-stator field sensing. The step motor may also be operated in vector control or in open loop. The opposite shaft of the motor can be a lead screw 405 integral to the motor.

The leadscrew 405 turns within a leadnut 407 to convert the rotary motion of the motor into a linear motion of the pusher rod 409. Other methods including linear voice coils and linear step motors could also be easily implemented. While these may increase the tuning speed, these alternatives would likely add to the weight of the unit. These alternate motor types would also need to be powered when stationary to prevent motion, which adds to the power draw of the unit, and potentially to the RF noise as the driver PWM would need be active while listening. In an embodiment, the hybrid servo 404 can be allowed to hold position by shorting the motor leads when not changing position while also disabling the PWM drive. This minimizes any internally generated RF noise in the system to reduce interference from the internal electronics with the received signals.

The pusher rod 409 is made of silver-plated brass and has a square cross section. The square cross section is used as an anti-rotation feature. The lead screw 405 is isolated from the pusher rod 409 either by using a plastic lead nut 407 or by separating a metal lead nut from the conductive portion of the pusher rod using an insulating section 100.

In some embodiments, the plastic lead nut 407 and the insulation section 100 can be combined in a single part. In other embodiments, a configuration of ball bearings, such as the four ball bearings 801 of FIG. 8, can be used to capture two opposite corners of the square pusher rod. Opposite corners are used to minimize the contact force needed to counteract the rotational force from the lead screw turning within the lead nut. The use of bearings also reduce the forces needed to translate the pusher rod to allow faster motions with a smaller motor.

In an embodiment, two rolling contacts 430 conduct the RF signal from the tube contactor assembly 410 to the pusher rod and on to the coil contactor plate 412. The contactor assembly as shown consists of three laser cut aluminum disks with the upper and lower disk identical while the slots in the middle disk are cut slightly wider to hold the shafts for the bearings and the rolling contacts in place. This contactor assembly can be formed in a variety of ways including machined, molded, 3D printed, etched, milled, cast, or a combination thereof.

The tube contactor assembly 410 is affixed to the adapter plate 425. A wire (not shown) connects contactor assembly 410 to the controller and UNUN 52/92. The adapter plate, which is insulating, is in turn is affixed to the base mounting tube 424. The base mounting tube, in turn, is affixed to the end cap 401. The adapter plate 425 and tube contactor assembly 410 are affixed to lower coil insulator 411 which isolates the lower end of the tuning coil 414 from the tube contactor assembly 410.

In another embodiment, the lower mast of the antenna, including the endcap 401 and the base mounting tube 424 and endcap 401, may be operated as a portion of the RF energized antenna. In this alternate design, the adapter plate 425 may be made conductive, making electrical contact to the tube contactor assembly 410.

Using the lower mast 36, 12 of the antenna as a grounded portion of the counterpoise is advantageous when the antenna is deployed on a backpack, as having this section not energized moves the RF fields further away from the operator. This both reduces RF exposure to the operator and simplifies the connection to the antenna allowing standard coax to be used. This configuration allows the UNUN 433 and optional VSWR bridge to more easily incorporated within the antenna. The VSWR curves shown in the figures section were taken using this lower section 36, 12 as a counterpoise connected to RF ground. In an embodiment, this configuration can lower the receiver noise level as compared to having this lower mast connected to the RF input.

A set of measurements were made comparing the CFA portable antenna 103 with the lower mast 36, 12 grounded to a small counterpoise to a different antenna using a whip antenna mounted to a 10' grounded mast having several tuned radials. The actual measurement of background noise showed approximately 8 S-units less noise when using the CFA portable antenna 103 as compared to a different antenna at the same location, while listening on 10 MHz day time with weak signal conditions. At other times of the day with better propagation, strong received signals, such as those well above noise level, can be within +2 and −2 S-units between the two antennas. This gives a significant advantage to the CFA portable antenna 103 when listening to weak signals. In an illustrative example, the radio station WWV could not be heard above the noise on the other antenna while the signal was 4 to 9 s-units above the noise listening at the same time (when propagation was not particularly good). This corresponded to S1 noise levels with 20 dB of gain amplifiers turned on for the CFA portable antenna 103 compared to S8 to S9 noise levels with the same 20 dB of amplification for some other antenna. The WWV signal (with both amplifiers turned on using FT991A, ~20 dB) was S6-S9+10 on the CFA portable antenna 103 and easy to hear, while it was significantly below the noise level using the other antenna.

The reentrant top loading assembly can be made from metal, such as aluminum for low weight and cost. The reentrant top loading assembly includes a top cap hat 427 brazed or welded or otherwise mechanically and electrically attached to both the top loading coil 416 and the top feed tube 417. At the tuning coil 414 end of the top loading assembly is a top coil insulator 448, made of an insulator, such as a plastic material, resin, Delrin, polycarbonate or other insulating materials, which insulates the lower end of the top loading coil 416 from the top plate of the tuning coil 414. The lower end of the top loading assembly is electrically attached either directly to the top end of the tuning coil, or alternately to a connection point 1601 to the shorted section on the tuning coil, in which case an insulator is placed between the top of the tuning coil 414 and the upper contact plate 414. Screws or threaded studs are used to affix the insulating spacers 449 to the upper contact plate 414. The top coil insulator 448 is affixed to both the top loading coil 416 and the top plate 414. One or more insulating spacers (not visible) may be placed between the top loading coil 416 and the top feed tube 417 to mechanically stabilize the flexible top loading coil 416 to prevent unwanted movement/vibration of the middle of the top loading coil.

The tuning coil 414 has portions of the inner insulation remove as well as the insulation facing the top and bottom surfaces (right and left, respectively, in the drawing). The removal of insulation on the inside diameter of the tuning coil 414 corresponds to where the rolling contacts 430 on the contactor plate 412 touch the tuning coil 414. Either the connection point 1601 or the top end (right in drawing) of the tuning coil 414 makes connection to the top plate 414 to carry RF energy to the top loading feed tube 417. The top insulator 448 keeps the tuning coil 414 properly centered on the contactor assembly. The lower end (left side in drawing) of the tuning coil 414 contacts the lower coil contact plate 412. The lower coil contact plate 412 has a conductor to bring this electrical node down to the switching network 407 consisting of one or more relays, allowing this node to be connected to a selected impedance (including an open circuit) or directly to the feed point. The antenna controller board 440 can be configured to control the state of the switching network to improve the performance of the antenna for the selected frequency. The antenna controller board 440 also measures the RF frequency, interpolates the position from a frequency tuning calibration table, controls the hybrid servo 404 and provides communications to the fiber optics. The antenna controller board 440 also includes circuitry to protect against reverse polarity and overvoltage conditions which may arise from connection to a vehicle power system or other power source.

Figure 12:
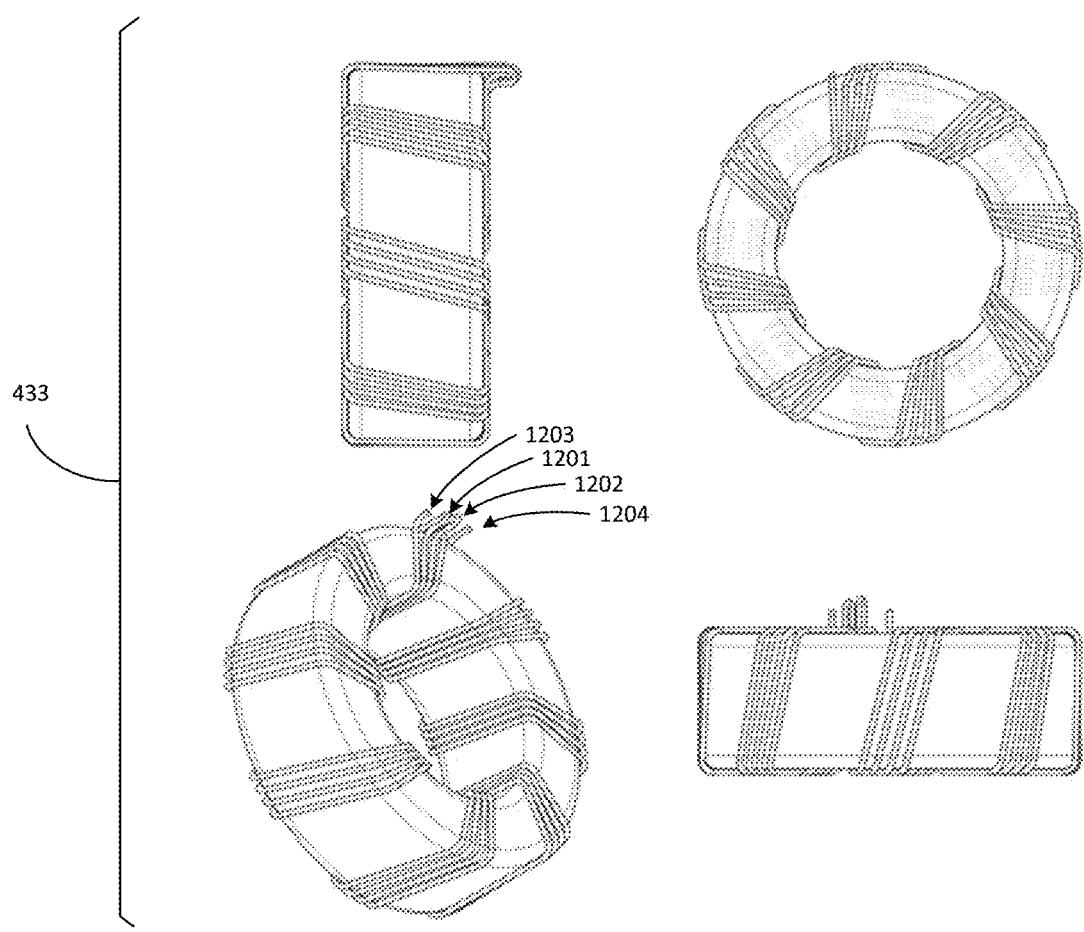
FIG. 12 depicts exemplary views windings on an UNUN transformer.

In other embodiments, the controller board 440 can control relay within the switchable 3:1/4:1 UNUN 433 to select whether the 3:1 or 4:1 output 1204 of FIG. 12 from the UNUN transformer 433 is connected to the tuning coil 414. An input, such as an input 1201 of FIG. 12, coupled to the UNUN 433 can be fed signals by the radio via a coax, either directly or optionally via the VSWR sensing circuit 1801 of FIG. 18. The input 1201 reference to ground 1203 of FIG. 13A can drive the bottom 8 turns of the UNUN coil 433. The 3:1 UNUN output is taken between ground 1203 and the bottom 24 turns of the UNUN 433 providing a 24:8 or 3:1 voltage step up, which corresponds to a 9:1 impedance transformation. The 4:1 UNUN output is taken between ground 1203 and the top of all 32 turns of the UNUN providing a 32:8 or 4:1 voltage step up, which corresponds to a 16:1 impedance transformation. A selection relay can be driven by the controller board 440 to select which winding is connected to the output 1204. The antenna feedpoint impedance varies over the wide range of the antenna. Allowing the impedance matching ratio to be selected provides an additional optional means of improving the match between the antenna and the attached radio to improve transmitted power and received signal strength. In some embodiments, the antenna can be configured with two selected taps, a single tap, multiple taps, or a combination thereof. The input and output points may also be swapped for configurations where the feed point of the antenna is less than the radio transmitter impedance. The voltage ratios may also be selected to be other than 1:3 or 1:4. The number of turns may also be varied based on the selected core material and core geometry. The turns ratio showed in the drawing are for a type FT140-43 core. It is understood that other embodiments can include other materials and geometries as well as coil winding turns and techniques.

The insulation that covers the rectangular wire used in the tuning coil 414, such as polyamide—for example, may be removed from the coil by several methods. One method is the use of a laser, such as a carbon dioxide (CO2) laser to ablate the insulation from the specific areas where contact will be made to the coil. The light may be applied perpendicular to the coil surface if insulation is not desired between the turns, such as where turns are intentionally being shorted with or without a wire attachment. When the individual turns of the tuning coil 414 are to remain insulated from each other but need electrical contact to a rolling contact, such as a ball 601 of FIG. 6, of a rolling contact 430 on the coil contactor plate 412, the laser light may be directed at the coil surface at an angle to the surface for more precise shaping and ablation.

Another alternate method of constructing the tuning coil 414 remove the insulation is the use of abrasion, such as a honing tool. This removes the insulation of the coil as well as a small amount of the metal.

In some embodiments, the coil can be plated subsequent to the removal of the insulation to improve the contact points to the coil, unless the coil itself were wound from a metal, such as silver, gold, or a platinum group metal. In some configurations, the coil weight can be about 3 oz for the extended frequency range design allowing operation below 1 MHz coil and about 1.5 oz for operation down to 1.6 MHz.

Another alternate method of removing the insulation involves machining the ID of the coil along each contact strip. This removes the insulation along internal contact points for the contactor balls 43, 43. In some embodiments, the techniques of removing insulation from the flat conductor can include several different methods for insulation removal.

Although plating can be used for deposition of a noble metal onto a base metal, it is understood that a variety of techniques can be used. For example, the noble metal can be deposited on the base metal using spraying, sputtering, vapor deposition, chemical deposition, or other deposition techniques. In addition, in some embodiments, a solid noble metal wire.

Figure 16:
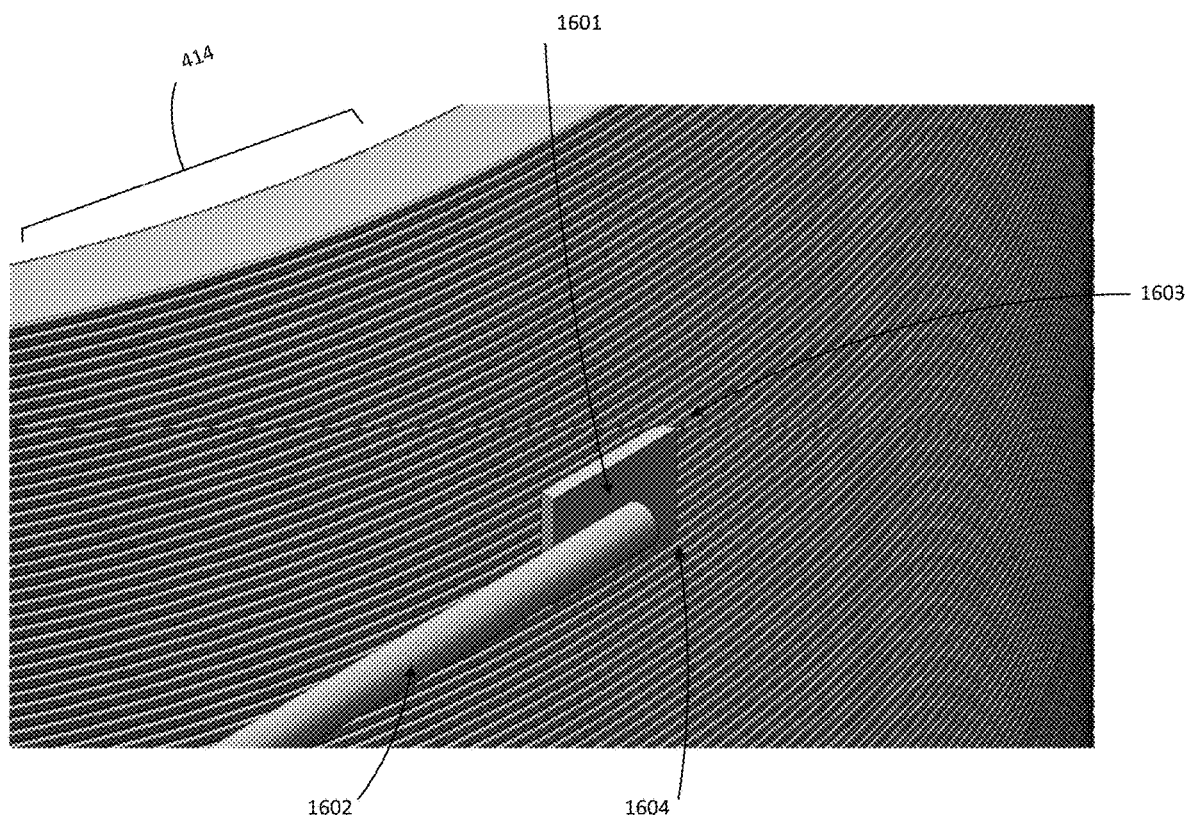
FIG. 16 depicts an example of an attachment point to the tuning coil.

In some embodiments, the tuning coil 414 can be configured with one or more shorting taps 1601 of FIG. 16 with or without wire connections 1602 of FIG. 16. The multiple shorted turns help to isolate the inductance of the tuning coil sections above and below each shorting tap. This method may be used to isolate portions of the tuning coil not needed to tune a desired frequency range from the remainder of the coil to reduce the losses associated with the unused coil sections. Some of the shorting taps 1601 may be attachment points, such as taps, to connect the wires 1602 to selected portions of the coil, while others may function purely as shorting sections for isolation. In some embodiments, the shorting taps 1601 and the wire 1602 attachment may be facilitated by soldering. For example, using a low temperature solder, or by the use of conductive epoxies, such as silver loaded epoxy, or by ultrasonic bonding to the surface of the coil. In some embodiments, the attachment methods can utilize different shorting and attachment techniques.

An alternative design of the tuning coil 414 could also be formed by the use of a flexible printed circuit formed into a tube. The tube is not limited to being circular in shape. This provides a very light tuning coil, but of lower turn density than the edge wound copper coil. As such it would be useful on antennas not going as low in frequency, or which permit larger diameter tuning coils where the reduced turn density is offset by a larger diameter coil. Columns along either the inside diameter or outside diameter of such a printed circuit tube would have the insulation removed and would be plated with a noble metal, such as silver, gold, or a platinum group metal, to provide a variable sliding connection point to such tuning coil.

Another alternate tuning coil 414 with a smooth bore tuning coil may also be formed by laser cutting a fine spiral (helix) from a metal tube. The resulting helix would need to be stabilized with an insulating material as the helix would be weak without such stabilizing. This construction method would currently require a larger volume for the coil as the turn density would be lower than for the wound flat wire but could possibly accommodate a higher power level. Fiber laser cutting continues to improve, so this method may eventually yield a similar winding density. The CFA portable antenna 103 does not preclude similar variations in producing compact tuning coils.

In some embodiments, the lower coil insulator 411 is attached to the spacers 449 using screws to affix and compress the tuning coil 414 between the upper coil contact plate 414 and lower coil contact plate 412. The lower coil insulator 411 can be affixed to the tube contactor assembly 410 and the adapter plate 425 using screws, for example. The upper coil contact plate 414 may be an insulator rather than conductive when the top loading coil 448 is connected to an optional shorting tap 1602 on the tuning coil 414 as in FIG. 16, or an insulator may be used between the tuning coil 414 and the upper contact plate 414 to facilitate the same insulating function.

FIG. 4D, FIG. 4E, FIG. 4F, and FIG. 4G illustrate additional cutaway views of the CFA compact antenna system in an embodiment. The figures show different cutaway views from different angles and orientations.

An end cap 401 provides an input power port 421 that can include a flexible cord for power and communications (not shown). The flexible cord can carry communications links, such as an optional RS-485 serial communications link.

The DC power input connection may be combined with the RF connection 428 to reduce the number of connections to the antenna, feeding the DC power though the coax. RF input connector 428 shield also serves as an optional ground connection for the base mounting tube 424 for attachment to a vehicle, for example. Additionally, the end cap 401 may also be modified to provide both mechanical and electrical interface for mounting, including embodiments for vehicle mounted versions. The RF signal to/from the radio is connected to RF input port 428, shown as a BNC in this embodiment via a coax (not shown). An internal coax connects the internal end of the RF signal from the input port 428 to an UNUN matching transformer 433.

In some embodiments, the UNUN transformer 433 can provide a voltage ratio ranging from approximately 2:1 to approximately 4:1. In some configurations, a relay may be used to select either the 2:1 tap or the 4:1 tap to allow an improved impedance match across the wide frequency range of this antenna, as well as to improve matching with optional top hat or whip antenna enhancements.

Control commands to the antenna can be isolated, for example using plastic core fiber optics via a pair of ferrule assemblies 402. Internal fibers, not shown, connect between the ferrule assemblies 402 and the fiber optic receiver and transmitter modules 406. The external fiber optic cable, not shown, is attached between the antenna and an external computer when tuning the antenna, and then normally detached. The external fiber optic connections may optionally remain attached even when the antenna is transmitting, to allow improved tuning of the antenna when receiving, as well as to facilitate remote monitoring of performance, such as reading VSWR. This isolated control can be provided either by an external computer or by a properly provisioned radio. In operation, the controller board 440 within the antenna measures the frequency of the transmitted RF power to determine how to tune the antenna. The optional VSWR measurements and optional impedance and phase measurements may also help in the tuning process. Alternatively, such communications can be made using an RS-485 connection, preferably with RF isolation by an active isolator circuit and/or by use of a common mode inductor/data line filter. The fiber optic technique shown for isolating communications and the isolated RS-485 are just examples of two types of isolated communications but are not a limitation on the CFA portable antenna 103.

In some embodiments, the antenna may be protected and contained in a tough radome, such as a one-eighth inch polycarbonate tube 418 with a polycarbonate cap 419 which may be affixed together by a threaded interface, by adhesive or solvent bonding, fusing, or sonic welding. The polycarbonate tube 418 and top cap 419 may also be molded directly as a single piece or may be joined by other means.

A straight threaded interface 435 may be used on both the polycarbonate tube 418 and the end cap 401 to securely but removably hold them together. Two O-rings 420 may be used to seal the radome, such as the polycarbonate tube 418, to the end cap 401. All connections passing through the end cap 401 may be sealed to provide weather-proof protection for the antenna. An optional accessory attachment flange 436 may also well sealed to the radome. Desiccant, such as silica gel (not shown) may be encapsulated within the antenna to absorb moisture to prevent condensation with rapid temperature changes. The interior of the top feed tube 417 provides a significant otherwise unused volume for holding such desiccant. Neither the presence of, nor the location nor type of desiccant is intended to be a limitation to this CFA portable antenna 103.

An encoder board 422 connects the signals from the encoder module 403 to the controller board 440. The stator winding leads (not shown) on the hybrid servo motor 404 also connect to the controller board 440. The controller board 440 may include frequency measurement capability 456, local power supplies 452, a digital signal processor 453 and motor driver circuitry 458. The input power optionally may pass through common mode inductors to decouple any RF from the power connection to the external supply voltage. An optional voltage protection circuit 451 may be included to prevent damage if the power supply is reversed, or if the battery becomes detached while an alternator is spinning, or large loads attached to the same power source are switched on or off, such as may occur when used in a vehicle or utilizing power from a vehicle.

The servo motor 404 is mounted to a motor mounting plate 423. The mounting plate has a motor pilot which accurately aligns the motor to the plate so that the lead screw 405, which is often part of the motor 404, is centered on the lead nut 408. The motor mounting plate 423 may also have features to provides proper encoder module 403 alignment to the motor shaft. The motor mounting plate 423 may be affixed to the controller mounting plate 432 with fasteners such as screws, clips, bolts, adhesive, or a combination thereof. The motor mounting plate may be connected to the base mounting tube 424 using screws, providing both electrical bonding and mechanical positioning.

A hybrid servo motor 404 is coupled to an encoder disk 413 to provide closed loop position sensing using an encoder module 403. Other feedback techniques can also be employed, including reflective sensors, capacitive sensors, hall effect, resolver, and rotor-stator field sensing. The hybrid motor 404 may also be operated in vector control or may be operated in open loop. The opposite shaft of the motor 404 may be a lead screw 405 integral to the motor. Weight and volume savings benefit from using an integral lead screw, but this is not intended to be a limitation to the CFA compact antenna. The use of a hybrid servo or step motor is not intended as a limitation to the CFA compact antenna.

The RF into input may be coupled to the base mounting tube 424 via end cap 401 using connection point 428. This embodiment requires an external counterpoise for the RF ground connections. An input power port 421 may hold a flexible power cord. In this configuration, the DC power cord brings in power to the antenna and also provides a ground reference to allow sensing the frequency of the RF signal when transmitting. The input connection point 428 may be connected to an external UNUN transformer 433, with a voltage ratio of approximately 2:1 to approximately 4:1. Again, communications to the antenna are brought in using plastic core fiber optic via a pair of ferrule assemblies 402, or by other RF isolated means including RS-485.

An embodiment by include VSWR and UNUN switching board 441 is shown in FIG. 4B. This board may hold an VSWR bridge 1801 which may assist in finding the improved tuning combinations. It may optionally include circuitry to measure Impedance and to measure phase 1815, detailed below. Note that the 2:1 to 4:1 voltage matching ratio of the UNUN 433 is generally a good for the specific mechanical dimensions of a CFA compact antenna embodiment but is not a limitation on the CFA portable antenna 103. The VSWR and UNUN switching board 441 and the UNUN transformer 433 may be mechanically held in place by VSWR and UNUN mounting plate 442. The opposite side of the UNUN 433 may be mechanically secured via UNUN lower mount plate 434. One of the two 30:1 sampling transformers 443 is shown in the FIG. 4B, representative of the voltage and current sense transformers 1802, 1803 used in the VSWR sensing circuit. A small interconnect board 444 may be used to carry signals between the controller board 440 and the VSWR and UNUN switching board 441.

The lead screw 405 turns within the lead nut 407 to convert the rotary motion of the motor into a linear motion of the pusher rod 409. Other configurations for moving the pusher rod may include linear voice coils and linear step motors, and motors with internal lead nuts. These alternate motor types may need to be powered when stationary to prevent motion, which adds to the power draw of the unit, and potentially to the RF noise level as the driver PWM would need be active while the attached radio is receiving. In an embodiment, the hybrid servo 404 may be allowed to hold position by shorting the motor leads when not changing position while also disabling the PWM drive. This minimizes any internally generated RF noise in the system to reduce interference from the internal electronics with the received signals, while also minimizing power usage.

The multi-reentrant top loading assembly includes a top cap hat 427 brazed or welded or otherwise mechanically and electrically attached to both the top loading coil 416 and the top of the feed tube 417. An optional spring contact 439 may be mounted onto the top cap hat which may be used to make connection to optional accessory attachment flange 436. An optional re-entrant capacity hat 446 may be electrically and mechanically attached to the bottom (left side in view) portion of the loading coil 416. The multi-reentrant top loading assembly may be made from metal, such as aluminum for low weight and cost, or titanium for lower weight, or other conductive material including metalized plastic. The lower end of the of the feed tube 417 may include a flange 447 electrically and mechanically attached to the feed tube 417. Studs 450, may be affixed through the flange, which extend through both the loading coil insulator 431 and the top tuning coil insulator 448, and into the typically three insulating spacers 426 so as to affix the multi-reentrant top loading assembly to the spacers 426, which, in turn are used to affix the tube contactor assembly 410, including the lower tuning coil insulator 411 and the adapter plate 425 to the upper portion of the antenna. The tuning coil 414 may fit into a recess in the top tuning coil insulator 448 at the top side (right in the figure) and into a recess the lower tuning coil insulator 411 at the lower end (left in the figure) so as to keep this coil in compression. Electrical connections may be made between the feed tube flange 447 and the tuning coil 414 at the shorting tap 1601. In another embodiment, the connection between the feed tube flange 447 and the tuning coil 414 may be made at the top end of the tuning coil 414. Top loading coil insulator 432, the lower tuning coil insulator 411, and the loading coil insulator 431 may be made of an insulator, such as a plastic material, resin, Delrin, polycarbonate or other insulating materials, which insulate the lower end of the top loading coil 416 from the top end of tuning coil 414, and the lower end of the tuning coil 414 from the both the adapter plate 425 and the non-connected circuits on the contactor PCB 802. One or more insulating spacers 449 may be placed between the top loading coil 416 and the top feed tube 417 to mechanically stabilize the flexible top loading coil 416 to prevent unwanted movement/vibration of the middle of the top loading coil. Optimally, these insulating spacers 449 may be non-symmetrically spaced to minimize the vibration modes of the loading coil 416 coupling between adjacent sections. The top loading coil 416 may be affixed to the insulating spacers 449, such as using screws or adhesive or other means, or spring like features may be incorporated into the spacer 449 or loading coil 416 to prevent acoustic noises from the loading coil striking the spacers. An alternative embodiment may implement the loading coil 416 as an electrical conductor affixed to or plated or otherwise deposited upon an insulating material to reduce weight while also making this structure rigid.

In another embodiment, a top loading coil design can have the length and pitch of the spiral of the top loading coil 416 configured according to the desired frequencies to be covered by the antenna. Larger top frequencies may make use of less of the spiral present so that the minimum electrical length of the antenna is not excessive for the top frequency. It is envisioned that a similar cut to metal ratio may be used. The starting point for the section with the spiral cut may be moved up or down on the loading coil. The pitch of the spiral may also be configured for a particular application.

In another embodiment, a combination of inductors, capacitors and/or resistors, may be connected across one or more section of the top loading coil structure 416, 417 to form a trap (resonator) to allow additional high the frequency range of the antenna to extend to portions of the VHF spectrum.

Figure 5:
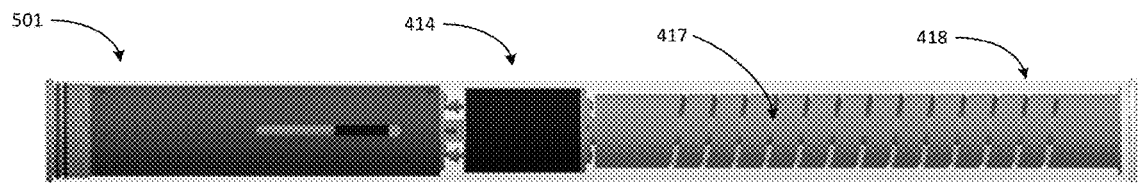
FIG. 5 depicts an example of a graphical side, view of a compact frequency adjustable portable antenna in an embodiment.

FIG. 5 illustrates an example of a view of the CFA compact antenna system 501 in an embodiment. The polycarbonate tube 418 can be transparent to show the tuning coil 414.

Figure 5A:
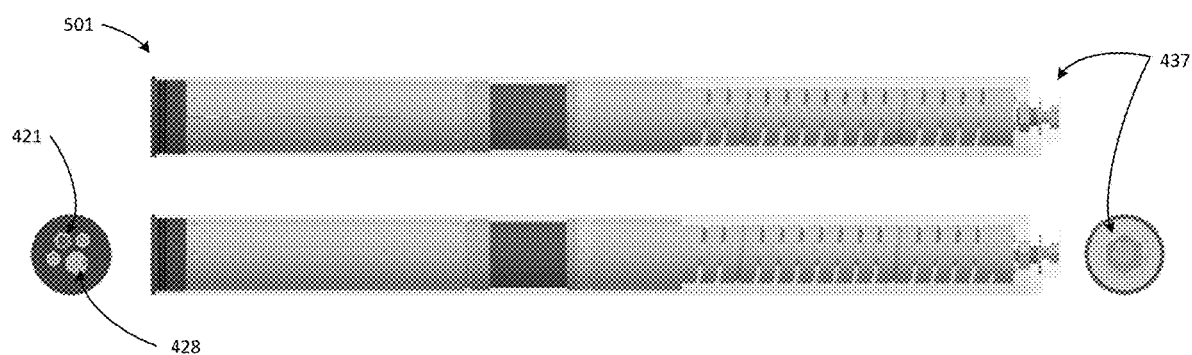
FIG. 5A depicts an example of a graphical side, top and end views of a compact frequency adjustable portable antenna in an embodiment.

FIG. 5A illustrates a side view, top view and end views of the compact frequency adjustable portable antenna 103 in an embodiment. The polycarbonate tube 418 and cap 419 as well as the insulated cap 437 have been rendered as transparent. The unit can be 2.25 inches in diameter and approximately 25 inches in length not including the coiled power cord.

2.2. Tuning Coil

Figure 6:
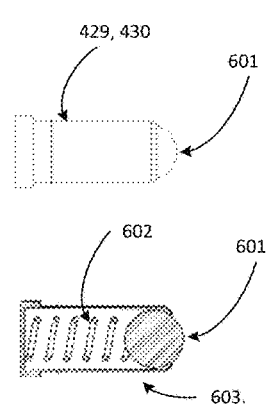
FIG. 6 depicts an example of a spring-loaded rolling contact.

FIG. 6 illustrates an example of a spring-loaded rolling contact. In an embodiment, the electrical contact between the tube contactor assembly 410 and the pusher rod 409, and between the coil contactor plate 412 and the tuning coil 414 are made using spring loaded rolling contacts 429, 430. The spring-loaded rolling contacts include a spring 602 and a gold- or silver-plated contact ball 601 inside a gold- or silver-plated case 603. They are physically small and light and may maintain contact over typically approximately 0.060 inch of travel. The light spring force limits contact force and the force needed to move the push rod 409 within the tuning coil 414. Although some type of rolling contact 601 is preferred, such as a ball or disc, other contact methods may be utilized without affecting the concept of the CFA portable antenna 103.

Figure 7:
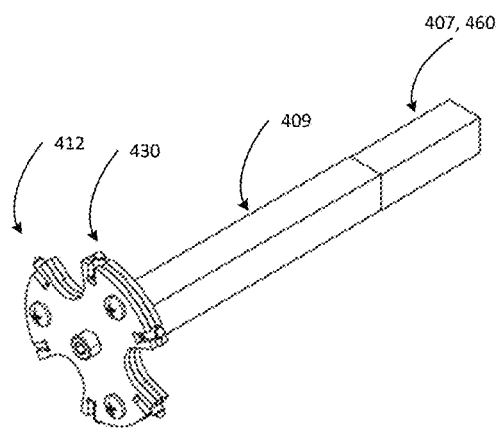
FIG. 7 depicts an example of a slider mechanism.

FIG. 7 illustrates an example of a slider/contactor mechanism. The coil contactor plate 412 may hold multiple rolling contacts 430. In some embodiment this can show six rolling contacts. Multiple contacts help keep the contactor plate 412 centered on the coil and provide redundancy. The coil contactor plate 412 may be affixed to the pusher rod 409 both electrically and mechanically, or these can be made as a unified structure. The pusher rod 409 may have a variety of configurations. The pusher rod 409 may be a single hollow square brass tube that has been silver plated. The metal pusher rod 409 may alternately be formed with a metal portion of sufficient length to remain in electrical contact with the rolling contacts 429 within the tube contactor assembly 410 while moved over the full length of the tuning coil 414. The remainder of the pusher rod 407 may consist of the insulating plastic of lead nut as shown in cross section in FIG. 4B. The coil contactor plate 412 may be formed from multiple layers of formed metal, which may have different patterns on different layers to hold and contact the rolling contacts 430, as well as for holding rotational alignment with the pusher rod 409. The contactor plate 412 may also be formed in a variety of ways including laser cutting, stamping, machining, casting, and/or may consist of one or more Printed Circuit Boards (PCB) and/or a 3D printed structure. It is understood that the CFA portable antenna 103 may utilize other variations in producing the contactor assembly.

Other embodiments may utilize plating of the various components with moving contacts as described or may alternately employ alternate metals and alloys. In some embodiments the plating can include silver, gold, palladium, rhodium, osmium, iridium, ruthenium, or other metals which resist forming an insulating oxidation layer. It is understood that such parts described as plated may also be constructed to include solid sections of such preferred materials rather than just plating.

The square shape of the pusher rod 409 is not the only shape that may be used consistent with CFA portable antenna. The pusher rod 409 and coil contactor plate 412 assembly may be configured to avoid rotation when the motor rotates, so a variety of shapes that can resist rotation may be used. For example, the pusher rod 409 may be triangular, square, pentagonal, ridged, irregular, or have other shapes that resist rotation.

Figure 8:
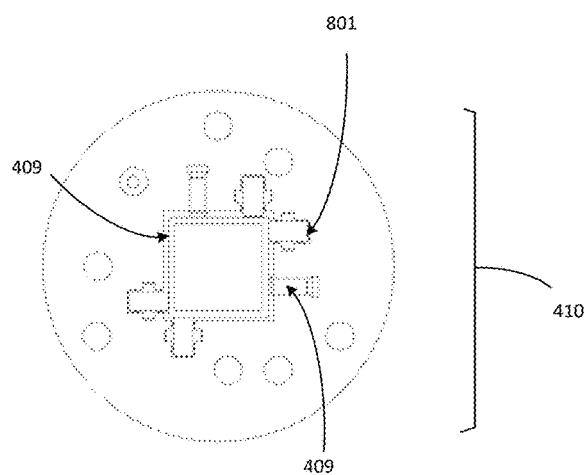
FIG. 8 depicts an example of a top view of the tube contractor assembly in an embodiment.
Figure 8A:
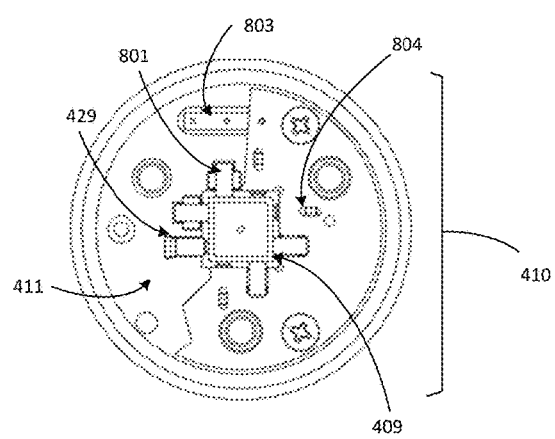
FIG. 8A depicts a tube contractor base in an embodiment.
Figure 8B:
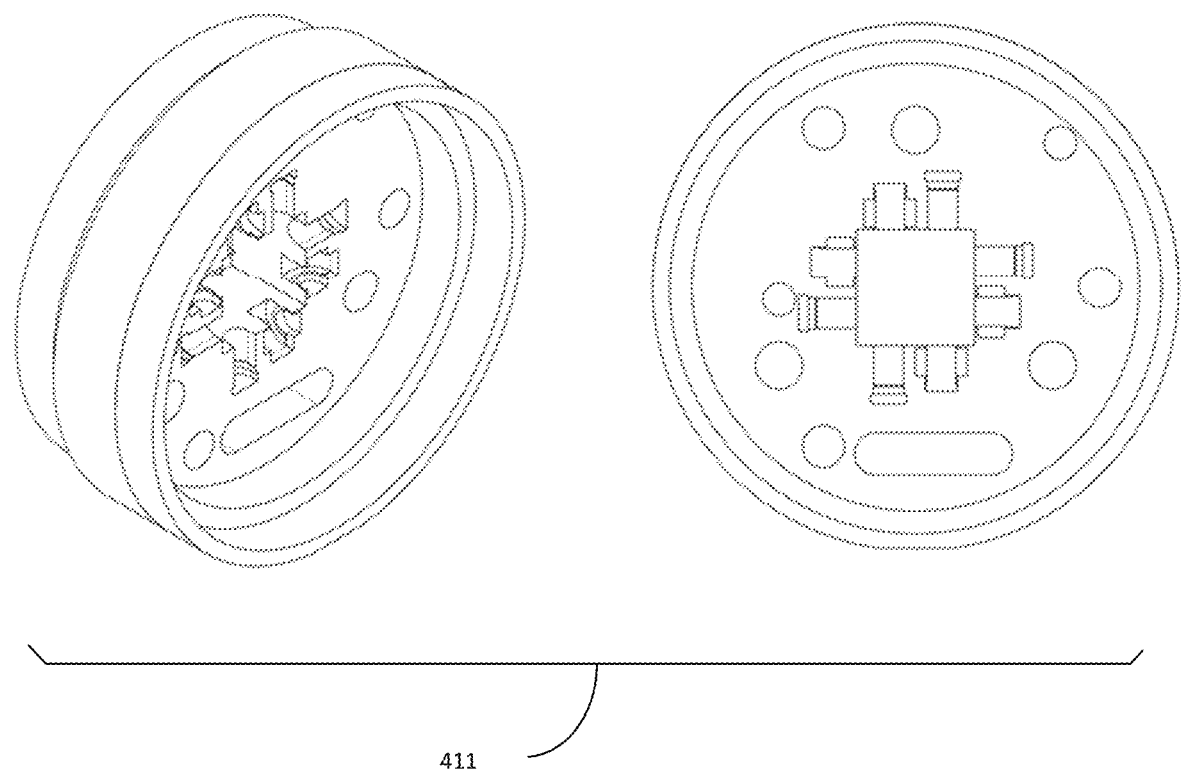
FIG. 8B depicts an example of an isometric and a top view of the tube contractor base in an embodiment.

FIG. 8 illustrates a top view of the tube contractor assembly in an embodiment. The pusher rod 409 may be made of silver-plated brass and may have a square cross section. The square cross section may be used as an anti-rotation feature. The lead screw 405 is isolated from the pusher rod 409 either by using an insulating (such as all-plastic) lead nut 407 or by incorporating a metal lead nut within a non-conductive (such as plastic) lead nut structure 407. In another embodiment, the motor may be isolated from the lead nut, such as by use of a non-conductive lead screw. Four ball bearings rollers 801 may be used to capture two opposite corners of the square pusher rod 409. Opposite corners of the square pusher rod 409 may be used to minimize the contact force needed to counteract the rotational force from the lead screw turning within the lead nut. The use of roller bearings also minimizes the forces needed to translate the pusher rod to allow faster motions with a smaller motor. Four rolling contacts 429 may be used to conduct the RF signal from the tube contactor PCB 802 within the tube contactor assembly 410 to the pusher rod 409 and on to the coil contactor plate 412. It is understood that the exact number of bearings and contactors is not critical to the concept of the CFA compact Antenna 103 and may be varied as is useful. In another embodiment, the bearings and the rolling contact may be combined or substituted to provide similar conduction to and guidance of the pusher rod 409, again without affecting the concept of the CFA compact antenna 103. The contactor assembly 410 may be formed by various methods including machining, molding or 3d printing a lower plate/lower coil insulator 411 with receptacles to hold the bearing shafts and the rolling contact bodies. A printed circuit contactor board 802 may be used to both retain the bearings 801 and the rolling contacts 429 as well as to make electrical connection between the rolling contacts 429 and to connector 803. Additionally, the contactor board 802 may connect the tuning coil 414 bottom contact and to connector 803, which in turn may make electrical connection to the coil bottom relay 445 on VSWR UNUN switching board 441. The coil bottom relay 445 may allow the controller to select between the varying impedances to terminate the bottom terminal of the tuning coil 414 to various nodes which may include the RF output terminal 1204 from the UNUN 433 coil. A typical impedance selection for the coil bottom relay 445 may be open or connected typically via a 390 pF capacitor. The design of CFA compact antenna is not intended to be limited to these particular impedances but may allow the selection of a multiplicity of impedances. The contactor base 411 may be formed in a variety of ways including machined, molded, 3D printed, etched, milled, cast, or a combination thereof. FIG. 8A shows another embodiment of the contactor base. FIG. 8B shows an oblique and top view of the contactor base 411 for clarity.

The contactor PCB 802 (shown in cutaway view) may be affixed through the contactor base 411 to the adapter plate 425 use of screws. The isolates the lower end of the tuning coil 414 from the tube contactor assembly 410. An electrical connection may be made to the bottom of the tuning coil 414, and the bottom of the coil is slid into the top of the contactor base 411 which may both support and insulate the tuning coil 414. The tube contactor assembly 410 and adapter plate 425 subassembly may then be secured using cap screws that go through the adapter plate into the insulating spacers 426 located inside the tuning coil 414.

A connector 803 may be used to connect contactor assembly 410 to the UNUN 433, typically via the VSWR UNUN switch PCB 441. The adapter plate may be affixed to the two halves of the (split) base mounting tube 424. The base mounting tube, in turn, is affixed to the end cap 401. The mounting tube 424 may be split into multiple sections (two as shown) to facilitate easy assembly of the components within the mounting tube.

Using the lower mast, consisting of the adapter plate 425, the base mount tube 424 (both halves), and the end cap 401 of the antenna, as a grounded portion of the counterpoise is advantageous when the antenna is deployed on a backpack, as having this section not energized may help move the RF fields further away from the operator. This both reduces RF exposure to the operator and simplifies the connection to the antenna, allowing standard coax to be used. Another embodiment with the lower mast grounded can allow the UNUN 433 and optional VSWR bridge to be incorporated within the antenna. The VSWR curves shown in FIG. 14A—14D, FIG. 15, FIG. 21A-21D, FIG. 22A-22E were taken using this lower section 425, 424, 401 as a counterpoise which may optionally be connected to an external RF ground/counterpoise. Testing that produced the various graphs used a multi-turn BALUN coil around the feed coax and input power cable to RF isolate the power and RF input cables from the antenna itself, to simulate what the small counterpoise of the antenna connected to a radio in a backpack may encounter. Testing was also done which included a adding a 2×3 foot conductive sheet as an extended counterpoise to simulate connecting the end cap 401 to either a backpack frame or a small vehicle. The antenna was readily able to adequately tune each of these different embodiments.

In another embodiment, the lower mast of the antenna, including the end cap 401 and the base mounting tube 424 and end cap 401, may be operated as a portion of the RF energized antenna. In this alternate embodiment, the UNUN 433 output 1204 may connect to both the contactor PCB 802 and to the lower mast. The ground terminal of the UNUN 1203 may connect to the outer shield of the RF input connector 428 which would need to be insulated from the end cap 401. This embodiment may have slightly higher transmit signals but also may have lower signal to noise on receive.

In another embodiment in which the base mounting tube is energized, the UNUN may also be located external to the CFA portable antenna to minimize the length of the ground connection between the bottom of the UNUN coil 1203 and the external counterpoise.

A set of measurements were made comparing the CFA portable antenna 103 with the lower mast grounded to a small counterpoise to a different antenna 101 using a whip antenna mounted to a 10' grounded mast having several tuned radials. The actual measurement of background noise showed approximately 8 S-units less noise when using the CFA portable antenna 103 as compared to a different antenna 101 at the same location, while listening on 10 MHz daytime with weak signal conditions. At other times of the day with better propagation, strong received signals, such as those well above noise level, may be measured within +2 and −2 S-units between the two antennas. This gives a significant advantage to the CFA portable antenna 103 when listening to weak signals. In an illustrative example, the radio station WWV could not be heard above the noise on one antenna 101 while the signal was 4 to 9 s-units above the noise listening at the same time (when propagation was not particularly good). This corresponded to S1 noise levels with 20 dB of gain amplifiers turned on for the CFA portable antenna 103 compared to S8 to S9 noise levels with the same 20 dB of amplification for some other antenna 101. The WWV signal (with both amplifiers turned on using FT991A, ~20 dB) was S6-S9+10 on the CFA portable antenna 103 and easy to hear, while it was significantly below the background noise level using the other antenna 101.

FIG. 8A illustrates depicts a tube contractor base in an embodiment, The tube contactor assembly can include the ball bearing rollers 801, the connector 803, the contactor assembly 410, the pusher rod 409, and the lower coil insulator 411.

FIG. 8B illustrates an example of an isometric and a top view of the tube contractor base in an embodiment, The lower plate/lower coil insulator 411 can be attached to the CFA portable antenna 103.

Figure 9:
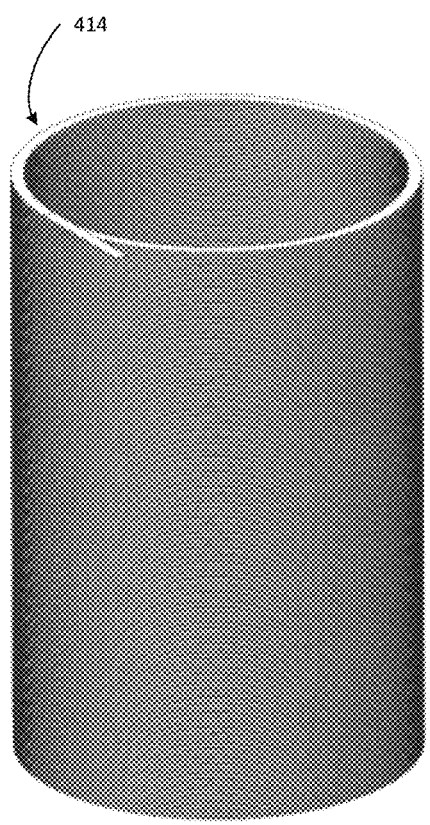
FIG. 9 depicts an example of a tuning coil.

FIG. 9 illustrates an example of a compact tuning coil 414. In an embodiment, the tuning coil 414 may have approximately 460 turns of the flat wire conductor 901 allowing tuning to approximately 1 MHz if shorting contact 1601 is not used and approximately 1.3 MHz if shorting contact 1601 is utilized. In another embodiment, a version supporting a minimum frequency of 1.6 MHz may utilize just more than half that number of turns. The embodiment utilizing 340 turns on the coil may have an inner diameter of 1.73 inches and an outer diameter of 1.85 inches, with a height of 2.56 inches. This many result in approximately 130 turns per inch. This embodiment may give a length to diameter ratio of approximately 1.4:1. The "Q" or quality of a coil is generally improved by having the length to diameter ratio generally between 1 and 2. The number of turns and/or the diameter may be adjusted to change the desired tuning range of the antenna. The flat conductor 901 used in the tuning coil 414 tested to produce the measurements had a metal conductor dimension of 0.2 mm (0.0078 inches) thick by 1.5 mm (0.060 inch) thick. This conductor can be insulated 1903 with polyamide approximately 0.01 mm thick with an additional coating of an adhesive that may be activated with solvent allow adhesive on the turns of the tuning coil 414 to fuse, resulting in a coil that can be rigid and able to hold its shape when removed from the winding fixture. In another embodiment, the insulation 1903 of the tuning coil 414 may be fused by heating the coil, either by passing current though the coil, or by use of an oven to, resulting in stable self-supporting coil structure when removed from the winding fixture.

The tuning coil 414 was designed to operate as a nearly ¼ electrical wavelength transmission line to help transform the high impedance of an electrically short antenna to the lower feed point impedance. Adjusting the coil to be slightly longer or shorter than ¼ electrical wavelength helps adjust the reactive portion of the impedance seen by the radio transmitter by changing the propagation time of the transmission line so as to alter the phase of the signal reflected from the top structure of the antenna back through the tuning coil as compared to the phase of the signal feeding the tuning coil. The solenoid configuration of the tuning coil 414 does not magnetically contain the field, and so the flux generated by current passing through the windings of the tuning coil 414 escapes the confines of the tuning coil, contributing to the efficiency of the antenna. The use of an air core tuning coil also essentially eliminates hysteresis losses, as there are essentially no magnetic materials effectively coupled to the tuning coil. The use of such an air core solenoid tuning coil 414 may be contrasted to common matching methods such as ferrite toroid cores often used in many auto-tuner circuits. These toroid cores are physically much smaller and are generally designed to minimize leakage of the magnetic field, from the toroid. The hysteresis of the toroid material contributes losses, while the contained magnetic fields of the toroid's do not contribute to the radiation of RF power nor to the reception of RF signals by the antenna connected to such a toroid-based antenna tuner.

The electrical length of the tuning coil 414 is longer than the physical length of the wire due to the effective dielectric constant of the insulator 1903 surrounding the conductor 1902. The reduced propagation velocity due to the significant dielectric constant of the insulation in this configuration slowing the speed of propagation to less than the speed of light. The reduced speed further aids in reducing the coil dimensions needed to tune the antenna for a given lower frequency. The electrical length of the helical transmission line formed by the tuning coil 414 is adjusted by moving the contact points 430 along the inside of the tuning coil 414 by the rotation of the motor lead screw 405 within the lead nut 407. The significant magnetic coupling of the tuning coil 414 may contribute to the low receiving noise of this antenna.

Figure 9A:
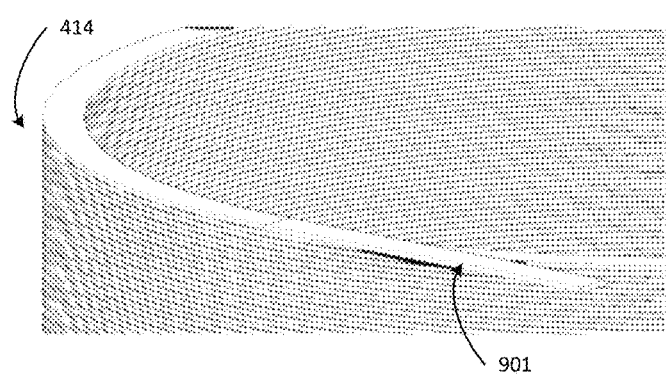
FIG. 9A depicts an example of a cross section view of the flat conductor of the tuning coil.

FIG. 9A illustrates a cross section view of the flat conductor 901 of the tuning coil 414. The flat conductor 901 can have a variety of configurations. For example, the flat conductor 901 may typically have slightly radiused corners or may have a completely rounded edge for the thin dimensions and may also be available in a variety of widths and thicknesses. The conductor may be plated prior to insulating, or after stripping, or may be formed entirely of a noble metal, such as silver. The thin, flat shape of the wire allows for sufficient cross section to handle the RF currents while also allowing many turns to be wound in a compact configuration. This thin, high aspect ratio wire combined with flat winding of the tuning coil 414 allows for the small diameter of the CFA compact antenna while also enabling the desired diameter to length ratios needed for high-Q, all while still having sufficient turns to allow low frequency operation operating essentially as a leaky tunable quarter wave transmission line.

Figure 10:
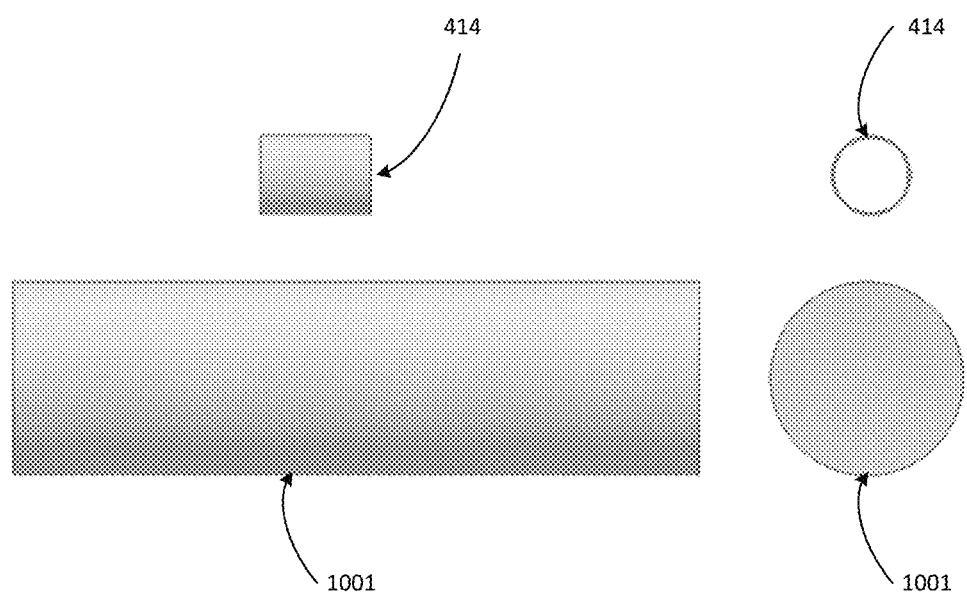
FIG. 10 depicts an exemplary diagram of the relative sizes of tuning coils.

FIG. 10 illustrates embodiments of the tuning coils 1001. The relative sizes of alternate tuning coils 1001 not using flat wire can be compared to the preferred tuning coil 414 using flat wire. The larger tuning coils 1001 may be included in other antenna 101, 1022 structures while the tuning coil 414 may be used in the CFA portable antenna 103. Both side and end views are shown. This great reduction in size—from approximately 254 cubic inches to 6.4 cubic inches, about 1/40 of the volume. A great reduction in weight is also obtained. The reduced size and weight of the tuning coil are paramount to shrinking the size and weight of the CFA portable antenna 103. The smaller tuning coil 414 may also have a significantly higher maximum inductance of approximately 2.6 mH as compared to approximately 300 uH for the other tuning coil 1001. The smaller tuning coil 414 further has a significantly longer electrical length allowing operation at lower frequencies. The longer wire length of the tuning coil 414 combined with a lower propagation constant—approximately 0.7 c due to being essentially surrounded by the polyamide insulation—results in some embodiments of the CFA portable antenna 103 being able to resonate down to approximately 1 MHz using just the antenna multi-reentrant loading structure and the tuning coil 414 with the UNUN transformer already described. The prototype of the new coil 414 has a measured "Q" factor of approximately 42 when constructed using unplated copper wire. The "Q" factor may typically improve with the use of silver plated or solid silver wire. It is understood that other metals may be used for the wire.

Figure 11:
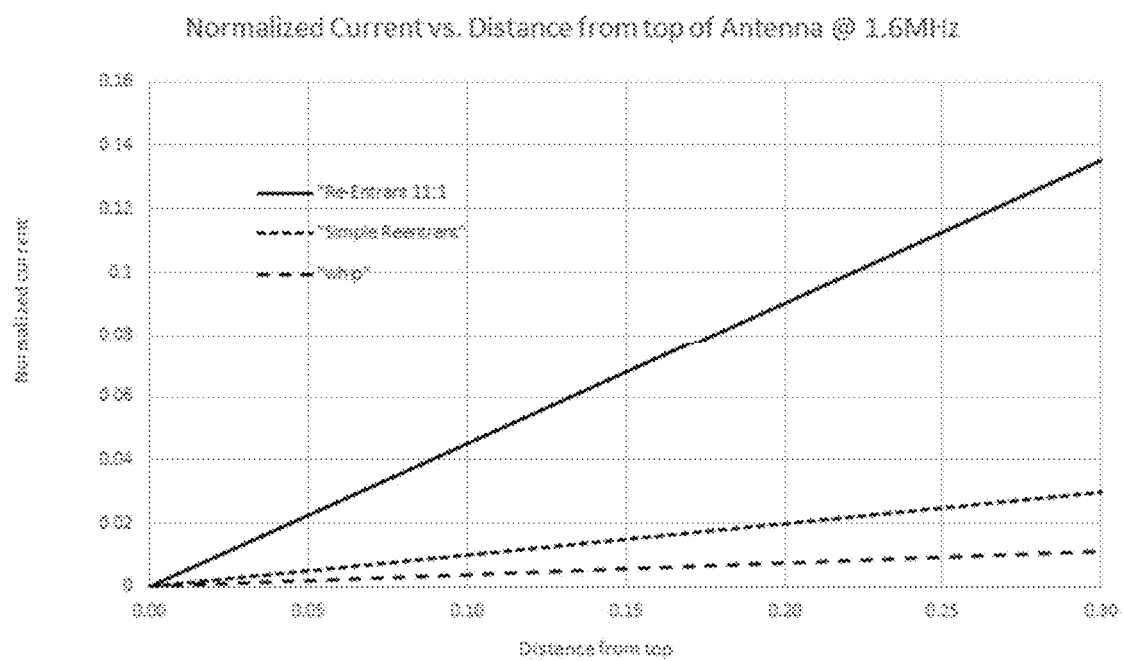
FIG. 11 depicts an example of a chart of the normalized current for different antenna configurations.

FIG. 11 illustrates an example of a chart of the normalized current for different antenna configurations. In an embodiment, the expected normalized current, relative to the maximum feed point current, expected in the top loading coil 416, the top feed tube 417 and top cap hat 427 section of the antenna. The calculation is somewhat simplified, modeling the transmission line effects of the top section without including the radiating resistance or the capacitance of the structure. The current, as simplified, starts at approximately zero at the end of the whip antenna and increases sinusoidally with the fraction of the wavelength. This top section is approximately 0.3 m (12 in) length. At 1.8 MHz, a full wavelength is some 167 meters, so 0.3 meters represents only 0.0018 of a wavelength. With a sinusoidal current pattern, the normalized current at the base of the whip is sin(0.0018*2*pi)=0.0113. Thus, a little over 1% of the maximum current is seen at the base of a 0.3-meter whip at 1.6 MHz if a 0.3 m whip antenna were to be used as the top loading structure.

A simple reentrant cap can route the current from the bottom of the feed tube 417 up to the top cap hat 427 and back down the top loading coil 416, but there is no spiral cut in the outer tube for a simple reentrant cap. The extra capacitance of the larger diameter tube acts as a capacitor hat, which starts the current at approximately tip voltage divide by the impedance of the capacitance of the top hat at the operating frequency. This helps increase the current in the top section. The capacitive hat effect is not included in the calculation for this simplified calculation. It is expected the reentrant top hat would perform slightly better than the graph indicates due to the capacitance of the structure. The electrical length of the top section is also twice that of the whip, but the current on the outer conductor (loading coil) 416 effectively subtracts from the current on the inner conductor (top feed tube) 417. The currents are essentially equal for the inner and outer conductors where they connect to each other, so the current at the top of the antenna is shown as zero for the "simple reentrant" antenna (middle curve) as the magnetic fields for the inner and outer conductors at the top effectively cancel. At the base of the antenna (0.3 m from tip), the outer conductor has nearly zero current (only the capacitance top hat current), while the inner conductor is now twice the electrical distance from the zero-current point. Thus, while the currents are subtracting, the effective current at the base (0.3 m from the tip) is seen to be 0.03 of the maximum, almost 3× that of the whip, producing significant gain over the same length whip.

The multi-reentrant cap used in this CFA portable antenna 103 (top curve) extends this effect by lengthening the electrical length of the outer conductor—the top loading coil 416—by adding a spiral cut to the tube. In these calculations, the spiral makes this 0.3-meter section about 11 times longer—some 3.3 meters or 0.021 wavelength in this example. The inner and outer currents subtract at the same distance from the antenna top, but the currents are significantly larger with the longer electrical length of this structure. The net current into the feed tube 417 is shown in the top line of FIG. 11. This is about 6 times the current for the simple reentrant cap and 12 times that of the whip. As the radiated power goes up roughly with the square of current, the simplified calculations show nearly a 36× (15 dB) improvement over the simple reentrant antenna and 144 times (21.5 dB) compared to a whip of the same dimensions. In some embodiments, additional gain can be achieved due to the capacitance of the larger structure, meaning the actual gain may show additional improvement for the reentrant and multi-reentrant designs compared to the whip.

FIG. 12 illustrates an exemplary view of the UNUN transformer 433. The 4:1 input matching UNUN (unbalanced to unbalanced) transformer may include a ground 1203, the input connection 1201, and the output 1204. In an embodiment, the UNUN transformer 433 may include eight sets of turns around the core, with four wires in each set for a total of thirty-two turns. The ground input 1203 may be shared between the input connection 1201 and the output connection 1204. The input may be taken at the eight-turn point in the coil, counting from the ground 1203 end of the coil. The output for this configuration can be taken at the thirty-two turns point of the coil, resulting in a 4:1 voltage step-up corresponding to a 16:1 impedance transformation.

Figure 13A:
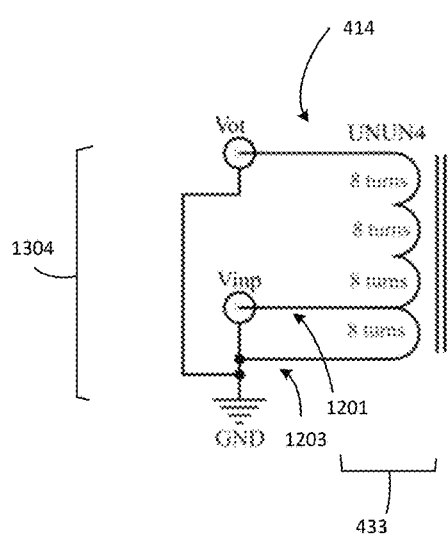
FIG. 13A depicts an exemplary schematic diagram of a 4:1 UNUN transformer.
Figure 13B:
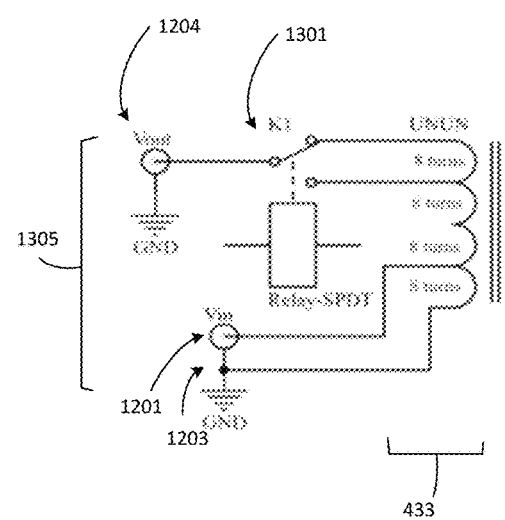
FIG. 13B depicts another exemplary schematic for a switchable voltage ratio UNUN transformer.

An alternative embodiment would utilize tap 1202 to this coil at the 16 turns point to allow an alternate 2:1 voltage step-up UNUN corresponding to a 4:1 impedance transformation connection as in FIG. 13B. Alternate core sizes and materials, as well as the number of turns required for the desired impedance matching ratios may be varied. The CFA portable antenna 103 does not preclude similar variations in producing the UNUN coil assembly, nor the use of additional taps and selection networks to allow finer impedance matching capability. The UNUN may be wound with the well-known multi-filar configuration. In another embodiment, the coil may have 4 sets of 8 turns on a FT-140-43 core.

FIG. 13A illustrates an example of a fixed UNUN 1304 circuit in an embodiment. The fixed UNUN 1304 circuit shows a 4:1 step up ratio shown, the input 1201 to the UNUN 433 transformer drives the lower 8 turns of the UNUN 433 against the ground terminal 1203 with the output from the UNUN output 1204 using all 32 turns of the UNUN 433, again referenced to ground terminal 1203. The output 1204 of the UNUN 433 is connected to connector 803, which connects to the tube contactor assembly 410, providing a rolling contract 429 to the pusher rod 409, to coil contactor plate 412, through rolling contact 430 and finally to tuning coil 414 which connects to the loading structure of the antenna via top feed tube flange 447. The ground connection 1203 is electrically connected to the base mounting tube assembly 401, 424, 425 as a counterpoise, as well as any external counterpoise connected via the RF input connection 428 or via the end cap 401. Such internal connections 1203, 1204, 1307 may include using a connector 803, but other connection techniques may also be used.

FIG. 13B illustrates an example of a schematic for a switchable voltage ratio UNUN transformer in an embodiment. In a switchable UNUN configuration where the antenna connected at Vout 1204 may be driven either from the 3:1 tap or from the 4:1 tap, providing either a 9:1 impedance transformation, such as a 450 ohm when fed from a 50-ohm input 1201, or a 16:1 impedance transformations—800 ohm when fed from a 50-ohm input 1201. The controller can select the state of the relay 1301 to select which turns ratio to use for a particular measured frequency.

The high VSWR frequency ranges 303 in FIG. 3 of some designs can be eliminated by selectively allowing the lower end of the tuning coil 414 to be either open or to be attached to the slider coil. Other impedances could also be used to terminate the lower end of the tuning coil, such as a selection one or more capacitors or a variable capacitor. The input signal propagates along the helical transmission lines formed by upper and lower sections of the tuning coil 414 and the contactor 430 rolling contacts 601 where they contact the tuning coil. The energy traveling towards the bottom end of the coil reflects with the magnitude and phase determined by the load at the bottom end of the coil. The frequency and the length of the coil between the rolling contact 601 and the bottom of the coil determines whether the reflected wave is constructive or destructive to the signal being applied via the rolling contact. When the bottom of the coil is connected to the feed point (and contactor), there is a wave being launched from the feed point and delayed by the length of the bottom portion of the coil before it encounters the rolling contacts 601 of the contactor 430. If this signal is of the wrong phase and amplitude, the impedance of the feed point is not able to be properly matched to the nominal feed impedance of the antenna, causing most of the energy to be reflected back to the radio, resulting in a high VSWR. The addition of a switching network 408, such as a relay, allows either connecting the lower end of the tuning coil to the feed point, or allowing it to be open, or the selection of multiple other impedance values, allowing the reflections from the lower end of the coil to be phased advantageously to obtain good VSWR matches over the full frequency range.

Figure 13C:
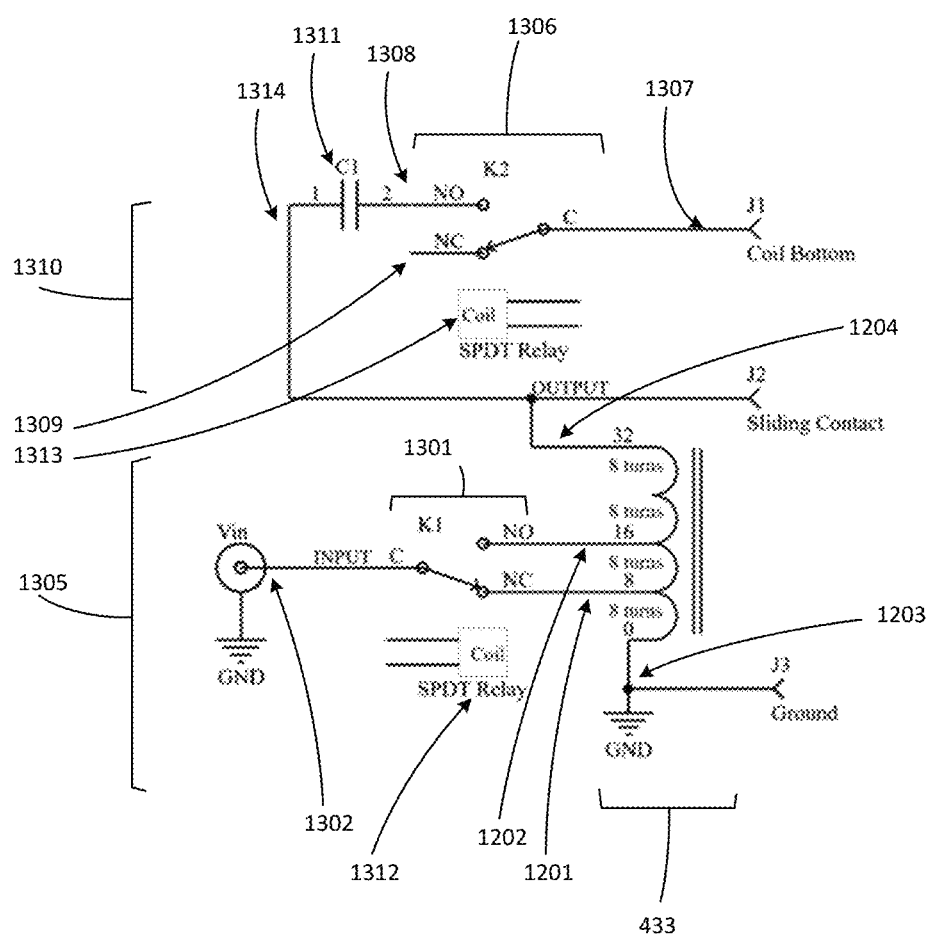
FIG. 13C depicts another exemplary schematic for a switchable voltage ratio UNUN transformer and selectable termination for the tuning coil.

FIG. 13C illustrates an example of a UNUN circuit in an embodiment. The UNUN circuit 1305 can be configured with the controller board 440 to control the control relay 1301 within a switchable 2:1/4:1 UNUN 1305 circuit to select whether the 2:1 or 4:1 voltage ratio is utilized. The input 1302 to the UNUN circuit 1305 is fed by the radio via an internal coax (not shown), either directly or preferably via the VSWR sensing circuit 1801. When the 4:1 ratio is selected via UNUN select relay 1301 NC contact, the RF input 1302 is connected to the 8 turn input point 1201 referenced to ground 1203. This connection drives the bottom 8 turns of the UNUN coil 433. The UNUN output 1204 is taken across all 32 turns of the UNUN 433 coil.

In one configuration, the 32 turns of output utilizing 8 turns of input produces a 4:1 voltage step up which corresponds to a 16:1 impedance transformation. 2:1 ratio is selected via UNUN select relay 1301 NO contact. The RF input 1302 can be connected to the 16-turn input point 1202 referenced to ground 1203. This connection drives the bottom 16 turns of the UNUN coil 433. The UNUN output 1204 is taken across all 32 turns of the UNUN 433 coil.

In another configuration, the 32 turns of output utilizing 16 turns of input produces a 2:1 voltage step up which corresponds to a 4:1 impedance transformation. The antenna internal feedpoint 1204 impedance varies over the wide frequency range of the CFA portable antenna, and also varies with the addition of the optional capacitance top hat 1701 or the whip 2002 elements. Allowing the impedance matching ratio to be selected provides an additional optional means of improving the match between the antenna and the attached radio to improve both transmitted power and received signal strength. In some embodiments, the UNUN matching circuit 1305 can be configured with two selected taps, a single tap, multiple taps, or a combination thereof to provide a multiplicity of transformation ratios. For some embodiments, the input and output ports of the UNUN may also be swapped for configurations where the feed point of the antenna is less than the radio transmitter impedance. This swapping may be fixed or may be programmable through use of a relay. The voltage ratios may also be selected to be other than 2:1 or 4:1 and additional relays may be used to increase the number of selectable ratios available as well as to swap the input and output of the UNUN 433. The number of turns may also be varied based on the selected core material and core geometry. The turns ratio showed in the drawing are for a type FT140-43 core. It is understood that other embodiments can include other materials and geometries as well as coil winding turns and techniques.

The termination network for the bottom of the tuning coil 1310 uses a selection matrix 1309, which may be implemented by a relay 1306, selecting either a capacitor 1311 of a typical value of 390 pF when the relay 1306 coil 1313 is energized, connecting the NO 1308 to coil bottom 1307, or may connect the coil bottom 1307 to an open connection 1309 when in the relay 1306 coil 1313 is not energized (NC position). The impedance connected to such a selection matrix 1308, 1309 connection points, which is used to terminate the bottom of the tuning coil 414 via Coil Bottom connection 1307 may include a direct connection to the output to the moving connection 1204 to the tuning coil 414, and open connection, and/or may use other impedances and connection points including the counterpoise ground 1203. The opposite side 1314 of the impedance C1 1311 may be connected to the sliding contact 1204 connection, but this is not a limitation. The purpose of this selectable impedance is to change the phase and/or amplitude of the signal connected to or reflected from the bottom of the tuning coil 414 which is effectively a helical transmission line. Changing the phase and/or amplitude of the signal connected to or reflected from the bottom of the tuning coil, changes how it adds or subtracts from the signal driving the antenna 1204, changing the impedance seen by the transmitter at the input port 1302. The use of one or more different impedances for this termination, as well as one or more relays 1306 or other selection matrix to select the impedance are all understood as being consistent with the operation of the CFA Portable Antenna. It is understood that the relays 1301, 1306 are driven by electronics that are typically located on the controller board 440. These relays 1301, 1306 are shown in the drawing as single coil relays, but it is known that the use of latching relays having either a single bipolar winding, or with separate set and reset coils, may be advantageously used to reduce the power utilized when not changing frequencies, as latching relays use only momentary pulses of current to change the state of the relay which then retains that state until again pulsed. Such latching relays are preferential as reducing the power usage extends battery life in portable applications. While latching relays are preferential, the use of non-latching relays is acceptable.

It is also understood that the term "relay" indicates a controllable switching method that may include solid state switches and MEM networks in addition to traditional electromagnetic relays or stepping relays and other means to select impedances or connection points under electronic control.

The coil bottom network 1310 can include one or more relays 1306 or other switching means, allowing this tuning coil bottom node 1307 to be connected to multiplicity of selected impedances, which may include an open circuit, a direct connection, or a connection through a capacitor, inductor, resistor or combination thereof, to a signal return point that may include the antenna feed point 1204 or to the antenna counterpoise ground 1203.

The antenna controller board 440 may be configured to control the state of the switching network to improve the performance of the antenna for the selected frequency. The ability to control the impedance connected to the bottom of the tuning coil 414 allows the phase and/or magnitude of the signal that is reflected from or driven into the bottom of the tuning coil to be changed. This ability to change the phasing and or magnitude of the signal at the bottom 1307 of the tuning coil 414 helps avoid having frequencies which cannot be properly tuned resulting in high VSWR 303.

The antenna controller board 440 also measures the RF frequency, interpolates the position from a frequency tuning calibration table, controls the hybrid servo 404 and provides communications to the fiber optics or other control communications means which may include RS-485. The antenna controller board 440 also may include circuitry to protect against reverse polarity and overvoltage conditions which may arise from connection to a vehicle power system or other power source.

In some embodiments the end cap 419 can incorporate a threaded accessory antenna attachment flange 436, which may utilize ⅜×24 threading, although other threads can be used. The accessory attachment flange 436 can be used to attach an optional capacitive top hat 1701 or a whip antenna 2002 or a wire antenna to the CFA portable antenna. For embodiments incorporating an accessory connection flange 436, an insulated cap 437 incorporating a bolt 438 threaded to match the thread of the mounting flange 436 may be installed when the accessory is not in use to insulate the high voltage RF point at the top of the CFA portable antenna. The RF energy may be coupled to the mounting flange 436 by means of a spring contact 439 between the flange 436 and the and the top cap hat 427.

In some other embodiments, a switchable UNUN configuration where the input tap 1302 to the UNUN may be selected as either 8 turns for the input 1201 or at 16 turns for the input 1202 antenna via the state of the relay 1301, and with the output voltage Vout 1204 taken across the full 32 turn of the UNUN 433.

This can result in either a 4:1 voltage step-up ratio when relay 1301 connects the input 1302 to the 8 turn input 1201 to the UNUN 433, or a 2:1 voltage step-up ratio when relay 1301 connects the input 1302 to the 16-turn input 1202 to the UNUN 433.

The 2:1 voltage step-up corresponds to a 4:1 impedance transformation which matches the 50 Ohm input 1302 to a 50*4=200 Ohm antenna feed point 1204 impedance, while the 4:1 voltage step-up corresponds to a 16:1 impedance transformation which matches the 50 Ohm input 1302 to a 50*16=800 Ohm feed point 1204 impedance.

The controller 440 may select the state of the relay 1301 to select which turns ratio to use for a particular operating frequency. An impedance ratio ($Z_L/Z_O$ or $Z_O/Z_L$) of 2:1 results in a VSWR of 3:1, so the switchable UNUN may practically match from 100 Ohms (0.5*200 Ohms) to 1600 Ohms (2*800 Ohms) while staying at or below a 3:1 VSWR. In another embodiment, additional taps may be provided on the UNUN 433 to allow a finer adjustment of voltage ratio and resulting impedance transformation to reduce the VSWR further, if desirable. These taps may be selected by additional relays.

The high VSWR frequency ranges 303 in FIG. 3 of some designs 1, 2 may occur when the bottom of the tuning coil 201 is open with a ¼ electrical wavelength (or odd multiples of ¼ wavelength), for a given frequency, between the sliding tap connection 203 and the bottom of the tuning coil 201. A quarter wave transmission line, with an open connection, transforms the high impedance at the open end into a very low impedance at the connected end, corresponding to the sliding tap connection 203, effectively shorting the drive input to the antenna at that frequency. In some other embodiments of some designs 1, 2 the bottom of the tuning coil 201 is connected directly to the sliding tap connection 203. In this configuration, for frequencies that correspond to the section of the tuning coil between the sliding tap connection 203 and the bottom of the tuning coil 201 having an electrical wavelength of one-half wavelength (or odd multiples thereof), the signal through the transmission line that is the lower half of the tuning coil arrives at the sliding tap connection 180 degrees out of phase, again effectively shorting the drive point at that frequency.

In some embodiments the offending frequencies may be avoided by selecting the connection the lower end of the tuning coil 414 using relay 1306 choose an impedance and connection point. These selections may include the connection 1307 to the bottom (left side in FIG. 4A) of the tuning coil 414 to be either open, or to be attached to the sliding contact 1204 directly or to be connected through an impedance including one or more capacitors or inductors or resistances or combinations thereof. The drive signal to the antenna 1204 connects to the tuning coil 414 at the rolling connection point 430 selected by the position of the pusher arm 409 as positioned by the motor 404. The drive signal propagates along the two helical transmission lines formed by upper and lower sections of the tuning coil 414 from the contactor 430 rolling contacts 601 according where they contact the tuning coil. The energy traveling towards the bottom end of the coil reflects with the magnitude and phase determined by the impedance selected by relay 1306 connected 1307 to the bottom end of the tuning coil 414. The frequency and the length of the coil between the rolling contact 601 and the bottom of the coil, as well as the impedance selected by relay 1306 for terminating the bottom of the tuning coil 414 determines whether the reflected wave is constructive or destructive to the signal being applied via the rolling contact. The addition of a switching network 1310, such as a relay 1306 with selectable impedance 1311, may allow the reflections from the lower end of the coil, or signals driven into the lower end of the coil, to be phased advantageously to obtain good VSWR matches over the full frequency range. It is understood that relay here is to be understood as any element which may be used to select a multiplicity of different terminations, and that the capacitor shown 1311 is just one on many possible impedances and connection points that may be used to alter the phase and magnitude of the reflected waveforms.

Figure 14A:
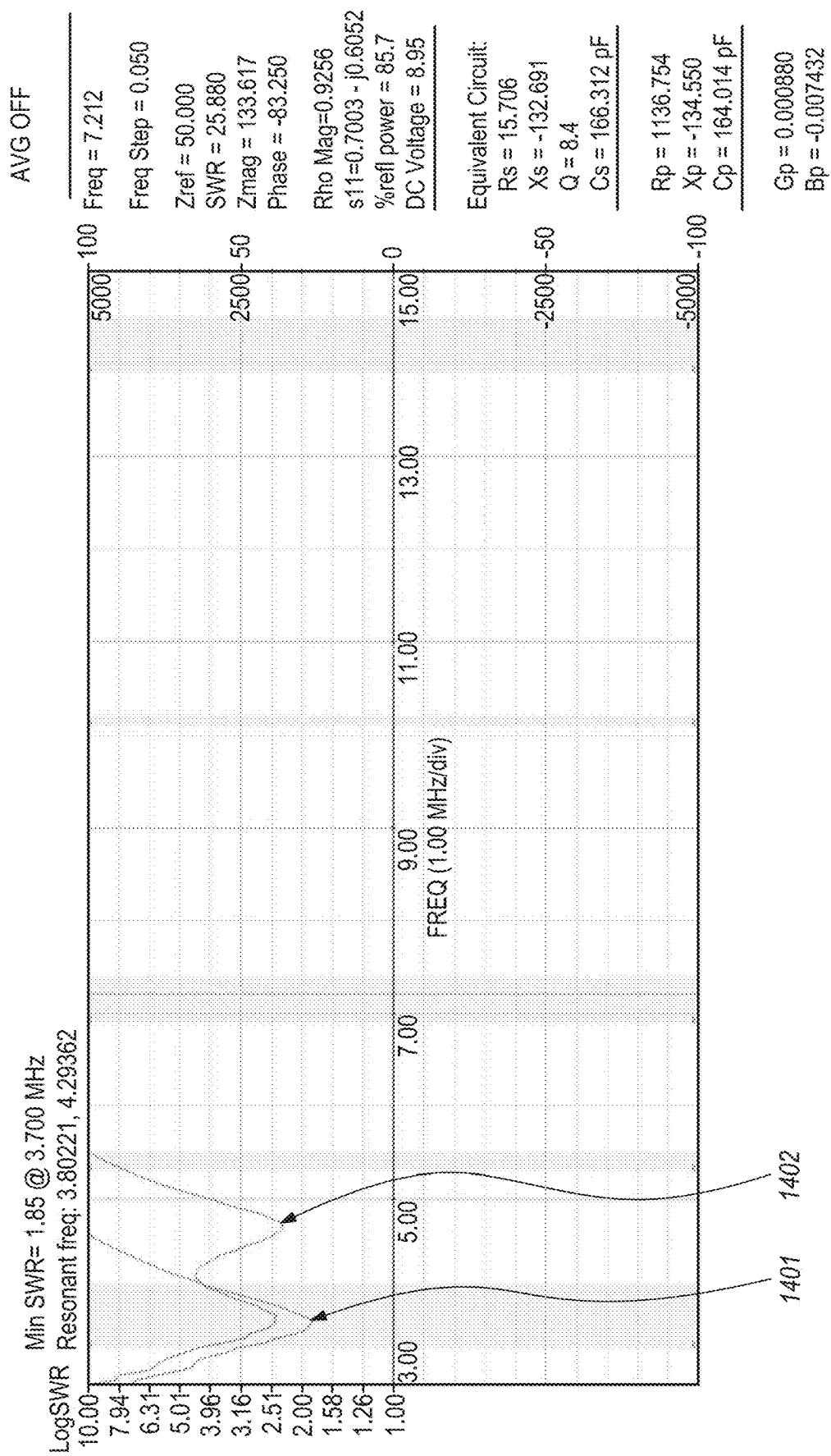
FIG. 14A depicts an example of a chart of a pair of VSWR curves.

FIG. 14A illustrates an example of a chart of a pair of VSWR curves. In this embodiment, two different VSWR curves can be shown with the contactor 430 at the same position in the tuning coil 414. The left curve 1401 has the bottom end of the coil open, while the right curve 1402 with the double bump has the bottom end of the coil shorted to the feed point 1204 and contactor 430. For this frequency and tuning position, a better match is obtained by having the bottom of the tuning coil open.

Figure 14B:
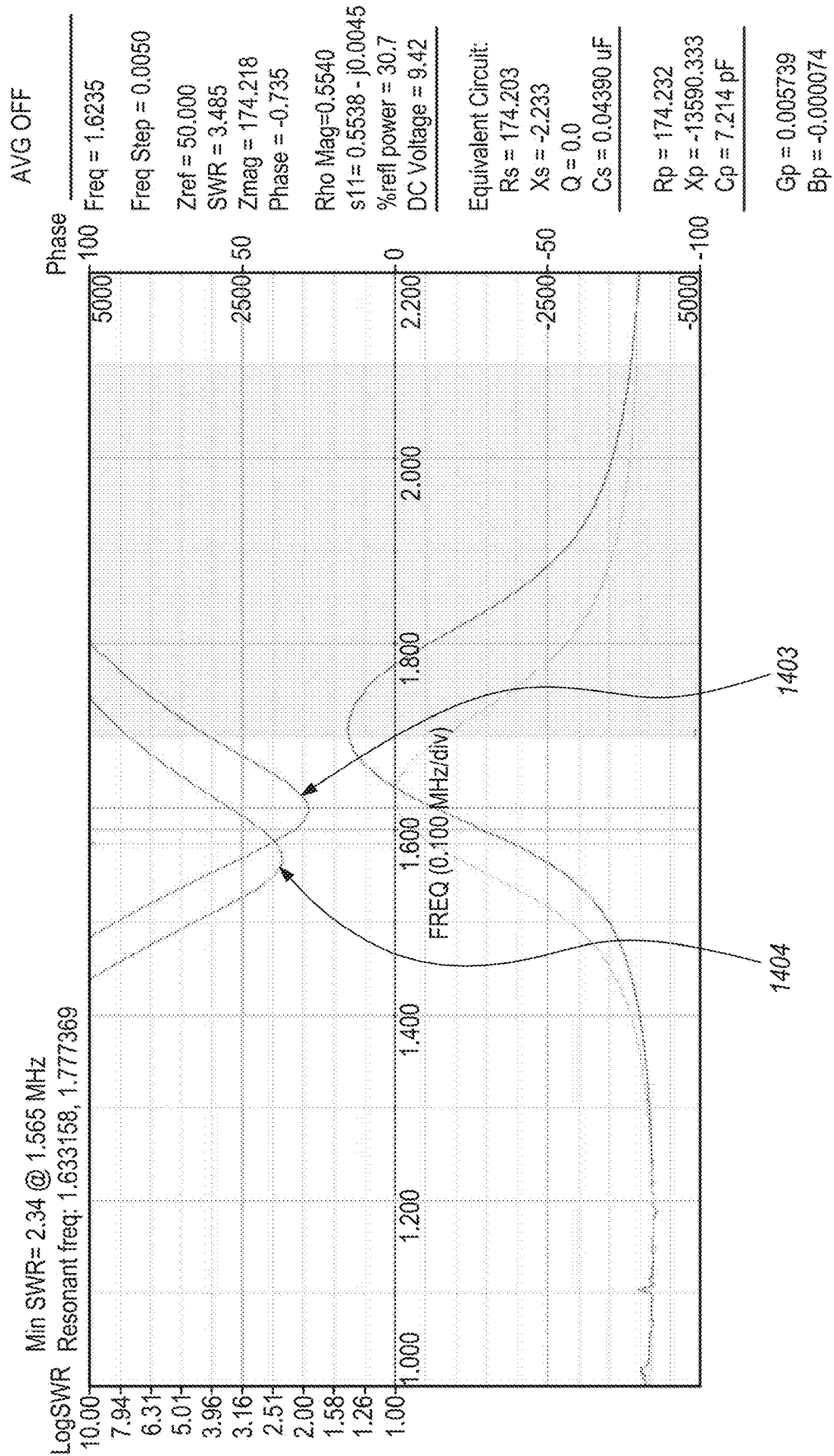
FIG. 14B depicts an example of shifts in VSWR curves.

FIG. 14B illustrates an example of shift in VSWR curves. In this embodiment, two different VSWR curves resonating at different frequencies with the same tuning coil position are shown. In this case the right trace 1403 has the bottom of the tuning coil 1307 shorted to the feed point 1204 and contactor 430 while the left trace 1404 has the bottom of the tuning coil 1307 open. For this frequency and tuning location, the better match was obtained with the bottom of the tuning coil 414 shorted to the feed point 1204 and contactor 430. Some antenna 101, 102 show the unused end of the tuning coil either always open or always shorted, thus the improved tuning match made for all frequencies is not available for these other designs.

Figure 14C:
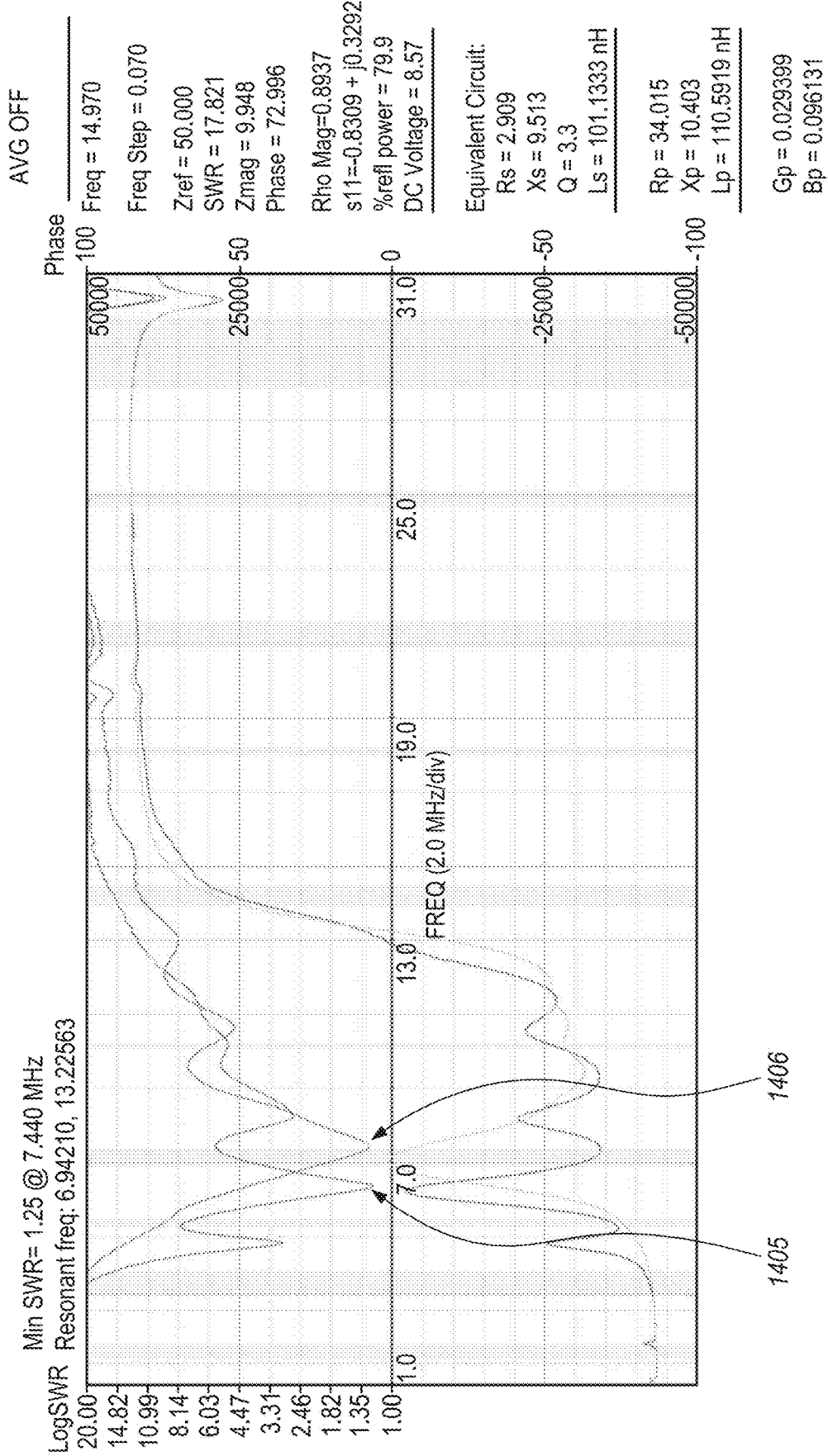
FIG. 14C depicts another example of shifts in VSWR curves.

FIG. 14C illustrates another example of shifts in VSWR curves. In an embodiment, a new frequency range with the same contactor position for both VSWR measurements can be shown. The left curve 1405 has the bottom 1307 of the tuning coil 414 open while the right curve 1406 has this bottom 1307 of the tuning coil 414 connected to the sliding contact 1204. Thus, the selection of open or shorted can significantly change the tuning frequency. The open configuration shows a slightly better matching and has a higher Q for this tuning position.

Figure 14D:
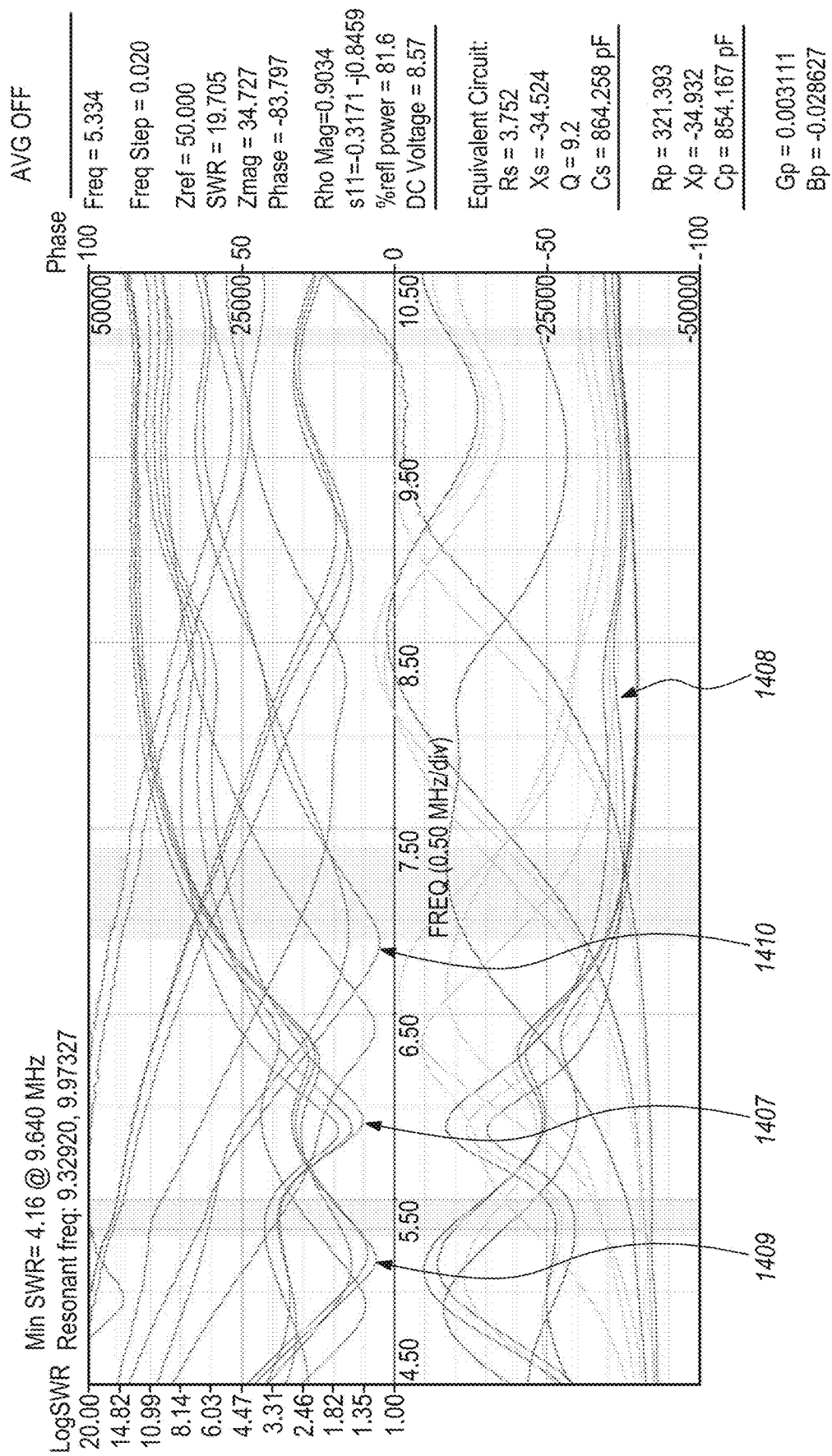
FIG. 14D depicts an example of the overlap of a series of VSWR curves.

FIG. 14D illustrates an example of the overlap of a series of VSWR curves. In another embodiment, the positions of the contactor 420 with in the tuning coil 414, some with the bottom of the tuning coil open, other with it shorted to the contactor via a capacitor 1311, to show that with this extra degree of freedom in the tuning solution a good VSWR can be obtained over a particular range of frequencies which otherwise would have high VSWR frequency regions. Curve 1407 shows a double resonance with the higher of the two having a good match near the arrow, while curve 1409 has the better match for the lower resonance of the double resonances. Curve 1410 has a single resonance with coil bottom open that covers a frequency range not well matched with the coil bottom shorted. The lower portion of the graph 1408 are the phase portion of the impedance from the VSWR sweep.

Figure 15:
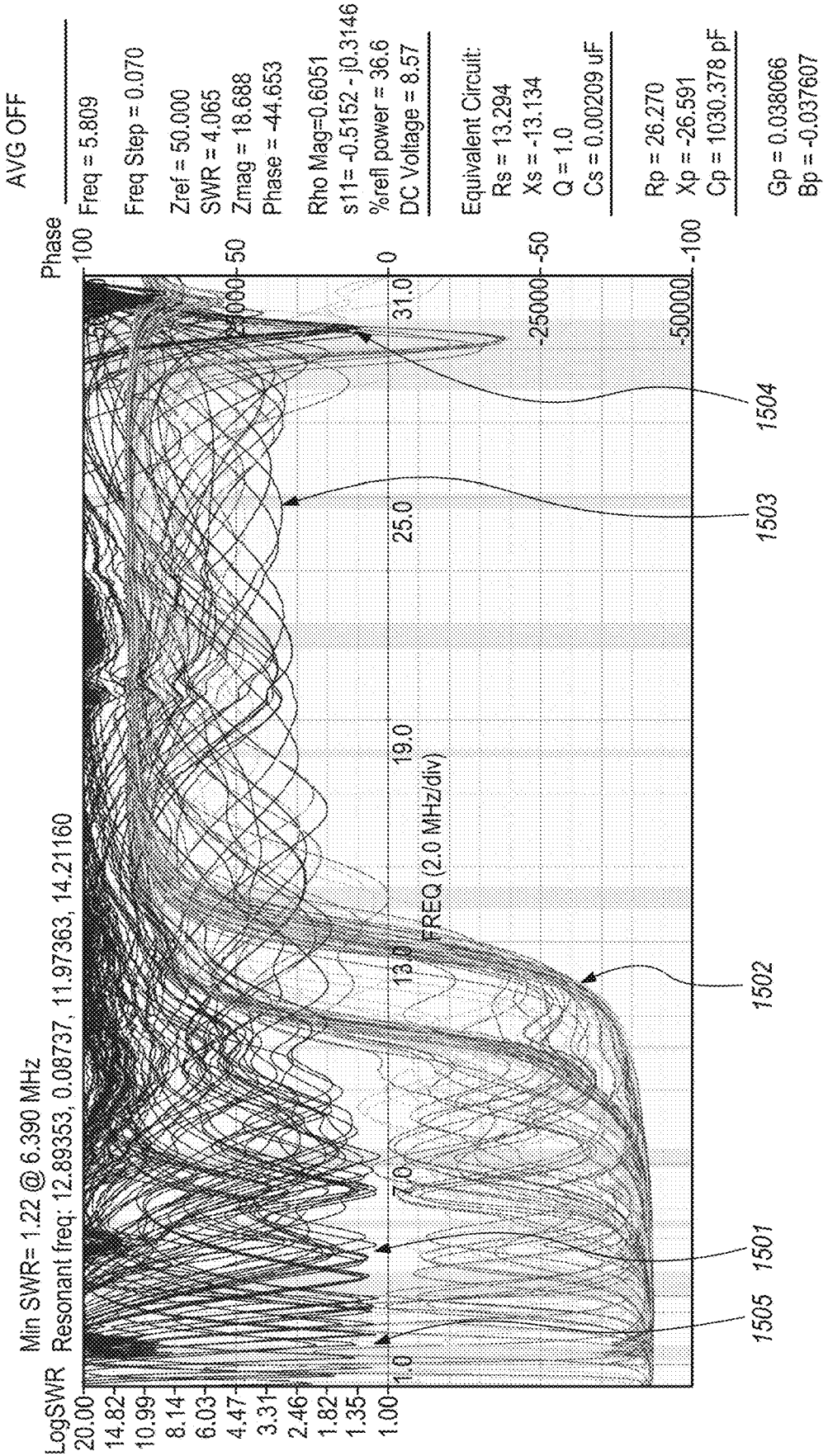
FIG. 15 depicts an example of many overlaid VSWR and phase traces.

FIG. 15 illustrates an example of multiple overlaid VSWR and phase traces. In this embodiment, many overlapping sweeps of the VSWR and phase are shown with the contactor across the range of the tuning coil. The tuning coil has the top loading coil feed from a shorting tap 1602 of FIG. 16 on the tuning coil.

A VSWR curve 1501 shows a good match (low VSWR) at approximately 4.5 MHZ, representing one particular tuning coil 414 contact position, termination selection 1306, and UNUN 433 impedance ratio. The narrow shape of the curve indicates a higher Q for this match.

A VSWR curve 1503 corresponding to approximately 25 MHz is significantly broader indicating tuning towards the top of the coil, but below the shorted turns tap point 1602 for the contact to the shorted section 1603 to 1604 has a reduced Q due to the large section of the tuning coil 414 below the contact point. The match is still about 2.5:1 in this region, using the 4:1 UNUN 433 for these measurements, which is acceptable. The curves correspond to the embodiment shown in FIG. 13A, which does not allow switching the UNUN transformer ratio.

A VSWR curve 1504 around 29 MHz was obtained by moving the contactor above the shorted section 1603 to 1604 of the tuning coil 414. The few turns of coil 414 above the shorted section do not have as many losses so the Q is significantly improved allowing a much better match to the loading coil of the antenna. The phase of the match solution here is also much closer to zero degrees, allowing less reflected energy and thus a very low 1.3:1 VSWR to be obtained. The Q is significantly higher here as may be seen from the sharp tuning (narrow width). The VSWR curve 1505 near 2.5 MHZ, as well as those around this frequency range, have a good Q and a good match, as may be seen by the low VSWR and the narrowness of the match solution for each frequency.

The lower set of phase curves 1502 are the phase responses corresponding to the VSWR curves. The region with the 2.5:1 VSWR matching using a 4:1 balun has a reflected impedance of about one half the feed point impedance. The selectable use of a 2:1 UNUN 433 brings these impedances much closer to the feed point impedance, improving the VSWR, thus showing the desirability of using of the switchable UNUN 1305 of FIG. 13C to improve the VSWR for these frequency ranges. Embodiments with the improved VSWR curves can be implemented with the use of the switchable UNUN 1305 and tuning coil termination 1310 and are shown in FIG. 21A through FIG. 22E, detailed below.

FIG. 16 illustrates an example of an attachment point to the tuning coil. In an embodiment, the tuning coil 414 may have a shorted section 1603-1604. In one embodiment there may be approximately 35 turns of the coil between the top of the tuning coil 414 and the first shorted turn 1603, as were on the unit tested. For the same unit tested, there may be approximately 16 shorted turns 1603-1604 electrically connected to each other by the shorting tap 1601 electrically connected to the tuning coil 414. Both the location of the shorted turns and the number of shorted turns may be selected for the targeted results. The use of multiple shorted turns is used to significantly isolate the magnetic coupling from the upper section of the coil to the lower section of the coil while still allowing the same contactor mechanism 430, 601 to access both the upper and lower portion of the coil. This allows accessing the high Q for the upper section of the coil above 1603 for better matching at higher frequencies. The use of a single tuning coil (no shorted section) for the whole range of frequencies showed a reduced Q at the top end of the coil with a higher VSWR for the higher frequencies. Operating the contactor between the optional shorted section 1603 to 1604 and the top of the tuning coil 414 showed good results with the bottom of the tuning coil 414 open and not connected to the contactor 430 via any impedance.

Either the connection point 1602 or in another embodiment the top end (right in FIG) of the tuning coil 414, is electrically connected to the feed tube flange 447 to carry RF energy to the top loading feed tube 417. The lower end of the tuning coil 414 may have a conductor wired to an appropriate trace on the contactor PCB 802 to bring this electrical signal to the coil bottom relay(s) 445, 1306 preferably via connector 803

In another embodiment, multiple shorting sections 1601 with or without connecting wires 1602 may be implemented on the coil to help isolate the lower section of the tuning coil 414 when using the upper portion of the tuning coil 414.

In another embodiment, the tuning coil 414 can include one or more shorting taps 1601 with or without wire connections 1602. The multiple shorted turns can help isolate the inductance of the tuning coil sections above and below each shorting tap. This technique can be used to isolate portions of the tuning coil not needed to tune a desired frequency range from the remainder of the coil to reduce the losses associated with the unused coil sections. Some of these shorting taps 1601 may be attachment points (taps) to connect wires 1602 to selected portions of the coil, while others may function purely as shorting sections for isolation. The shorting taps 1601 and optional wire 1602 attachment may be facilitated by soldering, for example, using a low temperature solder, or by the use of conductive epoxies, such as silver loaded epoxy, or by ultrasonic bonding to the surface of the coil. In some embodiments, the attachment methods may utilize different shorting and attachment techniques.

In yet another embodiment, an alternative tuning coil 414 may be formed by the use of a flexible printed circuit formed into a tube. The tube is not limited to being circular in shape. This provides a very light tuning coil, but of lower turn density than the edge wound copper coil. As such it would be useful on antennas not going as low in frequency, or which permit larger diameter tuning coils where the reduced turn density is offset by a larger diameter coil. Columns along either the inside diameter or outside diameter of such a printed circuit tube would have the insulation removed and would be plated with a noble metal, such as silver, gold, or a platinum group metal, to provide a variable sliding connection point to such tuning coil.

Another alternate tuning coil 414 with a smooth bore tuning coil may also be formed by laser cutting a fine spiral (helix) from a metal tube. The resulting helix would need to be stabilized with an insulating material as the helix would be weak without such stabilizing. This construction method would currently require a larger volume for the coil as the turn density would be lower than for the wound flat wire, but it could possibly accommodate a higher power level. Fiber laser cutting continues to improve, so this method may eventually yield a similar winding density. The CFA portable antenna 103 does not preclude similar variations in producing compact tuning coils.

In yet another embodiment, the connection point 1602 or the top end of the tuning coil 414, can be electrically connected to the feed tube flange 447 to carry RF energy to the top loading feed tube 417. The friction of the top tuning coil insulator 448 and the lower coil insulator 411 compressing the tuning coil keeps the tuning coil 414 from rotating, while the roller bearings 801 the pusher rod 409 aligned to the exposed conductors 1906 on the inside diameter of the tuning coil 414. The lower end of the tuning coil 414 may have a conductor wired to an appropriate trace on the contactor PCB 802 to bring this electrical signal to the coil bottom relay(s) 445, 1306 preferably via connector 803.

FIG. 17A illustrates an example of a capacitive top hat 1701 configuration. The capacitive top hat 1701 may be attached to the CFA compact antenna structure 103. The addition of the capacitive top hat structure may improve both reception and transmission for low and mid frequencies, however it can make the total antenna larger. This embodiment of the capacitive top hat 1701 can be added or removed in the field. The center of the leaves 1702 have a hole 1705 surrounded by uninsulated conductor 1703 providing a contact to accessory connector nut flange 436 as secured the insulated cap 437.

FIG. 17B illustrates an example of a top view of the capacitive top hat 103. In some embodiments, the capacitive top hat 103 can be configured with three leaves and each of the leaves 1702 can be approximately 2 inches wide by 12 inches long. Each leaf 1702 can have a conductive sheet 1703 to carry the RF current. Some embodiments may include a thin insulating sheet 1704 surrounding all but the contact point to prevent accidental contact with the energized RF circuit.

FIG. 17C illustrates an example of a side view of the CFA portable antenna with the capacitive top hat. This figure includes a side view of the basic wide frequency antenna structure with the capacitive top hat attached. Each leaf may have an exposed contact pad. A conductive screw 438 passes through the leaves 1702 tightening into and making electrical connection to the accessory connector nut flange 436 which extends through polycarbonate radome, attaching to the top end of the top feed tube 417 via a spring contact 439. An insulated cap 437 cover the top of the screw 438 and any exposed contacts on the leaves 1702, allowing easy hand tightening of the screw to make a secure electrical contact with the leaves, while also insulating the screw and leaf contact areas so that the high RF voltages that may be present are not exposed for contact with the operator.

The same accessory connector nut flange 436 and insulated cap 437 may also be used to attach a section of wire to the top of the feed tube 417. The longer wire can improve both reception and transmission, particularly at the lower frequencies. The wide tuning capability of the CFA portable antenna 103 may be used to tune the combination antenna when options are attached to the top of the basic wide frequency antenna.

The tuning network options in this CFA compact antenna 103 with the capacitive top hat 1701 attached was able to tune between approximately 900 kHz and 30 MHz with a VSWR of between 1:1 and approximately 2:1 over the full frequency range. The same CFA compact antenna 103, with a 20-foot-long wire attached to the accessory connector nut flange 436, was able to tune from approximately 560 kHz to 20 MHz with a VSWR between 1:1 and 1:2.5. The 20-foot-long wire significantly improved reception and transmit capabilities, and may be utilized when stationary, for example.

2.3. Voltage Standing Wave Ratio (VSWR)

Figure 18:
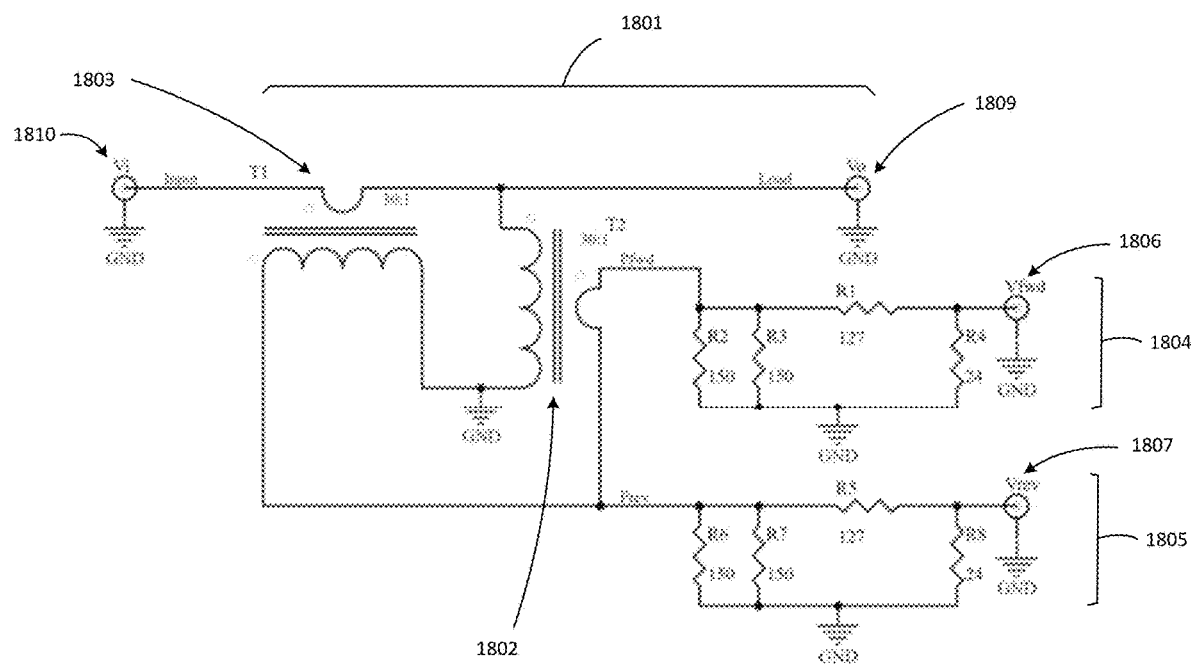
FIG. 18 depicts an example of a schematic diagram of a VSWR.

FIG. 18 illustrates an example of a schematic diagram of a VSWR sensing circuit. In an embodiment, the VSWR sensing circuit can include the input port 1302, the output port 1303, the transformer 1803, another transformer 1802, a power sampling network 1804, a sampling output 1807, and a termination network 1805.

In another embodiment, a VSWR sampling network 1801 or VSWR sensing circuit can monitor the power of the system. Input power is applied to input port 1302, while the load—tuning coil 414—is attached to the output port 1303. The current is sampled by a 30:1 current transformer 1803, while the output voltage is sampled by a 30:1 voltage transformer 1802. The forward power sampling network 1804 terminates the sampling input with 50 ohms while also reducing the voltage at the forward sampling output 1806. In this example, the voltage divider allows the output to be coupled to a logarithmic amplifier such as AD8364 to convert the sensed voltage into a log scale representation to allow the controller board 440 to determine the ratio of reverse power to forward power to calculate an improved matching of the load. A similar termination network 1805 is used to produce the voltage at the reverse sampling output 1807. The two sampling transformers use a high permeability core such as a Laird 28B0375 with a single turn for the step-down side, and 30 turns of 30 AWG for the step-up side to accommodate a power capability of up to approximately 150 W peak for the VSWR sampling circuit when coupled to the AD8364 logarithmic amplifier (not shown). It is understood that the CFA portable antenna 103 can be configured using other topologies, cores, transformer ratios, termination networks, procession elements or a combination thereof.

Figure 18A:
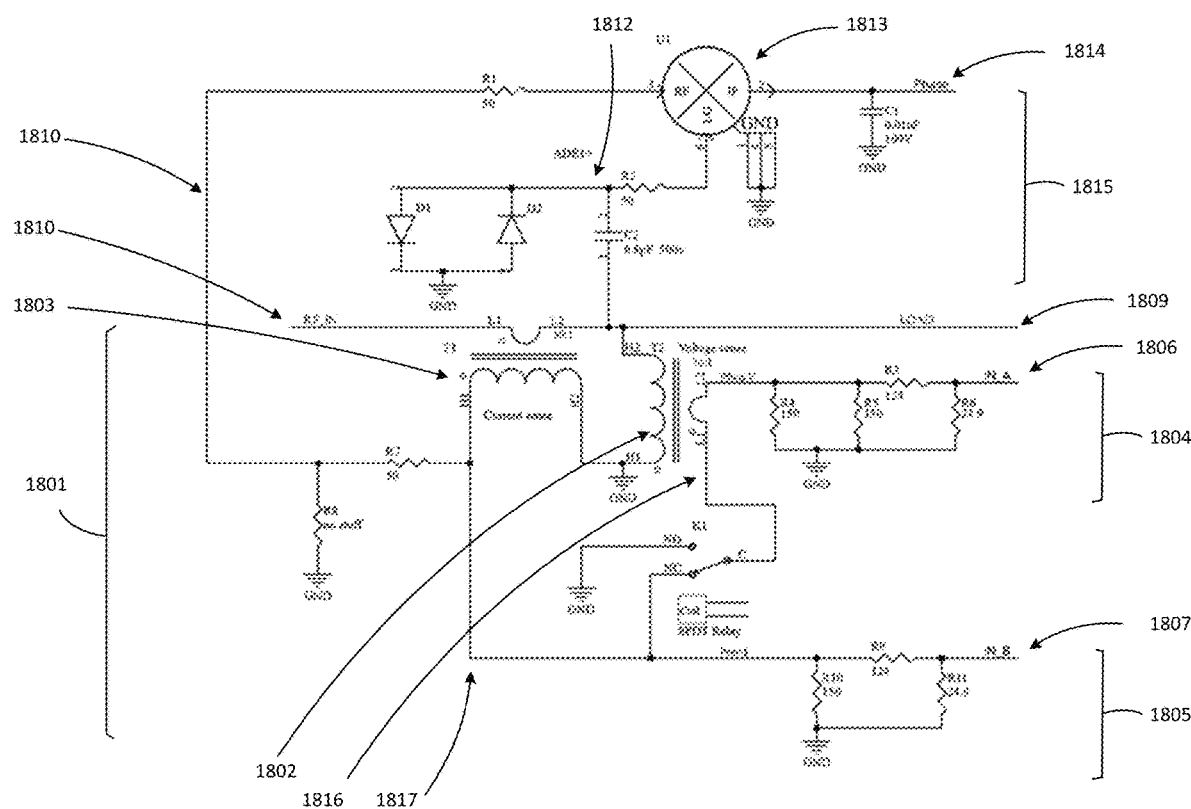
FIG. 18A depicts an example of a schematic diagram of a VSWR/Impedance/Phase sensing circuit.

FIG. 18A illustrates an embodiment of the VSWR sensing circuit 1801. The VSWR sensing circuit 1801 can include the input port 1810, the output port 1809, a voltage sensing transformer 1802, a current sensing transformer 1803, a voltage/forward power sampling network 1804, a current/reversed power sampling network 1805, a voltage/forward power sampling output 1807, a current/reverse power sampling output 1807. Such VSWR bridges, not including relay 1808 are available of multiple designs and are well known in the art.

An embodiment may also incorporate a power sensing or impedance sensing select relay 1808, a phase sensing double balanced mixer 1813, a current sense input to the mixer 1810, and a phase shifted voltage sense input to the mixer 1812. The selection relay 1808 may be used to allow the same voltage sensing transformer 1802 and current sensing transformer 1803 and their respective termination and sampling networks 1804, 1805 normally present in a VSWR sensing network to be separated by energizing K1 1808 so as to utilize the normally open NO contact to ground the bottom of the voltage sensing transformer 1802 output L1 1816, rather than connecting this node to the current sensing transformer 1803 output node H1 1817. Separating these circuits by energizing K1 1808 causes the output 1804 to be a sample the voltage applied to the load 1809 while output 1807 becomes a sample of the current driven into the load 1809. An embodiment has the load output 1809 connected to RF input 1302 to the switchable UNUN circuit 1305. Measuring a VSWR of 3:1, for example would indicate that the impedance mismatch between the source and the load is either 1:2 or 2:1, that is, for a 50 Ohm transmitter impedance, the load measured at output 1809 may be either 25 Ohms or 100 Ohms (or other complex values). Adding K1 1802 allows the controller to directly measure the impedance rather than just the VSWR, which allows the controller to quickly determine an appropriate ratio for the switchable UNUN circuit 1305. The addition of a phase detector circuit 1815 further helps in tuning to determine if the load impedance is inductive or capacitive, which may aid in adjusting the position where the plated ball 601 contacts the tuning coil 414. Although tuners exist in prior art that allow measuring VSWR, impedance, and phase, such circuits taught utilize dedicated circuits rather than sharing functionality. Sharing the circuits helps contribute to the compact format of the CFA compact antenna, both by eliminating additional transformers and sampling networks, and also by eliminating the need for additional logarithmic amplifiers to accurately convert sampled signals into DC voltages needed by the A/D converter withing the DSP 453 on the controller board 440. This combination of functions may save volume, weight, and power utilization.

The majority of the VSWR sensing circuitry may be physically located on the VSWR switching board 441 with some processing elements, including log amplifiers and phase gain amplifiers 456, being located on the controller board 440. The various portions may of this circuitry may also be located elsewhere inside the enclosure, or for some embodiments, external to the enclosure, as space provides or to allow connections to an external counterpoise when the base of the antenna may be energized in some embodiments. The VSWR sensing circuitry 1801 includes a 30:1 current sense transformer 1803 and a 30:1 voltage sense transformer 1802. Relay K1 1808 is shown in the NC position, which connects the bottom of the voltage sense transformer 1802 output L2 to the current sense transformer 1803 output H1 with various termination impedances 1804, 1805 selected such that when the impedance at the Load 1809 terminal matches 50 Ohms, the current flowing from the bottom of the voltage sense transformer 1802 terminal L1 will be equal and of opposite phase to the current measured by the current sense transformer 1803 output H1 resulting in a (nearly) zero signal when coupled to the current/reverse power termination network 1805 resulting in the voltage at IN_B sense point 1807 representing the reverse power. The output from the voltage sense transformer 1802 top output L2 is similarly processed by a voltage/forward power sampling network 1804, adding to the voltage present at the output of the current sense transformer 1803 at node H1, the sum of the voltages divided down and to be sensed at IN_A 1806 representing the forward power. In the case of both a voltage/forward power sampling output 1807, a current/reverse power sampling output 1807, the output levels have been scaled by a voltage diver to allow the output to be readily coupled to a logarithmic amplifier, such as AD8364, which may be present on the controller board 440 to convert the sensed voltage into a log scale representation to allow the controller board 440 to determine the ratio of reverse power to forward power to determine the VSWR.

To examine the operation of the VSWR circuit, if a short applied to output 1809 will result in a maximum output at the reflected power output 1807 and an equal output at the forward power sense output 1806 as the output of the voltage sense transformer 1802 will have zero volts. This will indicate that the reverse power is equal to the forward power, representing infinite VSWR. Alternatively, an open at the Load connection 1809 will cause a high voltage at the voltage sense transformer 1802 output, and essentially zero current from the current sense transformer 1803, again resulting in the forward power output 1806 and the reverse power output 1807 having essentially the same voltages, again indicating that the forward and reflected powers are equal and the VSWR is very high.

The two sampling transformers 1802. 1803 may use a high permeability core such as a Laird 28B0375 with a single turn for one side, and 30 turns of 30 AWG for the other side to accommodate an RF power capability of up to approximately 150 W for the VSWR sampling circuit. Note that the power level scaling may be relatively changed, and 150 W is not a limitation. The circuits shown also provide good measurement down to approximately 100 milliwatts.

Although the VSWR may be measured in such a manner, the VSWR reading does not indicate whether the impedance is too high or too low, and it does not indicate the phase. To measure the impedance, relay K1 1808 is energized. This connects the lower end of the voltage sense transformer 1802 output L1 1816 to ground and isolates the voltage sense circuits from the current sense circuit. The result is the voltage sense network 1804 with output IN_A 1806 now measures the voltage across the load, while the current sense circuit 1807 with output IN_B 1807 now measures the current through the load. The ratio of these two outputs corresponds to a normalized impedance. The phase is measured by feeding a double balanced mixer 1813 with a sample of the input current 1810 fed to the RF input while the input voltage is sampled by a low value capacitor and clipped by back to back switching diodes to produce a nearly 90 degree phase shifted and clipped version of the input voltage 1812, which stays at nearly constant amplitude drive the LO input to the double balanced mixer, even as the input voltage varies over a considerable power range. The output of the double balanced mixer 1814 is low pass filtered to get a difference signal that is close to zero volts when the input current and voltage are in phase. Note that the current sense input is fed to the RF port of the mixer while the 90-degree shifted and clipped voltage input is fed to the LO port of the mixer, 90-degree phase shifting of the LO input voltage 1812), causes the double balanced mixer to produce the nearly zero-volt output when the actual load voltage and current are in phase. When the current leads or lags the voltage, the phase difference between the RF and LO port is no longer 90 degrees, and the filtered output of the mixer will produce a positive or negative output. The output of the mixer is offset and amplified on the controller board and processed to yield a phase angle. The output of the phase detector does vary in amplitude with the current signal 1810 fed into the RF input of the mixer 1813, but this signal is also measured when relay 1802 is in the impedance measuring configuration, allowing the processor to compensate. It is understood that the CFA portable antenna 103 can be configured using other topologies, cores, transformer ratios, termination networks, procession elements or a combination thereof, and may or may not incorporate optional elements.

Figure 19A:
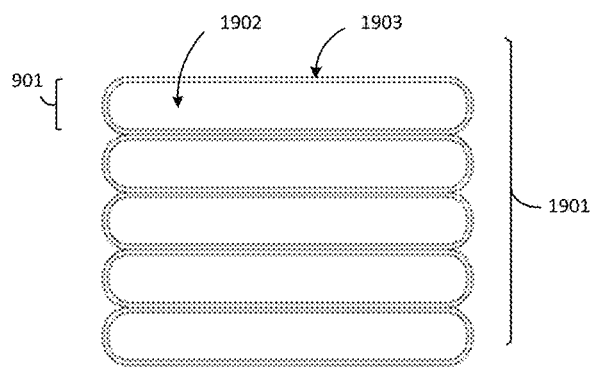
FIG. 19A depicts an example of a cross section of a tuning coil with insulation.

FIG. 19A illustrates an example of a cross-section of a tuning coil with insulation. In one embodiment, the close-up view 1901 of a section shows the tuning coil 414 with the flat wire conductor 1902 and the insulation 1903 before the insulation has been removed.

Figure 19B:
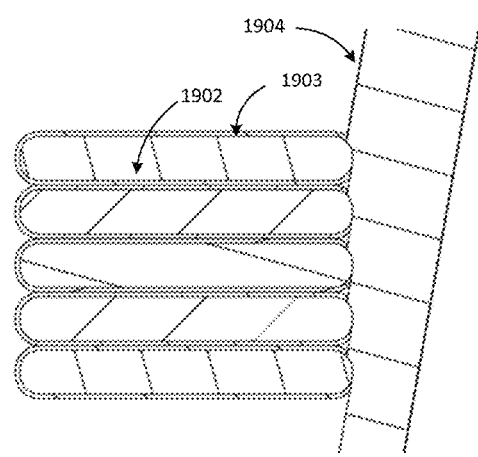
FIG. 19B depicts an example of a close-up cross-section view of the tuning coil.

FIG. 19B illustrates an example of a close-up of the tuning coil 414. A laser light 1904 can be used to remove the insulation from tuning coil 414.

The insulation 1903 that covers the rectangular wire 1902 used in the tuning coil 414 can be removed from the coil in a variety of ways. One technique is the use of a laser producing the laser light 1904, such as a carbon dioxide ($CO_2$) laser to ablate the insulation from the specific areas where contact will be made to the coil. The laser light may be applied perpendicular to the coil surface if insulation is not desired between the turns, such as where turns are intentionally being shorted with or without a wire attachment.

In some embodiment, when the individual turns of the tuning coil 414 are to remain insulated from each other but need electrical contact to a rolling contact, such as a ball 601 of FIG. 6, of a rolling contact 430 on the coil contactor plate 412, the laser light 1904 may be directed at the coil surface at an angle to the surface. In this figure the laser light 1904 is coming from the top right.

However, the laser light 1904 may be directed at an angle to the surface of the coil. The narrow edges of the flat wire conductor 1902 may be radiused when manufactured, to avoid sharp corners which would make uniform insulation application more difficult. Sharp corners would be desirable to avoid as they also may make it easy to nick the insulation at the corners when forming. The laser light 1904 may be used to ablate the insulation 1903 but the light is blocked and not absorbed by the metal of the flat wire conductor 1902. Inclining the laser light allows the metal of the adjacent flat wire conductor 1902 forming the adjacent turn of the coil to block the light from reaching some of the insulation between windings. This blockage of the laser light 1904 determines the location of the insulation 1903 that remains.

Figure 19C:
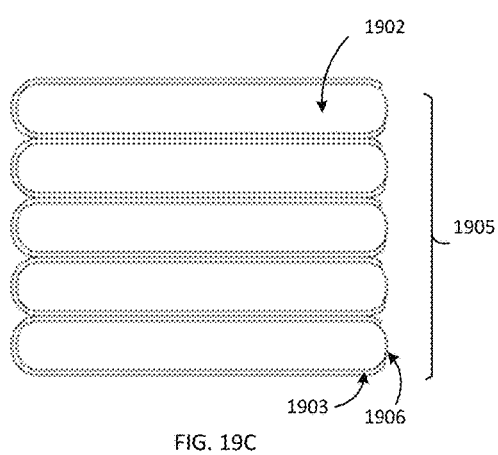
FIG. 19C depicts an example of the tuning coil with the insulation selectively removed.

FIG. 19C illustrates the tuning coil with the insulation selectively removed. In an embodiment, the close-up section 1905 of the tuning coil 414 may show the insulation removed. In an embodiment the flat conductor 1902 may be exposed at the required contact region 1906, while leaving insulation in place between the coils and for a portion of the radius. This retained insulation is desirable to increase the voltage allowed between windings before arcing occurs. The laser light 1904 may be more readily absorbed by the insulation, causing the insulation to be ablated, while the light may be mostly reflected by the metal of the flat wire, and thus the light does not affect either the optional plating on the wire nor the bulk conductor material. This insulation stripping method would not require a plating step after removal of insulation if the wire was previously plated or composed of a noble metal. An unplated non-noble wire may optionally be plated following the laser ablation process.

Figure 19D:
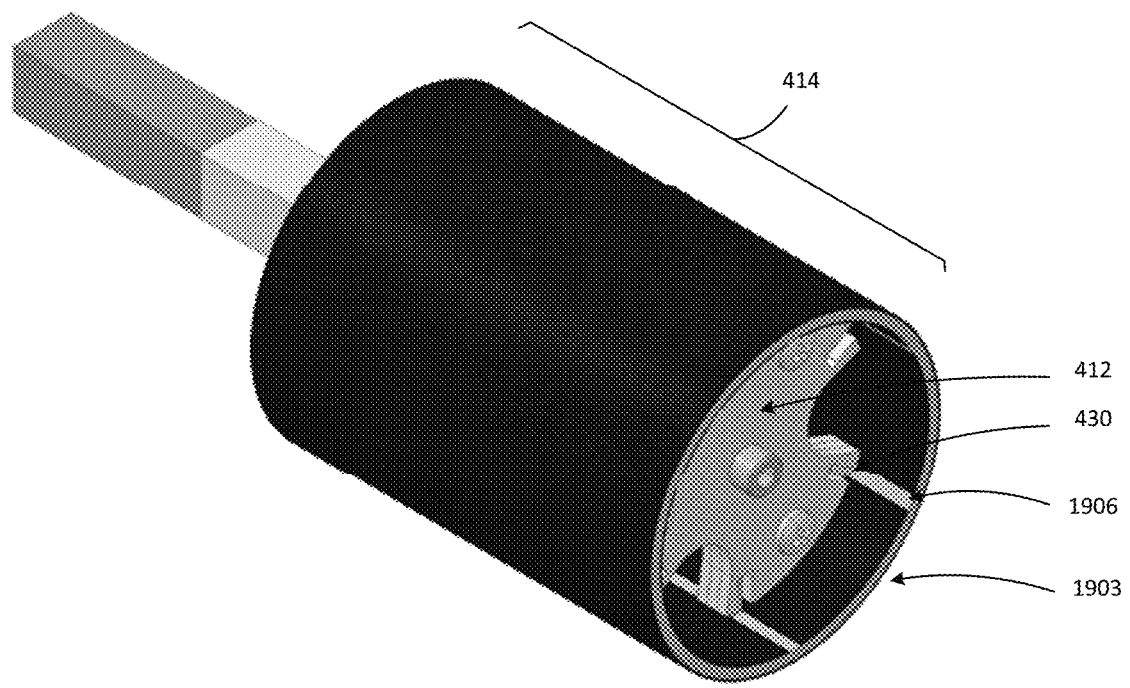
FIG. 19D depicts an example of the tuning coil with and contactor assembly the insulation selectively removed from the inside diameter of the tuning coil.

FIG. 19D illustrates an embodiment of a tuning coil 414. The tuning coil 414 shows selected portions of the inner insulation 1903 removed exposing the inner conductor 1906.

The removal of insulation on the inside diameter of the tuning coil 414 is shown on six equally spaced stripes parallel to the center axis of the tuning coil 414 and approximately 0.1 to 0.25 inches wide. These stripes of exposed conductor correspond to the locations of the rolling contacts 430 on the contactor plate 412, such that the rolling contact balls 601 contact exposed conductors of the tuning coil 414. It is understood that six strips shown correspond to the six rolling contacts 430 shown on coil contactor plate 412, and that other numbers of strips and contactors may be readily implemented without affecting the concept of the CFA compact antenna. Other embodiments may allow the removal of additional insulation on the interior of the tuning coil 414 up to and including the entire inside surface, leaving the insulation between turns of the coil. The stripes are preferred when selectively removing the insulation to minimize the processing time.

In another embodiment, a laser beam may be synchronized to the winding mechanism so as to remove the insulation from one edge of the wire at a spacing interval such that the sections with the exposed conductor 1906 will line up to form the desired strips when the coil is formed. Such a laser may be positioned such that only the exposed edge of the insulation 1903 is ablated, leaving the insulation that will be between the coils intact. In another embodiment, the entire inside edge of the flat conductor may have its insulation removed prior to winding, leaving the insulation that will be between the windings. This may be done by laser, by mechanical removal of the coating, before it is cured or after it has cured, or even by avoiding coating the very edge of the wire when it is manufactured. It is understood that other methods may be used to selectively or completely remove the insulation along what will be formed to be the inside of the tuning coil 414 when it is wound, such alternate methods are not limitations to the CFA compact antenna concept.

In another alternate embodiment, the tuning coil 414 insulation 1903 may be selectively removed by the use of abrasion, such as a honing tool on the ID of the coil. This removes the insulation of the coil as well as a small amount of the metal. The coil may be optionally silver plated subsequent to the removal of the insulation to improve the contact to the coil. As the coil weight maybe about 3 oz for the extended frequency range design allowing operation below 1 MHz coil and about 1.5 oz for operation down to 1.6 MHz. The added raw material cost of using solid silver flat wire 1902 may be less than the added cost of plating the wire before insulation or the cost of plating the completed coil after insulation has been removed.

Another alternate method of removing the insulation involves machining or abrading the ID of the coil along each contact strip. This removes the insulation along internal contact points for the contactor balls 203. In some embodiments, the techniques of removing insulation from the flat conductor can include several different methods for insulation removal.

Although plating can be used for deposition of a noble metal onto a base metal, it is understood that a variety of techniques can be used. For example, the noble metal can be deposited on the base metal using spraying, sputtering, vapor deposition, chemical deposition, or other deposition techniques.

Figure 20:
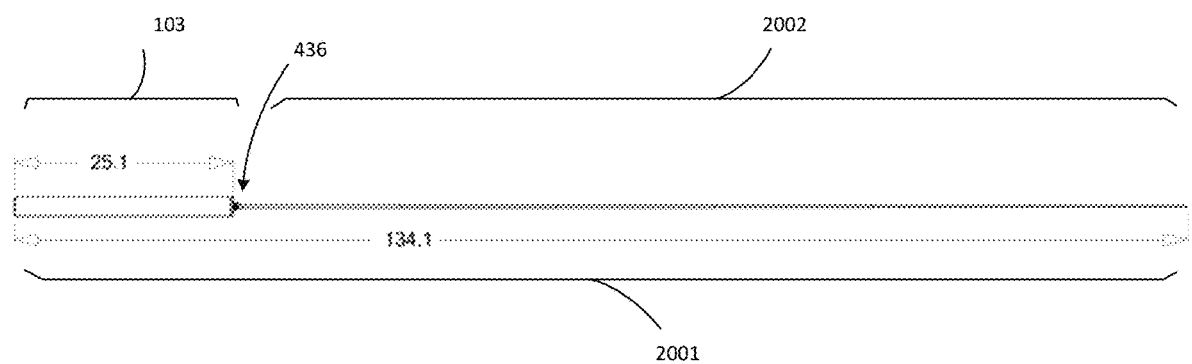
FIG. 20 depicts an example of the CFA portable antenna with a whip antenna.

FIG. 20 illustrates a whip antenna 2002 in an embodiment. The whip antenna 2002 can be mounted to the accessory antenna nut flange 436 at the top end (shown to the right side of the drawing) of the CFA compact antenna 103. The larger radiating element can improve the performance of a composite antenna 2001 at mid and lower frequencies while also lowering the minimum and maximum frequencies available using the CFA compact antenna. In some circumstances, the whip portion can also be used while the antenna is being used in a mobile mode.

In an embodiment, measurements taken showed a lower usable frequency of approximately 770 kHz and a maximum usable frequency of approximately 24 MHz with a 2.2 maximum VSWR, and up to 26 MHz with a maximum VSWR of 3. The antenna can be tunable over this entire range.

The whip antenna 2002 can have different configurations. In some embodiments, the whip antenna 2002 is of a type often characterized as "fishing pole" construction, that may be folded down to approximately 18 inches long to facilitate transport. This format of antenna may be also partially extended with the balance tied down if the full 10-foot length is not desired. It is understood that other lengths may easily be utilized. In another embodiment, the antenna whip 2002 may utilize a flexible "tape" style antenna that can be made to various lengths, and which may easily bend and which then returns to its original shape when released. The wide format has a higher capacitance than a whip, which may be advantageous in that similar performance may be available with a shorter length.

Another embodiment of the CFA Portable antenna, for installations that may prefer use of a whip or tape antenna more regularly, may either eliminate the top loading structure 416, 417, 446, 427 or make this top loading section detachable, so that a whip, tape antenna, wire, etc. may be electrically attached to the antenna feed point on the tuning coil that would normally feed to the top loading structure. The radome 418 may be shortened and the accessory antenna nut flange 436 may be electrically connected to the antenna feed point of the tuning coil 1602. This embodiment may allow a lighter and smaller configuration.

Figure 21A:
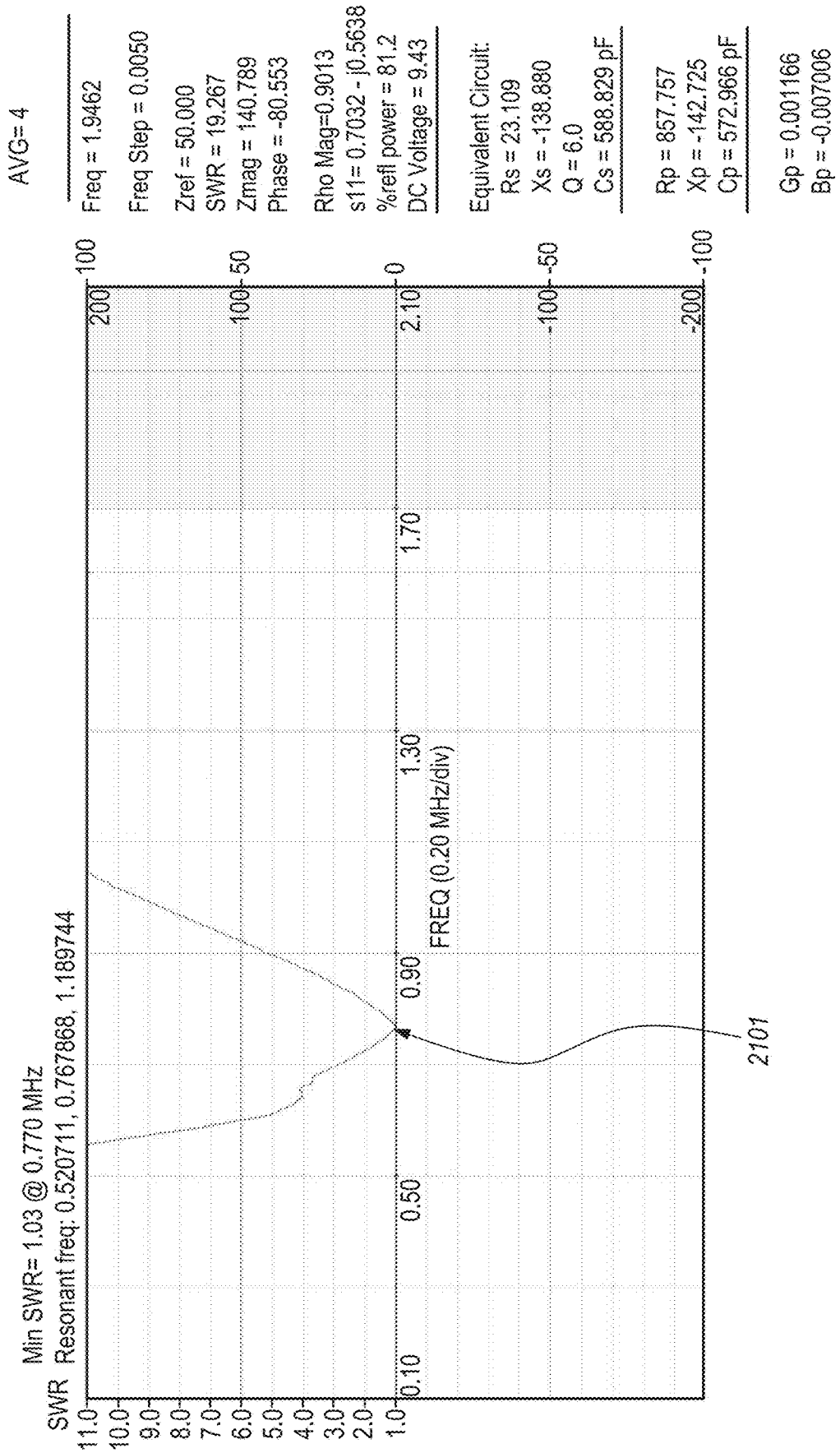
FIG. 21A depicts VSWR measurements of the CFA portable antenna with a whip antenna over certain frequencies for one tuning point.

FIG. 21A illustrates VSWR scans 2101 showing of embodiments of the CFA Compact Antenna. The CFA compact antenna can include a 10' whip 2001. Signal performance was significantly improved, both transmitting and receiving. The resonance frequency 2101 shows a measured VSWR of 1.03 at a frequency of 770 kHz.

Figure 21B:
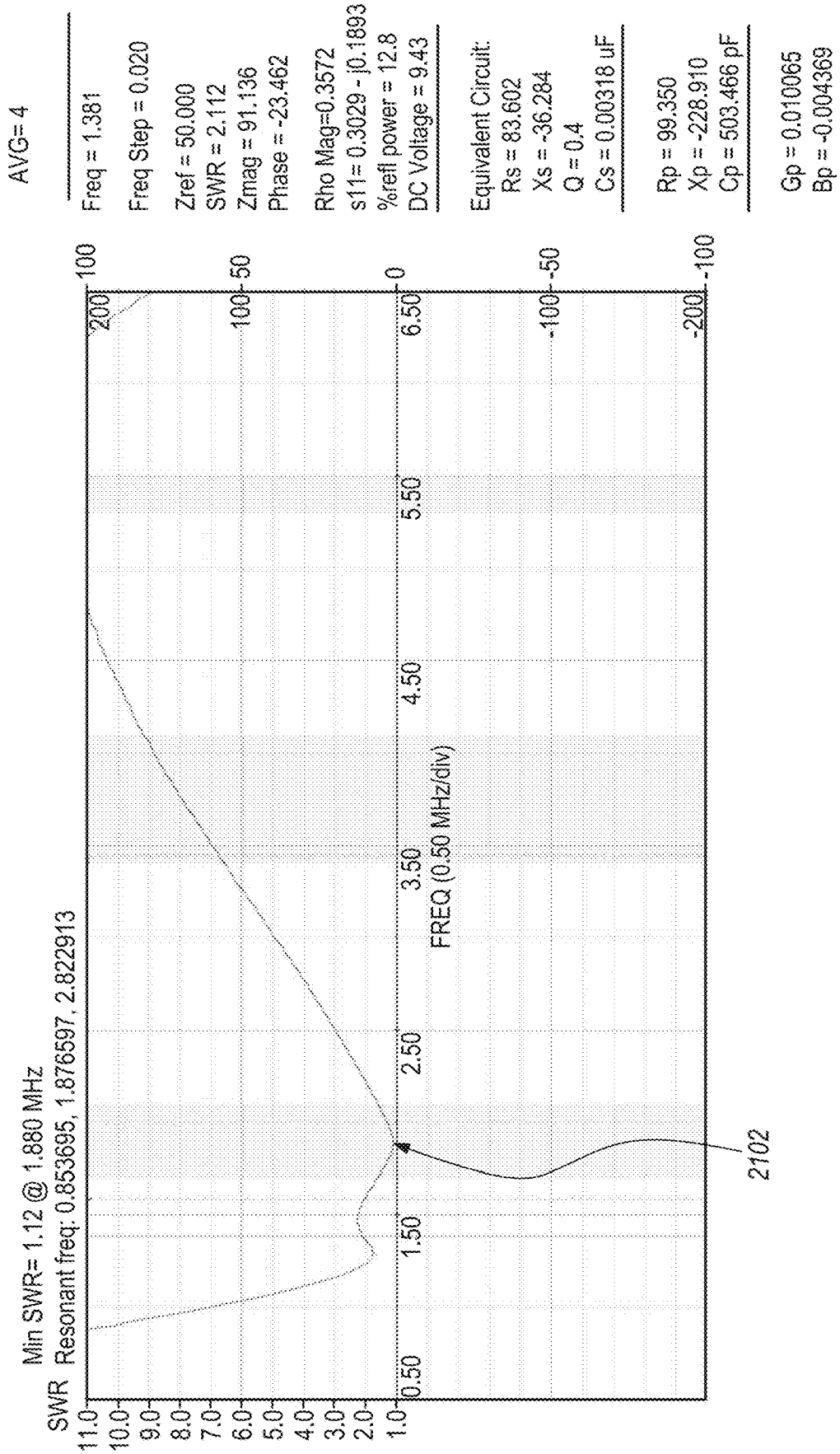
FIG. 21B depicts VSWR measurements of the CFA portable antenna with a whip antenna over certain frequencies for one tuning point.

FIG. 21B illustrates VSWR scans of embodiments of the CFA Compact Antenna. The CFA compact antenna can include a 10' whip 2001. The measurement at resonance 2102 shows a VSWR of 1.12 at 1.88 MHz with the VSWR remaining below 1.6 over the full 1.8 MHz to 2 MHz band without readjustment.

Figure 21C:
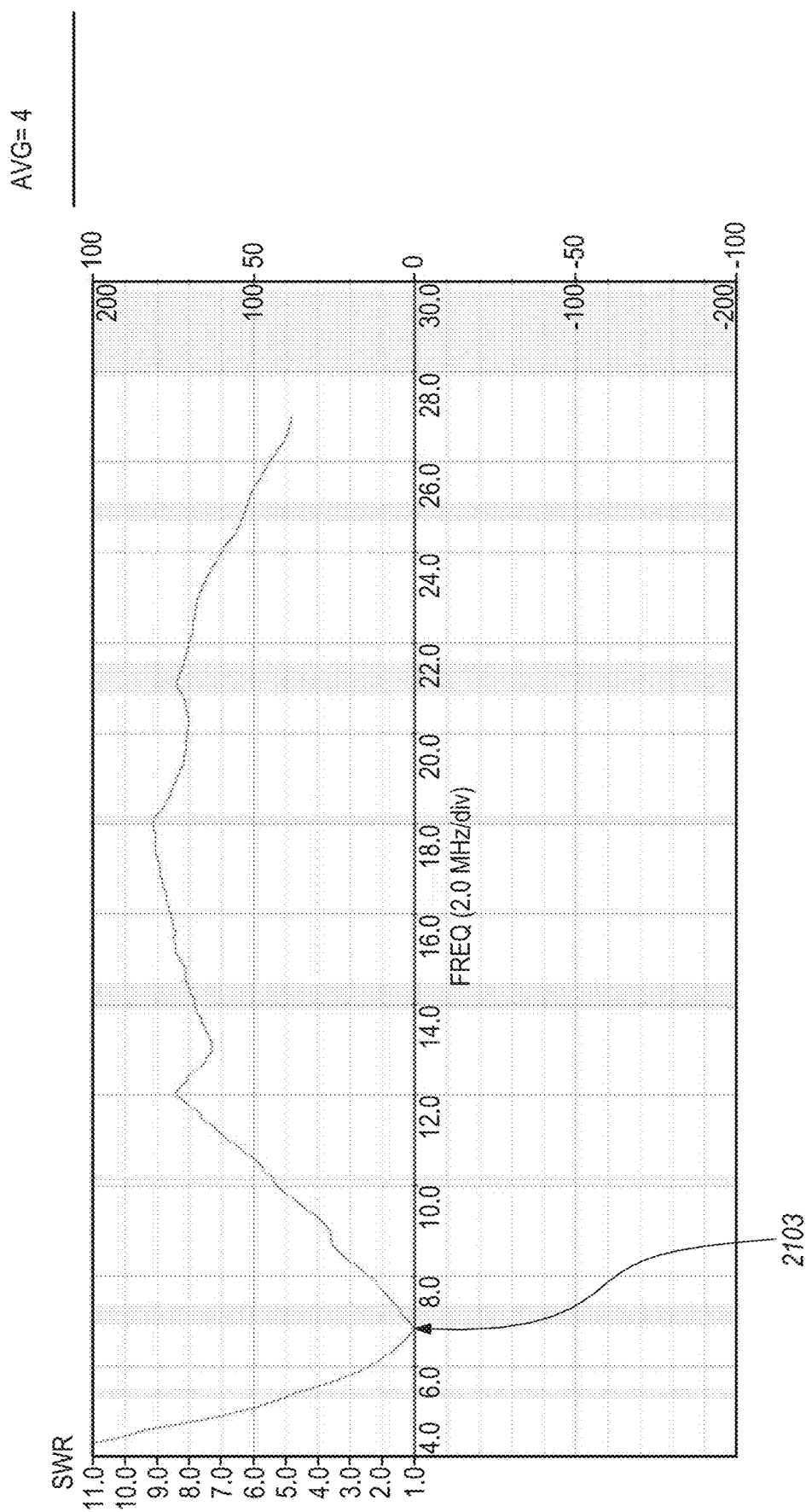
FIG. 21C depicts VSWR measurements of the CFA portable antenna with a whip antenna over certain frequencies for one tuning point.

FIG. 21C illustrates VSWR scans of embodiments of the CFA Compact Antenna. The CFA compact antenna can include a 10' whip 2001. The measurement at resonance 2103 shows a VSWR of 1.05 at 6.95 MHz with the VSWR remaining below 2 over 6.2 MHz to 7.5 MHz (without readjustment). The VSWR is improved if the tuning point is adjusted.

Figure 21D:
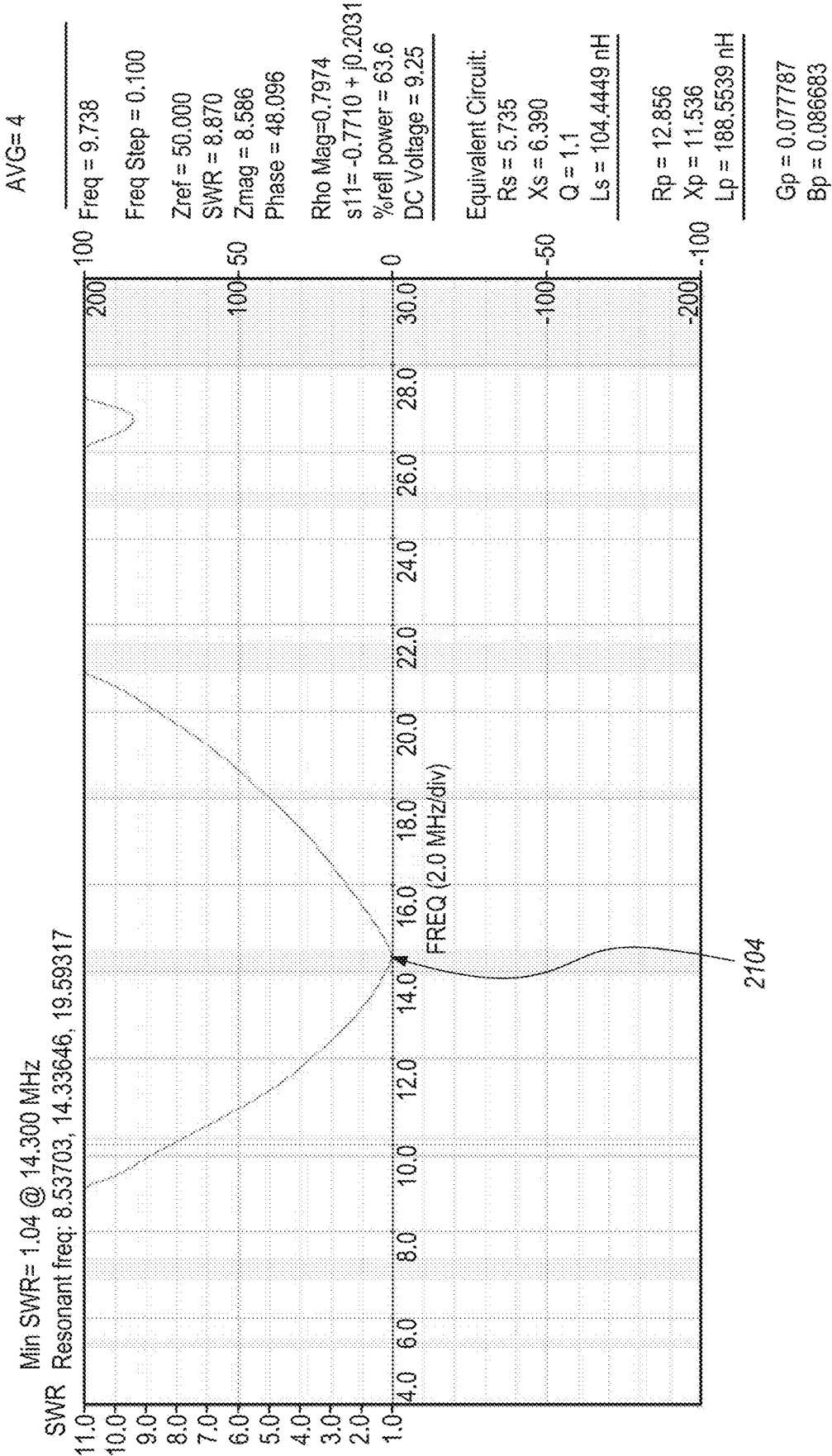
FIG. 21D depicts VSWR measurements of the CFA portable antenna with a whip antenna over certain frequencies for one tuning point.

FIG. 21D illustrates VSWR scans of embodiments of the CFA Compact Antenna. The CFA compact antenna can include with a 10' whip 2001. The measurement at resonance 2103 shows a VSWR of 1.03 at 14.3 MHz with the VSWR remaining below 2 over 13.2 MHz to 15.2 MHz (without readjustment). The VSWR is improved if the tuning point is adjusted.

Figure 22A:
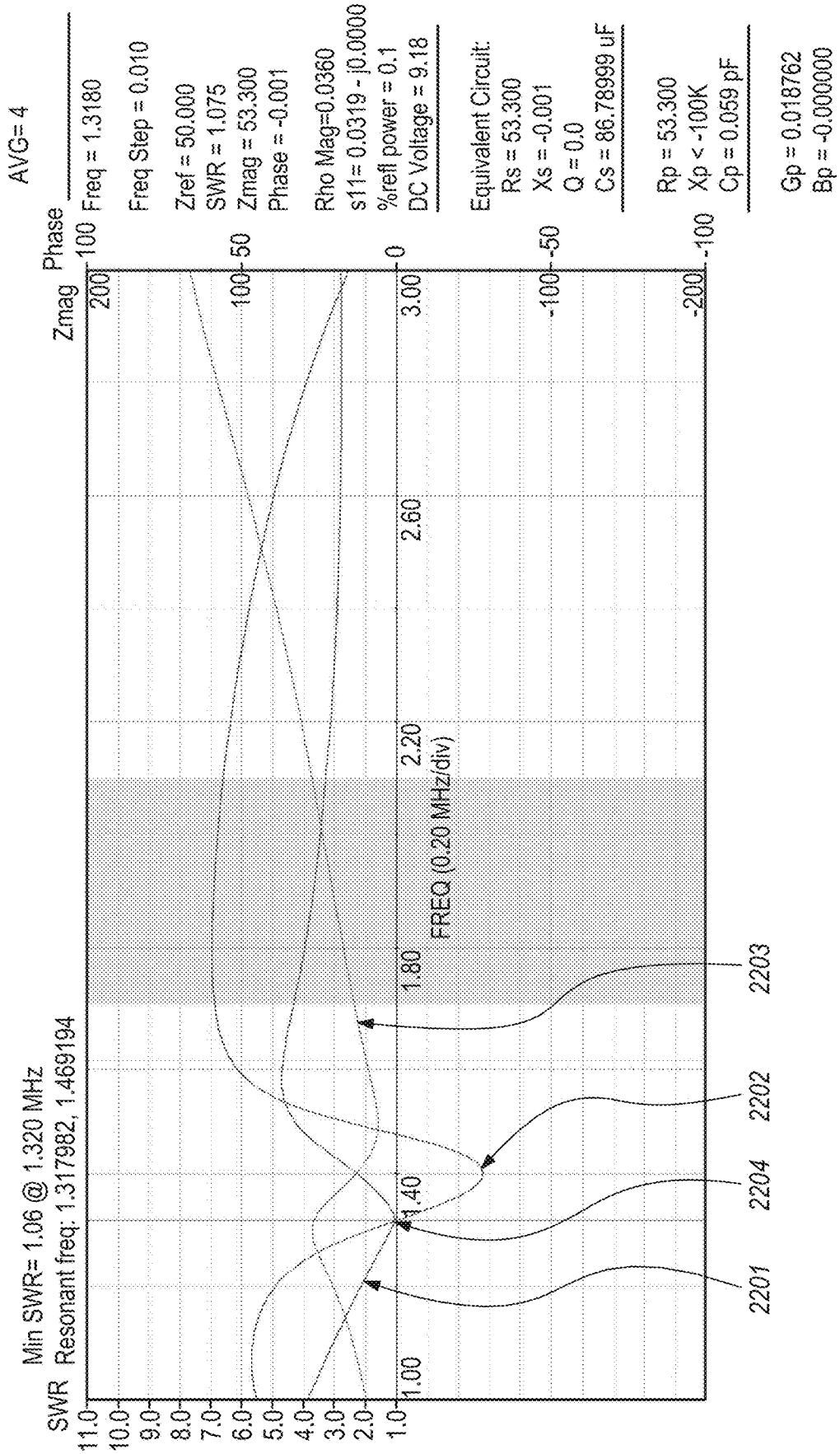
FIG. 22A depicts VSWR, phase, and impedance measurements of the CFA portable antenna over certain frequencies for one tuning point.

FIG. 22A illustrates VSWR scans of embodiments of the CFA Compact Antenna 103. The CFA compact antenna configured with no accessory added. The chart shows VSWR 2201, phase 2202 and impedance 2203 across 1 MHz to 3 MHz. At the resonance point 2204 of 1.32 MHz, the VSWR 2201 measured at 1.06, the phase 2202 measured near zero degrees, and the impedance 2203 measured 53.3 Ohms.

Figure 22B:
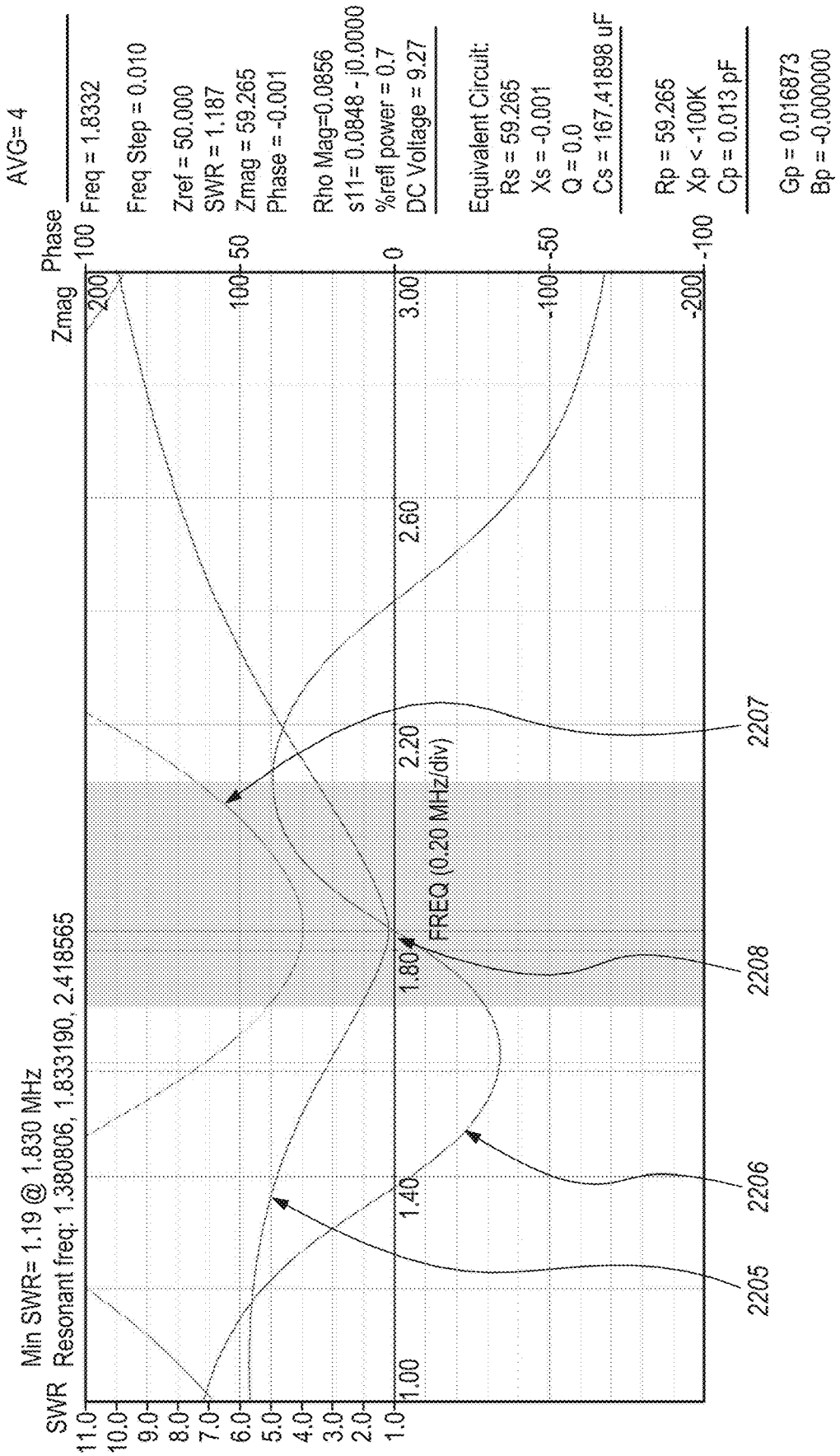
FIG. 22B depicts VSWR, phase, and impedance measurements of the CFA portable antenna over certain frequencies for a different tuning point.

FIG. 22B illustrates VSWR scans of embodiments of the CFA Compact Antenna 103. The CFA compact antenna configured with no accessory added. The chart shows VSWR 2205, phase 2206 and impedance 2207 across 1 MHz to 3 MHz. At the resonance point 2208 of 1.83 MHz, the VSWR 2205 measured at 1.19, the phase 2206 measured near zero degrees, and the impedance 2207 measured 59.3 Ohms.

Figure 22C:
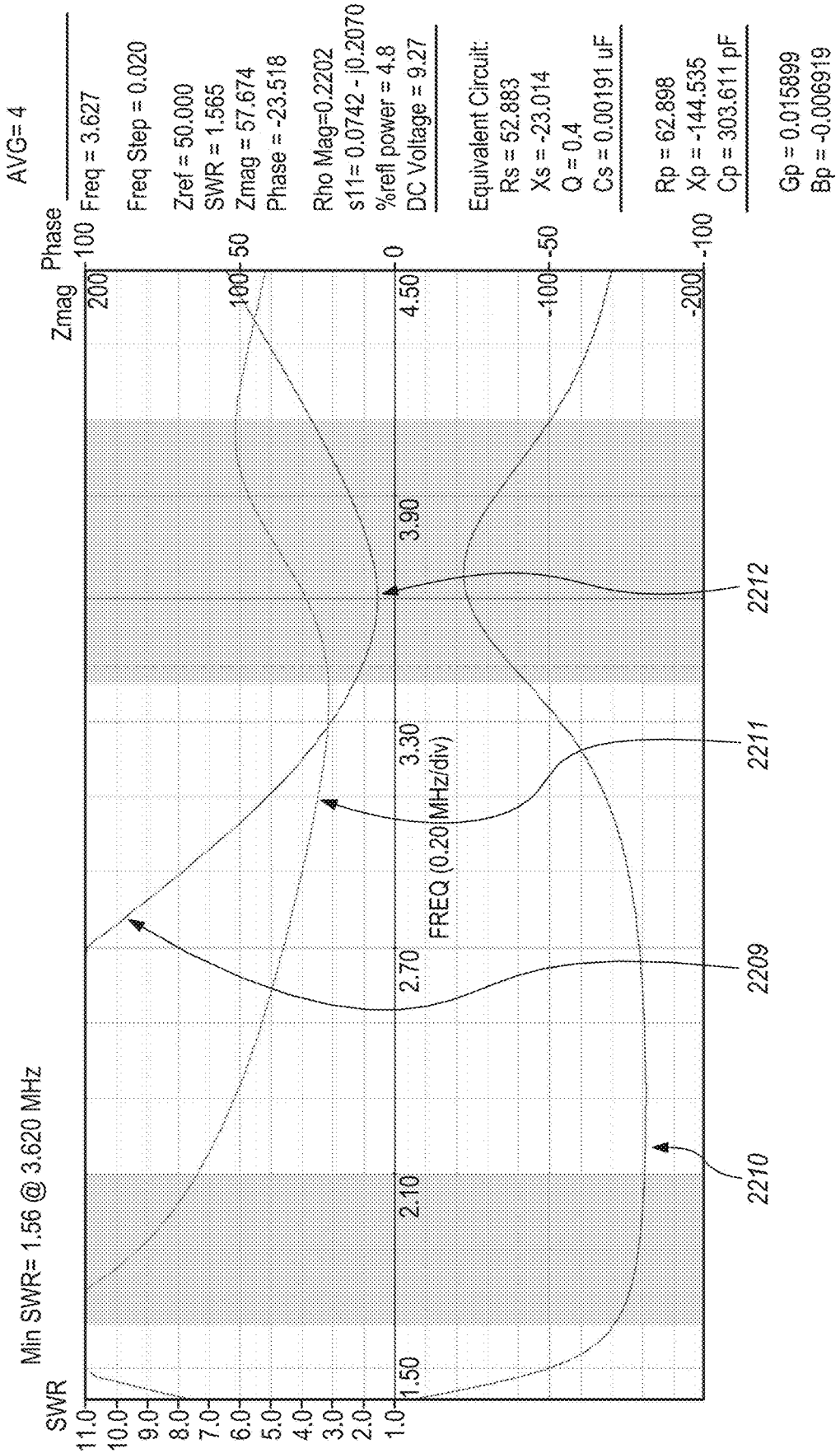
FIG. 22C depicts VSWR, phase, and impedance measurements of the CFA portable antenna over certain frequencies for another tuning point.

FIG. 22C illustrates VSWR scans of embodiments of the CFA Compact Antenna 103. The CFA compact antenna configured with no accessory added. The chart shows VSWR 2209, phase 2210 and impedance 2211 across 1.5 MHz to 4.5 MHz. At the resonance point 2212 of 3.62 MHz, the VSWR 2209 measured at 1.56, the phase 2210 measured −23.5 degrees, and the impedance 2211 measured 57.6 Ohms.

Figure 22D:
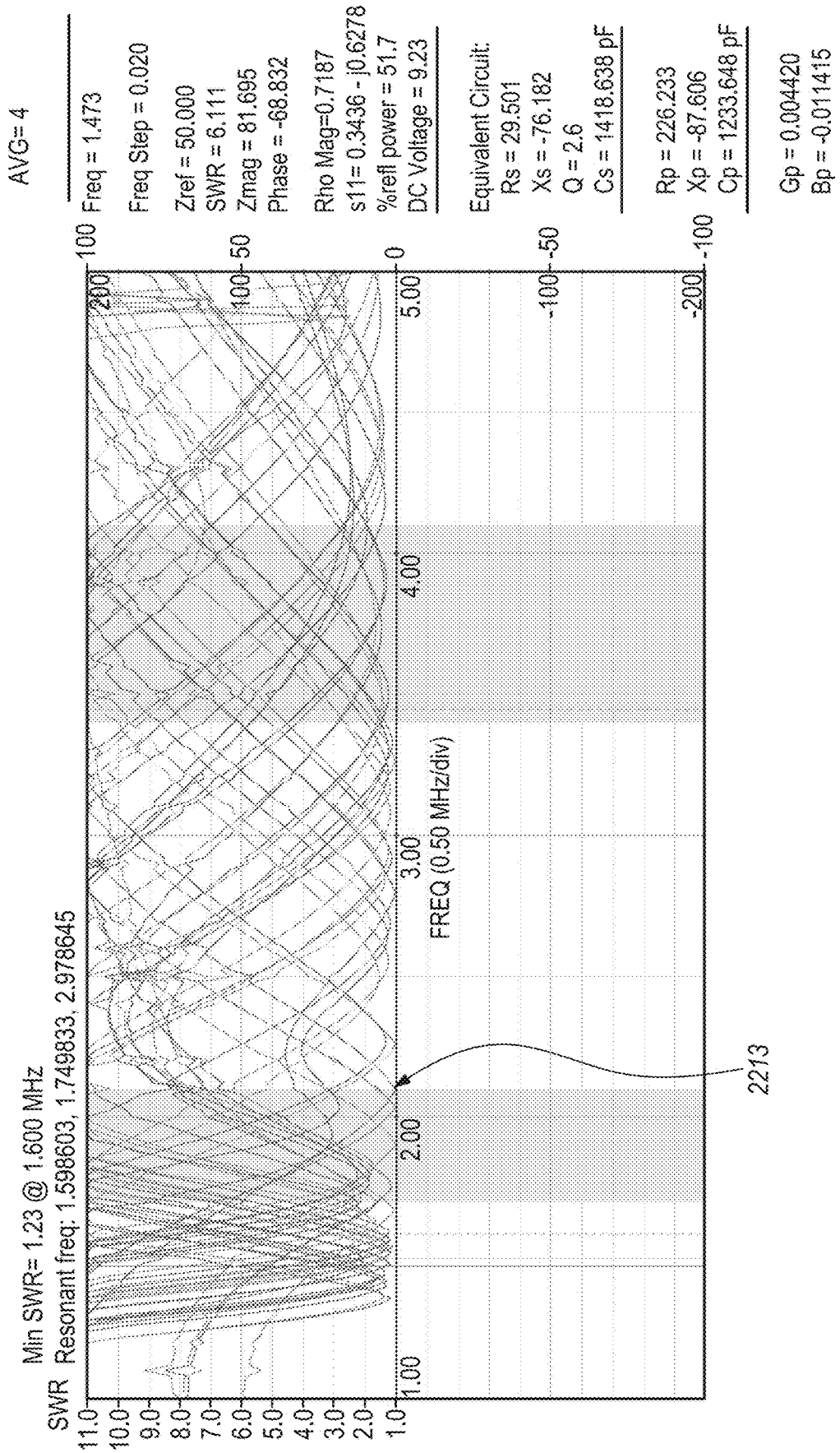
FIG. 22D depicts multiple overlaid VSWR measurements of the CFA portable antenna over certain frequencies for many tuning points.

FIG. 22D illustrates VSWR scans of embodiments of the CFA Compact Antenna 103. The CFA compact antenna configured with no accessory added. The chart shows many sweeps of VSWR 2213 across 1 MHz to 5 MHz, as the antenna was tuned to different frequencies using the various options available. It is seen that the VSWR stayed below 2 across 1.3 MHz to 5 MHz, and typically well below 1.5 (with not every possible combination shown).

Figure 22E:
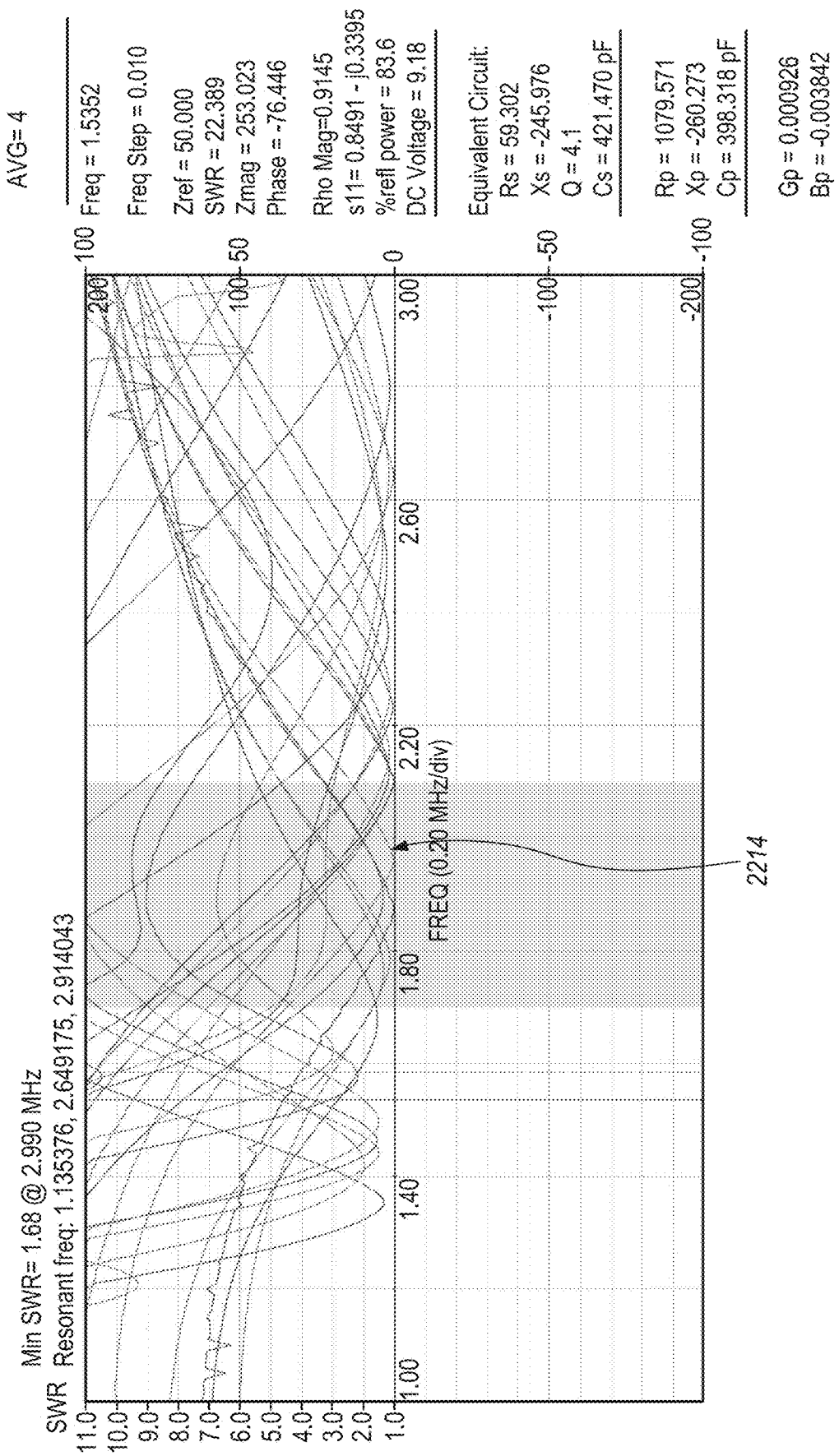
FIG. 22E depicts multiple overlaid VSWR measurements of the CFA portable antenna positioned at 5 inches over a metal counterpoise, over certain frequencies for many tuning points.

FIG. 22E illustrates VSWR scans of embodiments of the CFA Compact Antenna 103. The CFA compact antenna configured with no accessory added and positioned approximately 5 inches above a counterpoise to demonstrate an NVIS configuration with the CFA compact antenna place in close proximity to a conductive vehicle body. The chart shows many sweeps of VSWR 2214 across 1 MHz to 3 MHz, as the antenna was tuned to different frequencies using the various options available. It is seen that the VSWR stayed below 3 across 1.3 MHz to 3 MHz, and typically below 1.1 (with not every possible combination shown).

Figure 22F:
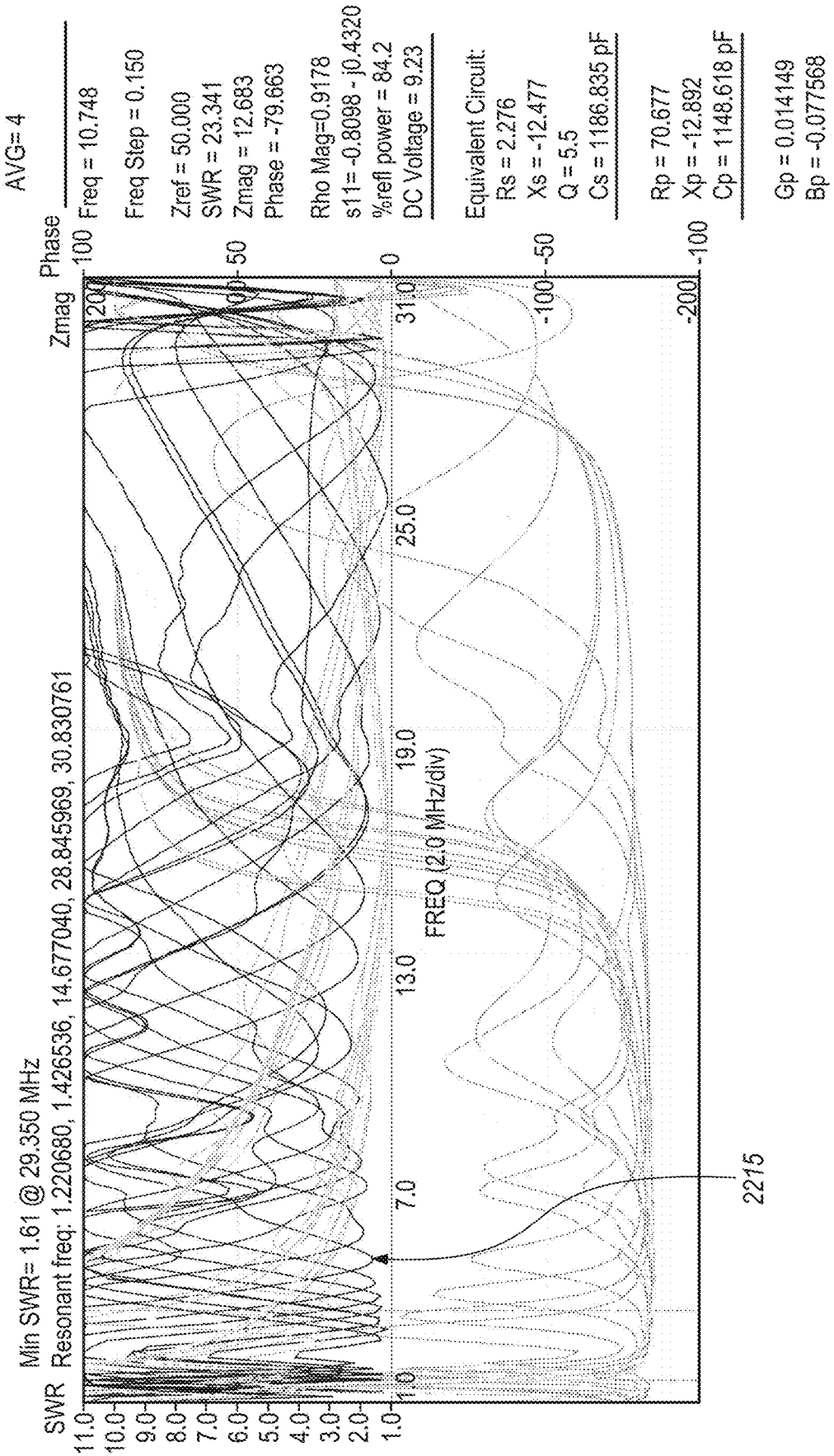
FIG. 22F depicts multiple overlaid VSWR measurements of the CFA portable antenna over a wide range of frequencies for many tuning points.

FIG. 22F illustrates VSWR scans of embodiments of the CFA compact antenna. The VSWR scan shows measurements of the CFA Compact Antenna 103 with no accessory added and swept from 1 MHz to 30 MHz, with multiple sweeps. Not all possible tuning points and combinations were used, but rather the sweeps were intentionally made sparce to show the general shape of the envelope of best tuning over the full frequency range. The section below 5 MHz was not a focus of this sweep, as a detailed sweep of those frequencies was previously shown. The series of sweep 2215 show coverage from 1.3 MHz through 30 MHz.

Figure 22G:
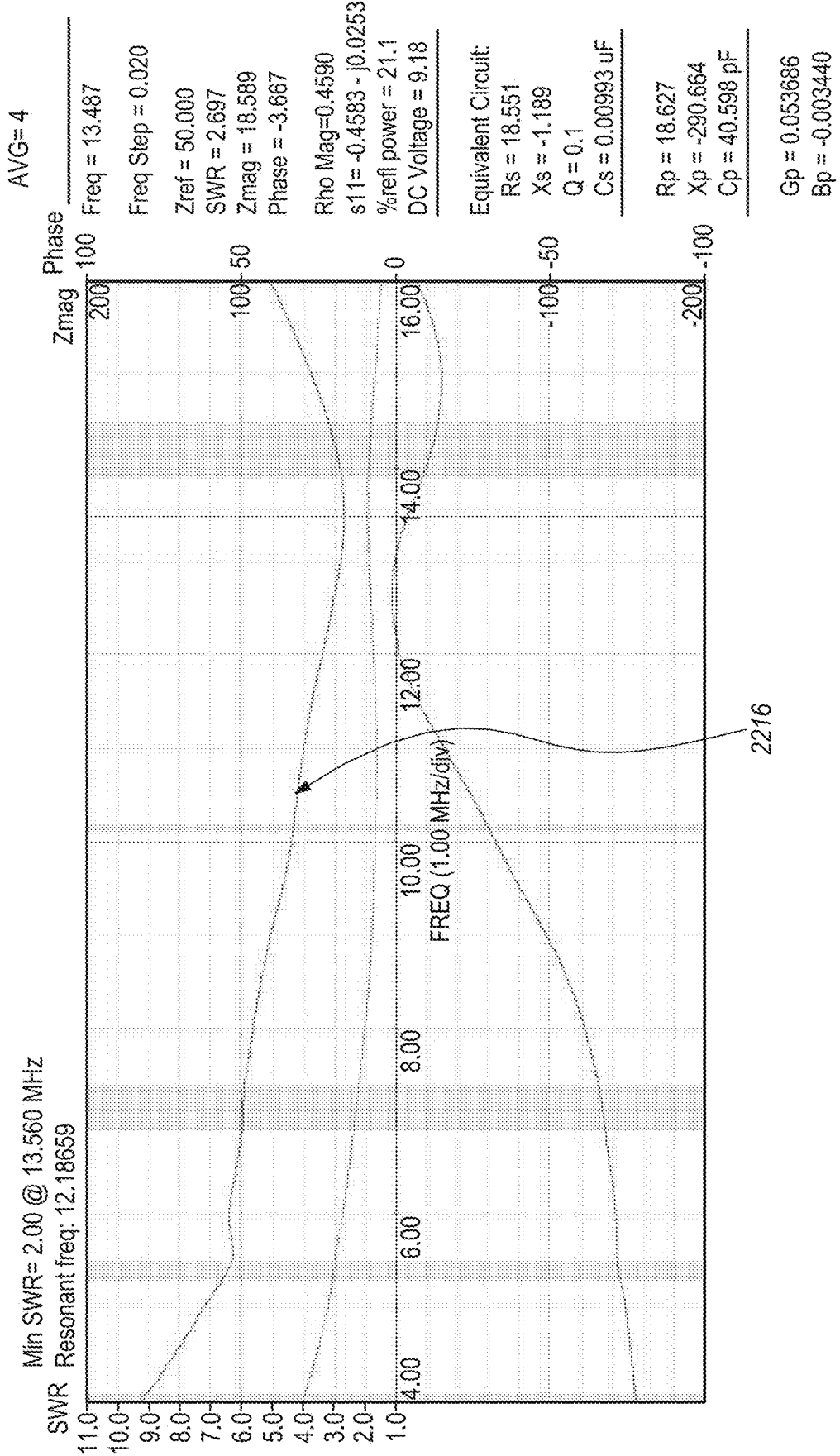
FIG. 22G depicts a single VSWR scan of the CFA portable antenna from 4 to 16 MHz tuned for wide band reception.

FIG. 22G illustrates multiple VSWR tuning solutions. The VSWR tuning solutions shown can be focused on minimizing the VSWR at a specific transmit frequency to maximize the radiated signal, and also to protect the transmitter final amplifier stage from damage or shutdown (or reduced power). For monitoring large portions of the spectrum while receiving, the antenna may also be intentionally detuned to avoid sharp resonances. This tuning may trade off a wide usable receiving frequency range with reasonable sensitivity for a higher but not extreme VSWR, as seen in VSWR curve 2216. Such tuning does not require retuning of the antenna while scanning the receiver across the range of frequencies commonly usable for the given time of day. The VSWR curve 2216 shown is an example of one such receive favored tuning solutions that allows reception over at least the 4 MHz to 16 MHz frequency range. The radio receiver may rapidly scan this significant frequency range. Responding to a message may cause the CFA compact antenna to rapidly tune to the transmitted frequency, where it will remain for a short period of time waiting for a response with slightly better sensitivity before returning to the wide band reception tuning. It is important to note that a 10:1 VSWR indicates that approximately 67% of the power is being reflected. This is normally not acceptable for a transmitter. However, for a receiver, a reduction to remaining 33% of the signal reaching the receiver only represents a loss of about 4.8 dB, and this is a reduction in both the signal and of the received noise. As 1 s-unit corresponds to 6 dB, this is a reduction of well less than 1 s-unit, with the signal to noise ratio staying substantially the same as both the signal strength and the received noise levels are being reduced. A compromise detuning of the CFA portable antenna optimized for reception, as shown, results in a very useful wide bandwidth receive antenna while only causing a minimal reduction of the received signal strength and minimal impact to the signal to noise of the received signal.

Figure 23:
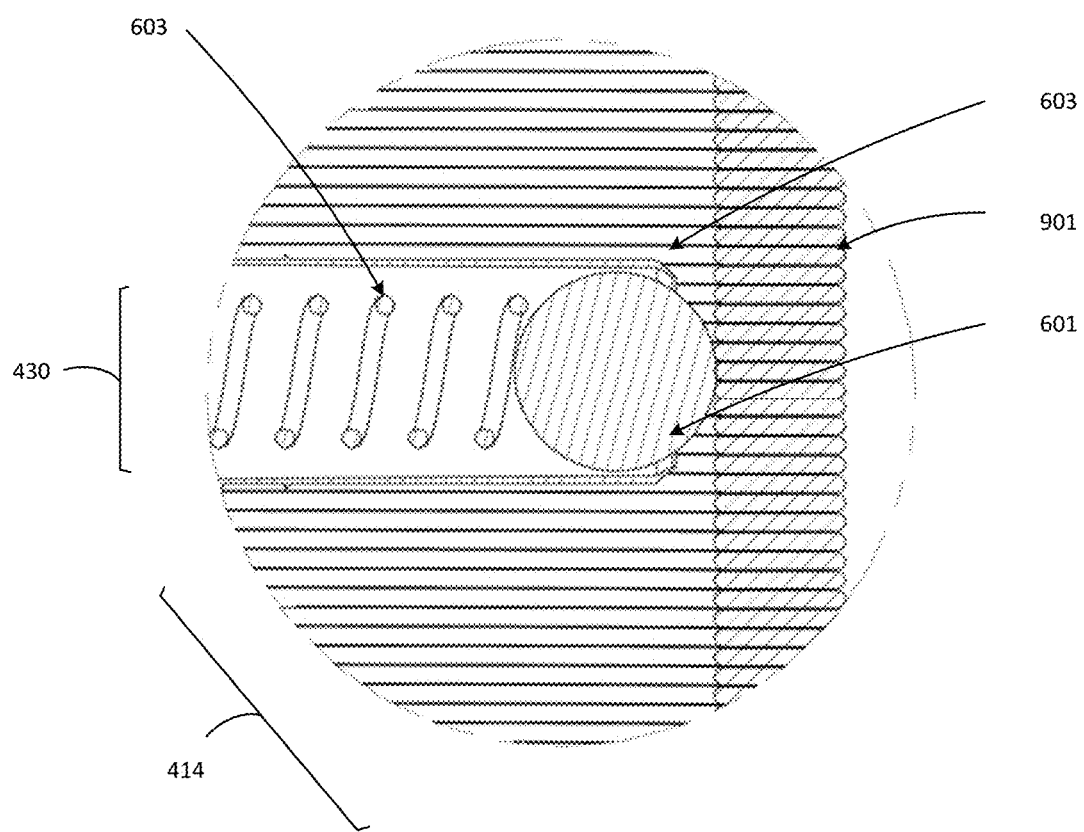
FIG. 23 depicts a close-up cross-section of the rolling contact and the tuning coil.

FIG. 23 illustrates a close-up cross section of the rolling contact 430. The rolling contact 430 can make contact with the tuning coil 414 shows the inner surface of the tuning coil 414 can be smooth as compared to the diameter of the contacting ball 601. The rounded edged of the flat conductor 901 is also visible.

In an embodiment, the contacting ball 601 can be plated with gold or other noble metal. The contacting ball 601 and the flat conductor 901 of the tuning coil 414 are in contact. The spring 602 can provide pressure to keep the ball 601 in contact with the tuning coil 414. The tubular case 104 can contain the spring 602 and ball 601 and provides an electrical path for the signal.

In some embodiments, the fine pitch and rounded edge of the flat conductor 901 provides a smooth surface for the contacting ball 101 to improve electrical conductivity of the connection between the two elements. The smooth path reduces both the energy needed to move the contact point and the acoustical noise generated when positioning the contact to rapidly tune the CFA portable Antenna 103, as well as the wear incurred due to the motion.

In other embodiments, different contacting techniques can be used including a rolling contacting disk, a sliding contactor, or other similar configuration. The prototype antenna was able to move the contact point from the top of the tuning coil 414 to the bottom of the tuning coil in approximately 120 milliseconds using a 24 v power input. Small frequency jumps within a band may be accomplished in as little as 10 milliseconds, allowing frequency hopping capabilities.

Another embodiment of the CFA Portable Antenna includes a variant where some-or-all of the lower mast of the antenna including the end cap 401, the two halves of the base mounting tube 424, and the base mounting tube 424 are energized with RF energy rather than being a counterpoise. This configuration would require an external counterpoise.

Figure 24:
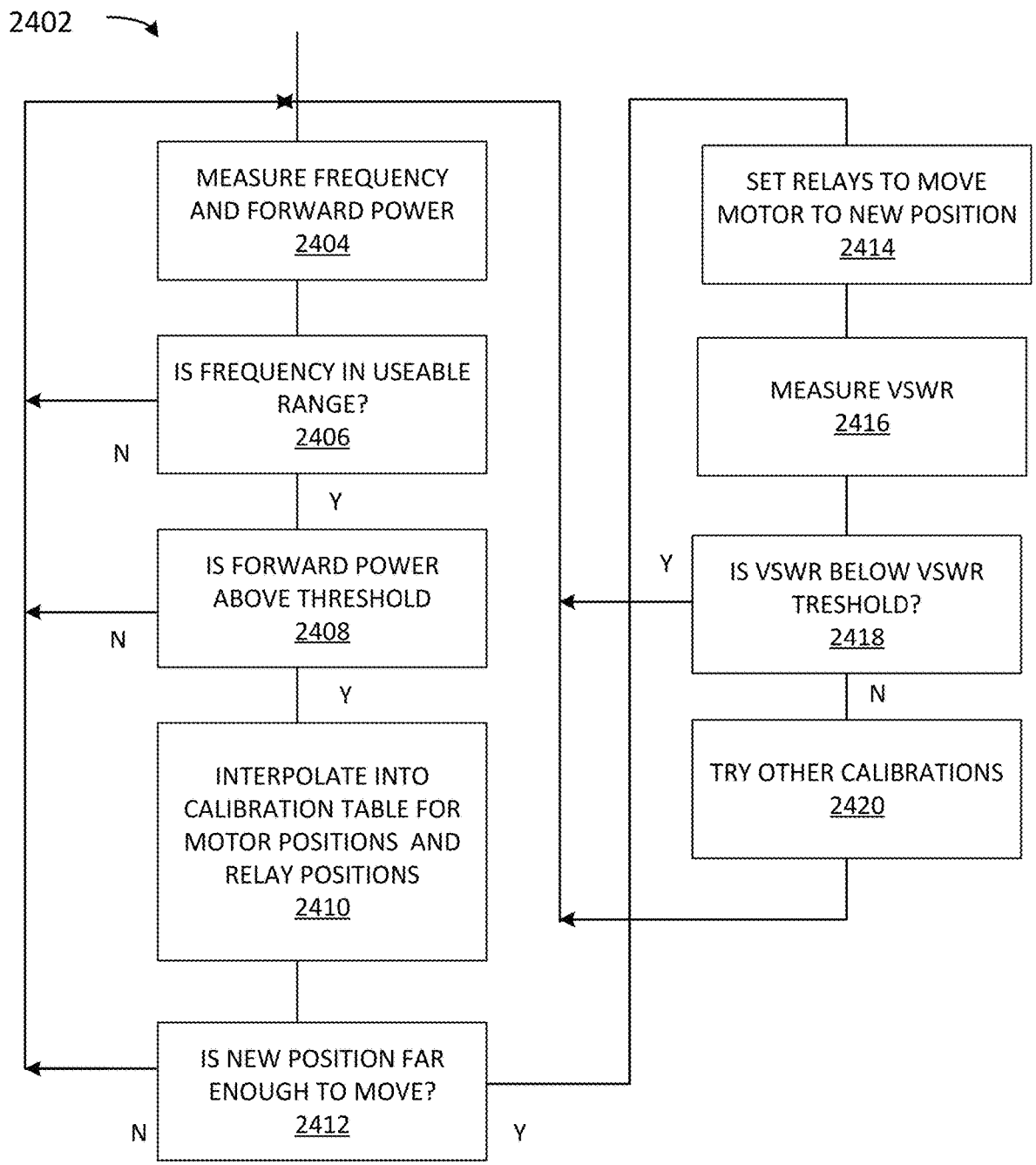
FIG. 24 depicts a process flow for the CFA portable antenna in an embodiment.

FIG. 24 illustrates a process flow 2402 for the CFA portable antenna in an embodiment. The process flow 2402 describes the transmission process for the CFA portable antenna 103. The CFA portable antenna 103 (antenna) can include a controller and software to implement the functionality described below.

The process flow 2402 can include steps to transmit using the CFA portable antenna 103. The process flow can include a step 2404, a step 2406, a step 2408, a step 2410, a step 1412, a step 2414, a step 2416, a step 2418, and a step 2420.

In the step 2404, the CFA portable antenna can measure a broadcast frequency 2432 and a forward power 2430 used to transmit with the antenna. The forward power 2430 is power entering the RF input of the antenna. The broadcast frequency is the radio frequency used for a broadcast on the antenna.

In the step 2406, the antenna can check to see if the broadcast frequency is in a predefined useable range. If the broadcast frequency is out of the range, then the control flow can pass back to step 2404, otherwise the control flow can pass to step 2408.

In the step 2408, the antenna can check if the forward power 2430 is above a predefine forward power threshold 2440. If the forward power 2430 is below the threshold, then the control flow can pass to step 2404, otherwise the control flow can pass to step 2410.

In the step 2410, the controller of the antenna can use the broadcast frequency 2432 as an index to lookup two adjacent frequencies and motor encoder step values in a calibration table 2434, the calibration table can have motor encoder step values for adjusting the tuning coil to best receive at the calibration table frequencies. The target position for the motor can be the linearly interpolated value determined by the two adjacent frequencies. The calibration table can also include settings for different relays in the system. For example, the relay setting can determine the selected turn ratios of the UNUN transformer circuits.

In step 2412, the antenna can check to see if the new positions indicated by the represent a new position far enough to move the motor on the antenna. If the new position is not more than a predefined value, then the control flow will pass to step 2404, otherwise the control flow will pass to step 2414. This can present unwanted oscillation and vibration in the antenna for small distances that may fall within error tolerances of the system and lead to unwanted oscillation and other side effects.

In step 2414, the controller of the antenna can set the relay settings retrieved from the calibration table and trigger the motor to move the number of motor encoder steps to reconfigure the tuning coil to optimize at the desired frequency.

In step 2416, the controller can measure the voltage standing wave ratio (VSWR) to determine the forward and reflected voltages to determining the ratio between them.

In step 2418, the antenna can compare the VSWR to a VSWR threshold. If the measured VSWR below the VSWR threshold, then the control flow can pass to step 2404 to continue normal operation, otherwise the control flow passes to Step 2420.

In step 2420, the antenna can retry to process flow from the beginning to try other calibrations. The control flow can automatically pass back to step 2404.

In an alternate embodiment, the frequency of signal attached to the input of the antenna is measured by the Digital Signal processor 453 using the frequency dividers 456 while the forward power is measured with the log amplifiers 456 acting on the forward power output of the VSWR circuit 1806. If the frequency measured is within the range of calibrated frequencies, then the power is checked to see if it is above a minimum threshold. This can help avoid the antenna responding to nearby transmitters. If the frequency is valid and there is sufficient power, the calibration table, stored in the NV Memory 455, with a local copy typically stored in the RAM within the DSP for rapid access, is accessed to find the two nearest adjacent frequencies within the calibration table. The calibration table contains the motor position associated with the calibrated tuning solution for each calibrated frequency, as well as the states for the UNUN matching relay 1301 and the top termination selecting relay 1306 are also read from the calibration table.

A linear interpolation calculation is done using the frequencies and positions of the adjacent calibration frequencies to determine motor position for the measured frequency. If the difference in position is enough to warrant moving the motor, the motor is moved to the new position. The relays are actuated if they are in a different state than indicated in the calibration table. Once the motor has settled into position, the driver is disabled to minimize power usage and to minimize any electrical noise that the motor drive may make. The VSWR is then measured by the DSP 453 utilizing the log amplifiers 456. The measured VSWR is compared to the allowable limit for that frequency, as interpolated from the allowable VSWR values in the calibration table). If the VSWR is too high, the calibration table associated with other configurations may be tried for better solutions. The solution with a passable VSWR is retained so to be able to try that solution first on successive passes.

3.0. Example Embodiments

Examples of some embodiments are represented, without limitation, in the following clauses and use cases:

According to an embodiment, a method of operation of a compact frequency adjustable portable antenna comprising measuring a frequency and a forward power value of broadcast transmission of the CFA portable antenna, the forward power measured at an RF input port of the CFA portable antenna, calculating a valid frequency flag by comparing the frequency to one or more usable range thresholds to determine if the frequency is within the range of calibrated frequencies, calculating a valid forward power flag by comparing the forward power to a forward power threshold, retrieving a lower encoded motor step value and an upper encoded motor step value from a calibration table using a lower adjacent frequency and an upper adjacent frequency, the lower adjacent frequency and the upper adjacent frequency both adjacent to the frequency in the calibration table, calculating an interpolated motor step value between the lower encoded motor step value and the upper encoded motor step value, driving a motor to change the position of a contactor coupled a tuning coil based on the interpolated motor step value, the contactor in contact with the tuning coil, and comparing a voltage standing wave ratio (VSWR) to a VSWR threshold and triggering a second retrieval of the lower encoded motor step value and the upper encoded motor step value if the VSWR is greater than or equal to the VSWR threshold.

In an embodiment, the method further comprises reading a VSWR from a VSWR circuit of the CFA portable antenna.

In an embodiment, the method further comprises configuring the CFA portable antenna to tune between frequencies in less than 200 milliseconds.

In an embodiment, the method further comprises retrieving the usable range threshold from a nonvolatile memory.

In an embodiment, the method further comprises includes retrieving the usable range threshold from a nonvolatile memory.

According to an embodiment, a method of operation of a compact frequency adjustable portable antenna comprising measuring a frequency and a forward power value of broadcast transmission of the CFA portable antenna, the forward power measured at an RF input port of the CFA portable antenna, retrieving a lower encoded motor step value and an upper encoded motor step value from a calibration table using a lower adjacent frequency and an upper adjacent frequency, the lower adjacent frequency and the upper adjacent frequency both adjacent to the frequency in the calibration table, calculating an interpolated motor step value between the lower encoded motor step value and the upper encoded motor step value, driving a motor to change the position of a contactor coupled a tuning coil based on the interpolated motor step value, the contactor in contact with the tuning coil, and comparing voltage standing wave ratio (VSWR) to a VSWR threshold and triggering a second retrieval of the lower encoded motor step value and the upper encoded motor step value if the VSWR is greater than or equal to the VSWR threshold.

In an embodiment, the method further comprises driving the motor includes sending commands to a motor driver.

In an embodiment, the method further comprises driving the motor includes coupling the contactor to the tuning coil with a ball bearing.

In an embodiment, the method further comprises driving the motor includes coupling the contactor to the tuning coil with a rolling contact.

In an embodiment, the method further comprises retrieving a lower encoded moto step value includes retrieving the lower encoded motor step value based on the lower adjacent frequency equal to the retrieved frequency and the forward power value.

According to an embodiment a compact frequency adjustable portable antenna comprising a tuning coil wound from flat wire, a contactor in contact with the tuning coil, a motor coupled to the contactor for moving the contactor, and a controller capable of measuring the broadcast frequency.

The antenna as claimed in claim 11 wherein the weight of the antenna less than five pounds and an overall length of less than three feet and a maximum diameter of less than four inches.

In an embodiment, the antenna further comprises the tuning coil constructed of flat wire having an aspect ratio of more than 3:1.

In an embodiment, the antenna further comprises the electrical length of the transmission line formed by the tuning coil may be adjusted to one-quarter wavelength or more over HF frequency range.

In an embodiment, the antenna further comprises the tuning coil coupled to a multi-reentrant top cap structure.

In an embodiment, the antenna further comprises the tuning coil coupled to an external whip.

In an embodiment, the antenna further comprises the CFA portable antenna can be tuned continuously between at least 1.6 MHz and 30 MHz.

In an embodiment, the antenna further comprises the tuning coil exposing the flat wire on an inner diameter of the tuning coil.

In an embodiment, the antenna further comprises the tuning coil has a substantially smooth surface on the inner diameter of the tuning coil for reducing acoustic noise.

In an embodiment, the antenna further comprises the contactor configured as a rolling contact.

4.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the specification, embodiments of the invention have been described with reference to numerous specific details that may vary from implementation to implementation. Thus, the sole and exclusive indicator of what is the invention and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage, or attribute that is not expressly recited in a claim should limit the scope of such claim in any way. The specification and drawings are, accordingly, to be regarded in an illustrative rather than a restrictive sense.

It is understood that the system functionality can be described using terms like module, unit, system, subsystem, pod, and component that represent devices that can be implemented using different combinations of mechanical, hardware, firmware, and software elements. The systems and devices can include electric subsystems, mechanical subsystems, and other physical elements to operate and control the system. These elements can include computing elements that can execute the firmware and software of the system to control mechanical features of the system. In addition, the mechanical elements of the system can operate with or without control mechanisms in regular operation.

What is claimed is:

1. A method of operation of a compact frequency adjustable (CFA) portable antenna comprising:
    measuring a frequency and a forward power value of broadcast transmission of the CFA portable antenna, the forward power measured at an RF input port of the CFA portable antenna;
    calculating a valid frequency flag by comparing the frequency to one or more usable range thresholds to determine if the frequency is within a range of calibrated frequencies;
    calculating a valid forward power flag by comparing the forward power to a forward power threshold;
    retrieving a lower encoded motor step value and an upper encoded motor step value from a calibration table using a lower adjacent frequency and an upper adjacent frequency, the lower adjacent frequency and the upper adjacent frequency both adjacent to the frequency in the calibration table;

calculating an interpolated motor step value between the lower encoded motor step value and the upper encoded motor step value;

driving a motor to change a position of a contactor coupled to a tuning coil based on the interpolated motor step value, the contactor in contact with the tuning coil; and comparing a voltage standing wave ratio (VSWR) to a VSWR threshold and triggering a second retrieval of the lower encoded motor step value and the upper encoded motor step value if the VSWR is greater than or equal to the VSWR threshold.

2. The method as claimed in claim 1 wherein comparing the VSWR to the VSWR threshold includes reaching the VSWR from a VSWR circuit of the CFA portable antenna.

3. The method as claimed in claim 1 wherein measuring the frequency includes configuring the CFA portable antenna to tune between frequencies in less than 200 milliseconds.

4. The method as claimed in claim 1 wherein calculating a valid frequency flag includes retrieving the usable range threshold from a nonvolatile memory.

5. The method as claimed in claim 1 wherein calculating the valid forward power flag includes retrieving the usable range threshold from a nonvolatile memory.

6. A method of operation of a compact frequency adjustable (CFA) portable antenna comprising:

measuring a frequency and a forward power value of broadcast transmission of the CFA portable antenna, the forward power measured at an RF input port of the CFA portable antenna;

retrieving a lower encoded motor step value and an upper encoded motor step value from a calibration table using a lower adjacent frequency and an upper adjacent frequency, the lower adjacent frequency and the upper adjacent frequency both adjacent to the frequency in the calibration table;

calculating an interpolated motor step value between the lower encoded motor step value and the upper encoded motor step value;

driving a motor to change the position of a contactor coupled to a tuning coil based on the interpolated motor step value, the contactor in contact with the tuning coil; and comparing voltage standing wave ratio (VSWR) to a VSWR threshold and triggering a second retrieval of the lower encoded motor step value and the upper encoded motor step value if the VSWR is greater than or equal to the VSWR threshold.

7. The method as claimed in claim 6 wherein driving the motor includes sending commands to a motor driver.

8. The method as claimed in claim 6 wherein driving the motor includes coupling the contactor to the tuning coil with a ball bearing.

9. The method as claimed in claim 6 wherein driving the motor includes coupling the contactor to the tuning coil with a rolling contact.

10. The method as claimed in claim 6 wherein retrieving a lower encoded moto step value includes retrieving the lower encoded motor step value based on the lower adjacent frequency equal to the retrieved frequency and the forward power value.

11. A compact frequency adjustable (CFA) portable antenna comprising:

a tuning coil wound from flat wire, the tuning coil coupled to a multi-reentrant top cap structure;

a contactor in contact with the tuning coil;

a motor coupled to the contactor for moving the contactor; and a controller capable of measuring a broadcast frequency.

12. The antenna as claimed in claim 11 wherein the weight of the CFA portable antenna is less than five pounds and an overall length of less than three feet and a maximum diameter of less than four inches.

13. The antenna as claimed in claim 11 wherein the tuning coil is constructed of the flat wire having an aspect ratio of the more than 3:1.

14. The antenna as claimed in claim 11 wherein an electrical length of a transmission line formed by the tuning coil may be adjusted to one-quarter wavelength or more over a high-frequency (HF) frequency range.

15. The antenna as claimed in claim 11 wherein the tuning coil is coupled to an external whip antenna.

16. The antenna as claimed in claim 11 wherein the CFA portable antenna can be tuned continuously between at least 1.6 MHz and 30 MHz.

17. The antenna as claimed in claim 11 wherein the tuning coil exposes the flat wire on an inner diameter of the tuning coil.

18. The antenna as claimed in claim 11 wherein the tuning coil has a smooth surface on the inner diameter of the tuning coil for reducing acoustic noise.

19. The antenna as claimed in claim 11 wherein the contactor can be configured as a rolling contact.

\* \* \* \* \*

UNITED STATES PATENT AND TRADEMARK OFFICE
CERTIFICATE OF CORRECTION

Page 1 of 1

PATENT NO. : 12,341,272 B2
APPLICATION NO. : 17/870811
DATED : June 24, 2025
INVENTOR(S) : Donald P. Labriola, II It is certified that error appears in the above-identified patent and that said Letters Patent is hereby corrected as shown below:

In the Claims

Column 44
Claim 13: Line 29: Delete "the"

Signed and Sealed this
Twenty-ninth Day of July, 2025

Coke Morgan Stewart
*Acting Director of the United States Patent and Trademark Office*